United States Patent
Ambrosek et al.

(10) Patent No.: US 10,544,361 B2
(45) Date of Patent: Jan. 28, 2020

(54) PYRIDINES AND DERIVATIVES THEREOF AS COMPONENTS FOR USE IN OPTOELECTRONIC COMPONENTS

(71) Applicant: CYNORA GMBH, Bruchsal (DE)

(72) Inventors: David Ambrosek, Berlin (DE); Michael Danz, Eggenstein-Leopoldshafen (DE); Harald Flügge, Karlsruhe (DE); Jana Friedrichs, Karlsruhe (DE); Tobias Grab, Karlsruhe (DE); Andreas Jacob, Hannover (DE); Stefan Seifermann, Brühl (DE); Daniel Volz, Karlsruhe (DE)

(73) Assignee: CYNORA GMBH, Bruchsal (DE)

(*) Notice: Subject to any disclaimer, the term of this patent is extended or adjusted under 35 U.S.C. 154(b) by 32 days.

(21) Appl. No.: 15/544,556

(22) PCT Filed: Jan. 20, 2016

(86) PCT No.: PCT/EP2016/051153
§ 371 (c)(1),
(2) Date: Jul. 19, 2017

(87) PCT Pub. No.: WO2016/116517
PCT Pub. Date: Jul. 28, 2016

(65) Prior Publication Data
US 2018/0265776 A1   Sep. 20, 2018

(30) Foreign Application Priority Data

Jan. 20, 2015 (EP) .................................... 15151870
May 20, 2015 (DE) ......................... 10 2015 107 994

(51) Int. Cl.
H01L 51/50 (2006.01)
C09K 11/06 (2006.01)
H01L 51/00 (2006.01)

(52) U.S. Cl.
CPC .......... C09K 11/06 (2013.01); H01L 51/0059 (2013.01); H01L 51/0061 (2013.01);
(Continued)

(58) Field of Classification Search
None
See application file for complete search history.

(56) References Cited

U.S. PATENT DOCUMENTS

2010/0213452 A1* 8/2010 Sisk ..................... C07D 213/38
257/40
2011/0306922 A1 12/2011 Khan et al.
2012/0153272 A1 6/2012 Fukuzaki

FOREIGN PATENT DOCUMENTS

JP   2004-273190    *  9/2004   ........... C07D 209/80
WO   2006010637 A2    2/2006
(Continued)

OTHER PUBLICATIONS

G.R. Newkome et al., "Synthesis of 2,2'-Bipyridines: Versatile Building Blocks for Sexy Architectures and Functional Nanomaterials," European Journal of Organic Chemistry, Jan. 1, 2004, pp. 235-254, vol. 2004, No. 2.
(Continued)

*Primary Examiner* — Gregory D Clark
(74) *Attorney, Agent, or Firm* — Ryan, Mason & Lewis, LLP

(57) ABSTRACT

The invention relates to an organic molecule comprising a structure of formula 1 and to the use thereof in optoelectronic components.
(Continued)

15 Claims, 2 Drawing Sheets

Formula 1 wherein:
X is SO2, CO or a C—C single bond;
m is 0 or 1;
n is 1, 2 or 3;
r is 0 or 1;
s is 0 or 1;
LG is a divalent linker group, selected from:

or LG is an element-element single bond.

(52) U.S. Cl.
CPC ...... *H01L 51/0067* (2013.01); *H01L 51/0071* (2013.01); *H01L 51/0072* (2013.01); *H01L 51/5072* (2013.01); *H01L 51/5096* (2013.01); *C09K 2211/1007* (2013.01); *C09K 2211/1014* (2013.01); *C09K 2211/1029* (2013.01); *C09K 2211/1033* (2013.01); *C09K 2211/1037* (2013.01); *C09K 2211/1044* (2013.01); *H01L 51/5012* (2013.01); *Y02E 10/549* (2013.01); *Y02P 70/521* (2015.11)

(56) References Cited

FOREIGN PATENT DOCUMENTS

WO 2010090925 A1 8/2010
WO 2016046077 A1 3/2016

OTHER PUBLICATIONS

M. Ishikura et al., "An Efficient Synthesis of 3-Heteroarylpyridines Via Diethyl-(3-Pyridyl)-Borane," Synthesis, Jan. 1, 1984, pp. 936-938, vol. 11.
H. Uoyama et al., "Highly Efficient Organic Light-Emitting Diodes from Delayed Fluorescence," Nature, Dec. 12, 2012, pp. 234-238, vol. 492, No. 7428.

* cited by examiner

PYRIDINES AND DERIVATIVES THEREOF AS COMPONENTS FOR USE IN OPTOELECTRONIC COMPONENTS

CROSS-REFERENCE TO RELATED APPLICATIONS

This application claims priority to International Application No. PCT/EP2016/051153, filed Jan. 20, 2016, which claims priority to European Patent Application No. 15151870.1 filed Jan. 20, 2015 and European Patent Application No. 102015107994.1 filed May 20, 2015, the disclosures of which are incorporated by reference herein in their entireties.

FIELD OF INVENTION

The invention relates to pure organic molecule and the use thereof in organic light-emitting diodes (OLEDs) and in other optoelectronic components.

BACKGROUND

In recent years the technology based on OLED (organic light-emitting diodes) has become so well established in the field of screen technology that the first commercial products based on these are now available. In addition to screen technology, OLEDs are also suitable for use in surface lighting technology. For this reason, intensive research is being conducted toward the development of new materials.

As a rule, OLEDs are realized as layered structures, which consist primarily of organic materials. For better understanding, a simplified structure is shown as an example in FIG. 1. The core of such components is the emitter layer, in which as a rule emitting molecules are embedded in a matrix. In this layer, negative charge carriers (electrons) and positive charge carriers (holes) meet and combine to form so-called excitons (=excited states). The energy contained in the excitons can be released from the corresponding emitters in the form of light, wherein in this case the term "electroluminescence" is applied. An overview of the function of is given in H. Yersin, Top. Curr. Chem. 2004, 241, 1 and H. Yersin, "Highly Efficient OLEDs with Phosphorescent Materials," Wiley-VCH, Weinheim, Germany, 2008.

Since the first reports on OLEDs (Tang et al. Appl. Phys. Lett. 1987, 51, 913), this technology has undergone continuous further development, especially in the area of emitter materials. Whereas the first materials using pure organic molecules were able to convert a maximum of the use of phosphorescent compounds made it possible to circumvent this fundamental problem, so that at least theoretically, all excitons can be converted into light. These materials as a rule are transition metal complexes, in which the metal is obtained from the third period of the transition metals. Here, primarily very expensive noble metals such as iridium, platinum or gold are used. (See also H. Yersin, Top. Curr. Chem. 2004, 241, 1 and M. A. Baldo, D. F. O'Brien, M. E. Thompson, S. R. Forrest, Phys. Rev. B 1999, 60, 14422). In addition to the costs, the stability of these materials is also partially disadvantageous for their use.

A new generation of OLEDs is based on the use of delayed fluorescence (TADF: thermally activated delayed fluorescence or singlet harvesting). In such cases, for example, it is possible to use Cu(I) complexes, which because of the small energy distance between the lowest triplet state $T_1$ and the singlet state $S_1$ ($\Delta E(S_1-T_1)$) located above it, triplet excitons can return to a singlet state thermally. In addition to the use of transition metal complexes, pure organic molecules can also utilize this effect.

Some of such TADF materials were already used in the first optoelectronic components. The solutions to date, however, have drawbacks and problems: the TADF materials in the optoelectronic components often do not have adequate long-term stability, thermal stability or chemical stability against water and oxygen. In addition, not all important emission colors are available. Furthermore, some TADF materials are not vaporizable and thus are not suitable for use in commercial optoelectronic components. In addition some TADF materials do not have materials suitable energy situations relative to the other materials used in the optoelectronic component (e.g., HOMO energies of TADF emitters of greater than or equal to −5.9 eV). Sufficiently high efficiencies of the optoelectronic components at high current densities or high light densities cannot be achieved with all TADF materials. In addition, the synthesis of some TADF are expensive.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS OF THE INVENTION

Figure 1:
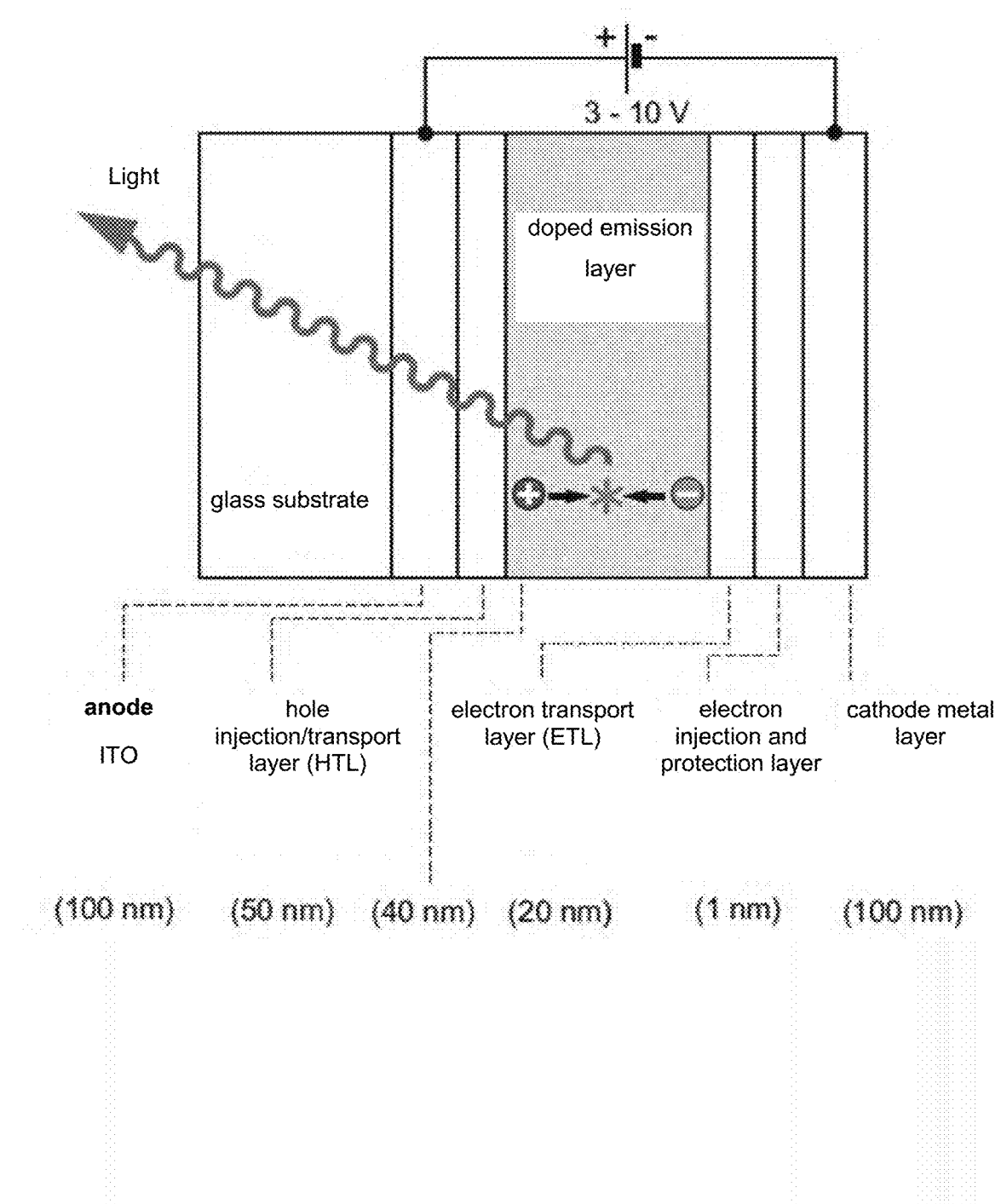
FIG. 1 is a schematic representation of the structure of an organic light-emitting diode (OLED).
Figure 2:
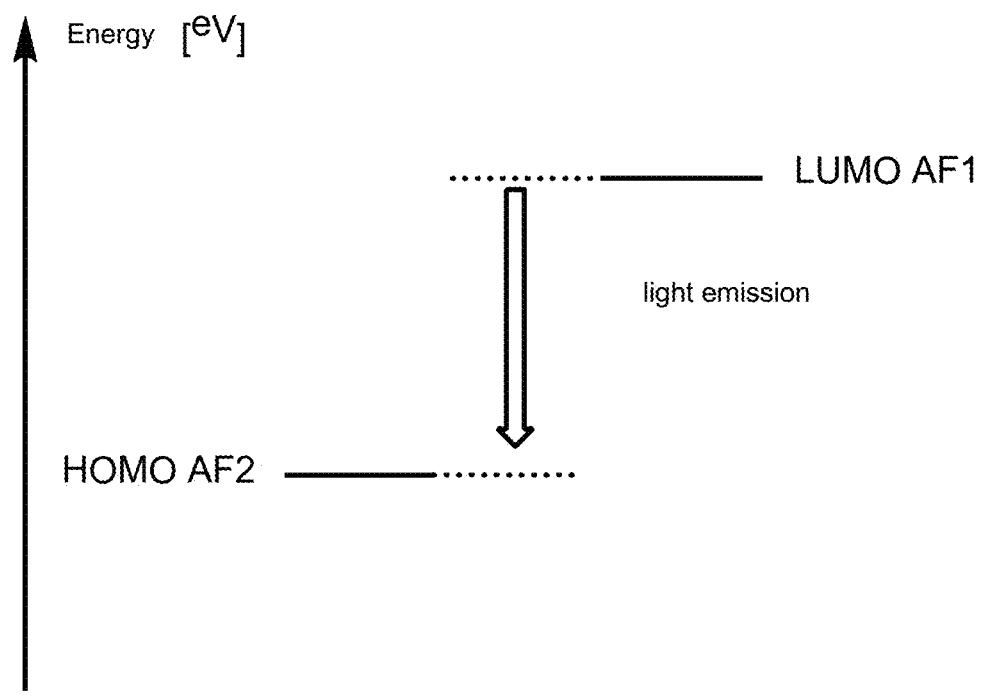
FIG. 2 is a schematic representation of the energy level diagram (relative energy in eV) of an emitter molecule according to the invention (light emission results from the transition from LUMO (AF1/pyridine unit) to HOMO (AF2)).

Exemplary embodiments of the invention will now be discussed in further detail. This invention may, however, be embodied in many different forms and should not be construed as limited to the embodiments set forth herein.

One aspect of the invention relates to the supplying of organic molecules that comprise a structure of formula 1 or consists of a structure of formula 1:

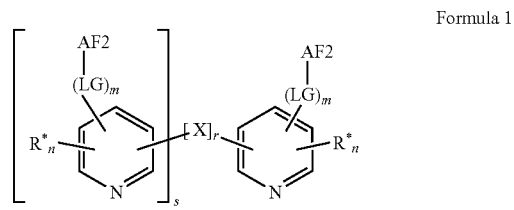

Formula 1 and wherein:

X is $SO_2$, CO or a C—C single bond;

m is 0 or 1;

n is 1, 2 or 3;

r is 0 or 1;

s is 0 or 1;

LG is a divalent linker group, selected from:

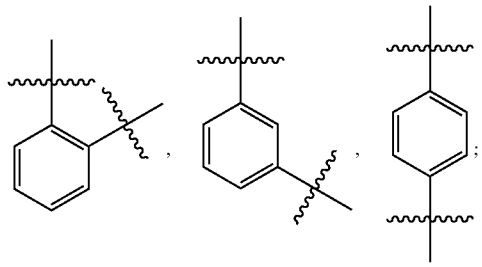 [SMILES: *c1ccccc1* ; *c1cccc(*)c1 ; *c1ccc(*)cc1]

or LG is an element-element single bond.

The limitation applies that the invention does not comprise any 2,2'-bipyridine derivatives, in other words what when s is 1, r is 1 and X is a C—C single bond, the binding of the two pyridine rings to one another at least in the case of one pyridine ring does not take place by way of a C-atom adjacent to the N-atom.

AF2 is an electron-donating chemical unit, described by formula 2 and comprising a conjugated system, especially at least six π-electrons in conjugation (e.g., in the form of at least one aromatic system);

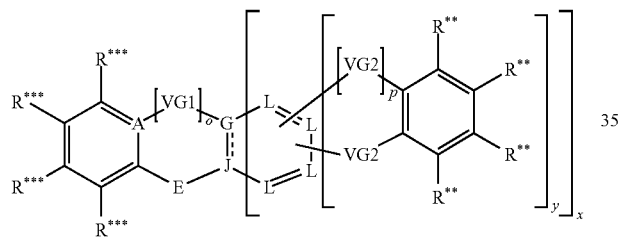

Formula 2 wherein:

x is 0 or 1;

y is 0 or 1, wherein if x=0 it is always also true that y=0;

o is 0 or 1;

p is 0 or 1;

A is CR*** if o=0, otherwise C;

VG1 is a bridging group and is selected from the group consisting of
  NR, CR$_2$, O, S and a C—C single bond, or
  NR, CR$_2$, O, S, a C—C single bond, BR, AsR, SiR$_2$, GeR$_2$,

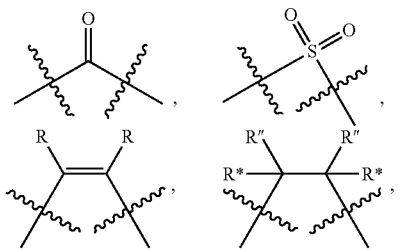

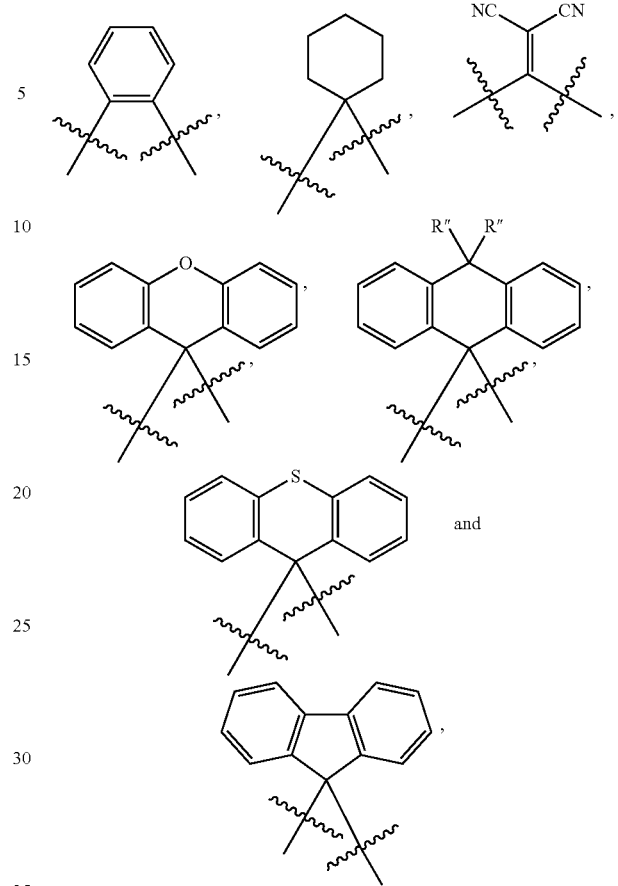

when x=1 and at the same time y=0;

VG2=bridging group at each occurrence is, independently of one another, CR$_2$, NR, O, S or a C—C single bond, wherein two VG2 units at the same time are not equal to a C—C single bond;

E is NR**,

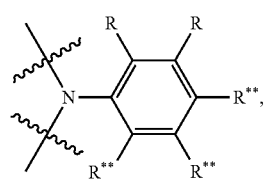

O or S;

G is C when o=1 and at the same time x=1; G is CR when o=0 and at the same time x=1; G is CR or CR**$_2$, when o=1 and at the same time x=0; G is R* when o=0 and at the same time x=0; G is CR, CR$_2$, N or NR* when x=0 and at the same time VG1 is a C—C single bond;

J is C when x=1; J is CR, CR$_2$ or NR** when x=0;

L is CR* when y=0; L is CR or C (in the case of covalent bonding to VG2) when y=1;

R* is R or is selected from the following units, wherein a maximum of two radicals R*** are simultaneously equal to one of the following units:

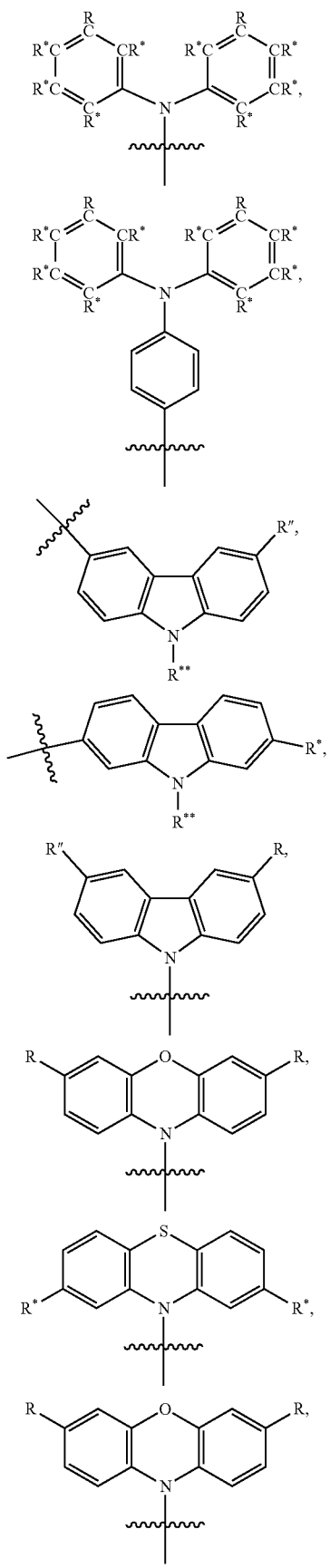

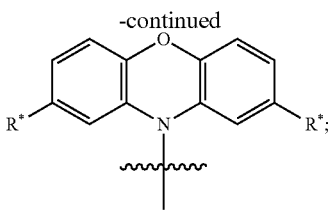

R** at each occurrence independently of one another is a radical R* and/or marks the linking site to the linker group LG or in the case of m=0 to the pyridine unit of formula 1; R* at each occurrence independently of one another is selected from the group consisting of H, deuterium, phenyl, naphthyl, $N(R^2)_2$, —SCN, —$CF_3$, —$NO_2$, $C(=O)OH$, $C(=O)OR^3$, $C(=O)N(R^3)_2$, $C(=O)SR^3$, $C(=S)SR^3$, $Si(R^4)_3$, $B(OR^5)_2$, $B(N(R^6)_2)_2$, $C(=O)R^3$, $P(=O)(R^7)_2$, $As(=O)(R^7)_2$, $P(=S)(R^7)_2$, $As(=S)(R^7)_2$, $S(=O)R^3$, $S=NR^3$, $S(=O)NR^3$, $S(=O)_2NR^3$, $S(=O)_2R^3$, $O—S(=O)_2R^3$, $SF_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl-, alkoxy or thioalkoxy group with 3 to 40 C atoms, each of which may be substituted with one or more radicals $R^9$, wherein one or more adjacent $CH_2$ groups may be replaced by —$R^9C=CR^9$—, —C≡C—, or an adjacent $CH_2$ group by —$Si(R^4)_2$—, —$Ge(R^4)_2$—, —$Sn(R^4)_2$—, —C(=O)—, —C(=S)—, —C(=Se)—, —C=N—, —C(=O)O—, —C(=O)N(R^3)—, —P(=O)(R^7)—, —As(=O)(R^7)—, —P(=S)(R^7), —As(=S)(R^7)—, —S(=O)—, —S(=O)_2—, —NR^2—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, each of which may be substituted with one or more radicals $R^2$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents R* may also form with one another a monocyclic aliphatic or aromatic ring system with a total of five or six ring members. In one embodiment the ring system that may be formed is an aliphatic ring system.

$R^2$ at each occurrence independently of one another is selected from the group consisting of H, deuterium, phenyl, naphthyl, $CF_3$, $C(=O)OR^3$, $C(=O)N(R^2)_2$, $Si(R^4)_3$, $C(=O)R^3$, $P(=O)(R^7)_2$, $As(=O)(R^7)_2$ $P(=S)(R^7)_2$, $As(=S)(R^7)_2$, $S(=O)R^3$, $S(=O)_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C=CR^9$—, —C≡C—, or an adjacent $CH_2$ group by —$Si(R^4)_2$—, —$Ge(R^4)_2$—, —$Sn(R^4)_2$—, —C(=O)—, —C(=S)—, —C(=Se)—, —C=N—, —C(=O)O—, —C(=O)N(R^3)—, —P(=O)(R^7)—, —As(=O)(R^7)—, —P(=S)(R^7)—, —As(=S)(R^7)—, —S(=O)—, —S(=O)_2—, —NR^2—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^2$ may also form a mono- or polycyclic, aliphatic, aromatic and/or benzoannelated ring system with one another.

$R^3$ at each occurrence independently of one another is selected from the group consisting of H, deuterium, phenyl, naphthyl, $CF_3$ or an aliphatic, aromatic and/or heteroaromatic hydrocarbon radical with 1 to 20 C atoms, in which also one or more H atoms may be replaced by F $CF_3$; here, two or more substituents $R^3$ may also form a mono- or polycyclic, aliphatic ring system with one another.

$R^4$ at each occurrence independently of one another is selected from the group consisting of H, deuterium, phenyl, naphthyl, $N(R^2)_2$, $CF_3$, OH, $C(=O)OR^3$, $C(=O)N(R^3)_2$, $C(=O)R^3$, $P(=O)(R^7)_2$, $As(=O)(R^7)_2$, $P(=S)(R^7)_2$, $As(=S)(R^7)_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced with —$R^9C=CR^9$—, —C≡C—, or an adjacent $CH_2$ group with —$Si(R^4)_2$—, —$Ge(R^4)_2$—, —$Sn(R^4)_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$), —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^4$ may also form a mono- or polycyclic, aliphatic, aromatic and/or benzoannelated ring system with one another.

$R^5$ at each occurrence independently of one another is selected from the group consisting of phenyl, naphthyl, $CF_3$, $C(=O)R^3$, $P(=O)(R^7)_2$, $As(=O)(R^7)_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C=CR^9$—, —C≡C—, or an adjacent $CH_2$ group by —$Si(R^4)_2$—, —$Ge(R^4)_2$—, —$Sn(R^4)_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, each of which forms may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^5$ also form a mono- or polycyclic, aliphatic, aromatic and/or benzoannelated ring system with one another.

$R^6$ at each occurrence independently of one another is selected from the group consisting of phenyl, naphthyl, $CF_3$, $Si(R^4)_3$, $C(=O)R^3$, $P(=O)(R^7)_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced with —$R^9C=CR^9$—, —C≡C—, or an adjacent $CH_2$ group with —$Si(R^4)_2$—, —$Ge(R^4)_2$—, —$Sn(R^4)_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$), —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^*$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^6$ may also form a mono- or polycyclic, aliphatic, aromatic and/or benzoannelated ring system with one another.

$R^7$ at each occurrence independently of one another is selected from the group consisting of, phenyl, naphthyl, $N(R^2)_2$, $CF_3$, $C(=O)OR^3$, $C(=O)N(R^3)_2$, $Si(R^4)_3$, $C(=O)R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C=CR^9$—, —C≡C—, or an adjacent $CH_2$ group by —$Si(R^4)_2$—, —$Ge(R^4)_2$—, —$Sn(R^4)_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$), —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^3$, or a combination of these systems; wherein two or more of these substituents $R^7$ may also form a mono- or polycyclic, aliphatic, aromatic and/or benzoannelated ring system with one another.

$R^8$ at each occurrence independently of one another is selected from the group consisting of H, deuterium, phenyl, naphthyl, F, $CF_3$ or an aliphatic, aromatic and/or heteroaromatic hydrocarbon radical with 1 to 20 C atoms, in which also one or more H atoms may be replaced by F or $CF_3$; in this case two or more substituents $R^8$ may also form a mono- or polycyclic, aliphatic ring system with one another.

R$^9$ at each occurrence independently of one another is selected from the group consisting of H, deuterium, phenyl, naphthyl, N(R$^2$)$_2$, CF$_3$, NO$_2$, OH, COOH, C(=O)OR$^3$, C(=O)N(R$^3$)$_2$, Si(R$^4$)$_3$, B(OR$^5$)$_2$, C(=O)R$^3$, P(=O)(R$^7$)$_2$, P(=S)(R$^7$)$_2$, As(=O)(R$^7$)$_2$, P(=S)(R$^7$)$_2$, S(=O)R$^3$, S(=O)$_2$R$^3$, OSO$_2$R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R$^8$, wherein one or more non-adjacent CH$_2$ groups may be replaced by —R$^3$C=CR$^3$—, —C≡C—, or an adjacent CH$_2$ group by —Si(R$^4$)$_2$—, —Ge(R$^4$)$_2$—, —Sn (R$^4$)$_2$, —C(=O)—, —C(=S)—, —C(=Se)—, —C=N—, —C(=O)O—, —C(=O)N(R$^3$)—, —P(=O)(R$^7$)—, —As (=O)(R$^7$)—, —P(=S)(R$^7$), —As(=S)(R$^7$)—, —S(=O)—, —S(=O)$_2$—, —NR$^2$—, —O—, or —S— and wherein one or more H atoms may be replaced by deuterium, F, Cl, Br, I, CF$_3$ or NO$_2$, or an aromatic or heteroaromatic ring system with 5 to 60 aromatic ring atoms, which in each case may be substituted with one or more radicals R$^8$, or an aryloxy or heteroaryloxy group with 5 to 60 aromatic ring atoms, which may be substituted with one or more radicals R$^3$, or a diarylamino group, diheteroarylamino group or arylheteroarylamino group with 10 to 40 aromatic ring atoms, which may be substituted with one or more radicals R$^8$, or a combination of these systems; wherein two or more of these substituents R$^9$ may also form a mono- or polycyclic, aliphatic, aromatic and/or benzoannelated ring system with one another.

An aryl group in the sense of this invention contains 6 to 60 aromatic ring atoms; a heteroaryl group in the sense of this invention contains 5 to 60 aromatic ring atoms, at lease one of which is a heteroatom. The heteroatoms are especially N, O, and S. If other definitions are given in the description of the present invention, for example with regard to the number of aromatic ring atoms or the heteroatoms obtained, these other definitions apply.

Here an aryl group or heteroaryl group denotes a simple aromatic ring, thus benzene, or a simple heteroaromatic ring, for example pyridine, pyrimidine or thiophene, or a heteroaromatic polycycle, for example naphthalene, phenanthrene, quinoline or carbazole. A condensed (annelated) aromatic or heteroaromatic polycycle in the sense of the present application consists of two or more simple aromatic or heteroaromatic rings condensed with one another.

An aryl or heteroaryl group, which in each case may be substituted with the above-mentioned radicals and which may be bonded to the aromatic or heteroaromatic compound over arbitrary positions, particularly denotes groups derived from benzene, naphthalene, anthracene, phenanthrene, pyrene, dihydropyrene, chrysene, perylene, fluoranthene, benzanthracene, benzphenanthrene, tetracene, pentacene, benzpyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, isoquinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, napthoxazole, anthroxazole, phenanthroxazole, isoxazole, 1,2-thiazole, 1,3-thiazole, benzothiazole, pyridazine, benzopyridazine, pyrimidine, benzpyrimidine, quinoxaline, pyrazine, phenazine, naphthyridine, azacarbazole, benzocarbolin, phenanthroline, 1,2,3-triazole, 1,2,4-triazole, benzotriazole, 1,2,3-oxadiazole, 1,2,4-oxadiazole, 1,2,5-oxadiazole, 1,2,3, 4-tetrazine, purine, pteridine, indolizine and benzothiadiazole.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are especially selected from N, O and/or S. An aromatic or heteroaromatic ring system in the sense of this invention denotes a system that does not necessarily contain only aryl or heteroaryl groups, but also in which several aryl or heteroaryl groups may be connected by a non-aromatic unit (especially less than 10% of the different atoms), for example, a sp3-hybridized C, Si, or N atom, a sp2-hybridized C, N or O atom or a sp-hybridized C atom. Thus for example systems such as 9,9'-diarylfluorene, triarylamine, diaryl ether, stilbene etc. are classified as aromatic ring systems in the sense of this invention, and also systems in which two or more aryl groups, for example, are connected by a linear or cyclic alkyl, alkenyl or alkynyl group or by a silyl group. In addition, systems in which two or more aryl or heteroaryl groups are connected together are defined as aromatic or heteroaromatic ring systems in the sense of this invention, for example systems such as biphenyl, terphenyl or diphenyltriazine.

An aromatic or heteroaromatic ring system with 5 to 60 aromatic ring atoms, which may also be substituted in each case with radicals such as those defined above and which can be linked over any desired positions to the aromatic or heteroaromatic especially includes groups derived from benzene, naphthalene, anthracene, benzanthracene, phenanthrene, benzphenanthrene, pyrene, chrysene, perylene, fluoranthene, naphthacene, pentacene, benzpyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, napthoxazole, anthroxazole, phenanthroxazole, isoxazole, 1,2-thiazole, 1,3-thiazole, benzothiazole, pyridazine, benzopyridazine, pyrimidine, benzpyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarbolin, phenanthroline, 1,2,3-triazole, 1,2,4-triazole, benzotriazole, 1,2,3-oxadiazole, 1,2,4-oxadiazole, 1,2,5-oxadiazole, 1,2,3-oxadiazole, 1,2,3-thiadiazole, 1,2,5-thiadiazole, 1,3,4-thiadiazole, 1,3,5-triazine, 1,2,4-triazine, 1,2,3-triazine, tetrazole, 1,2,3,5-tetrazine, 1,2,3,4-tetrazine, purine, pteridine, indolizine and benzothiadiazole or combinations of these groups.

In another embodiment, the organic molecule comprises one of the structures described by formulas 1a or 1b:

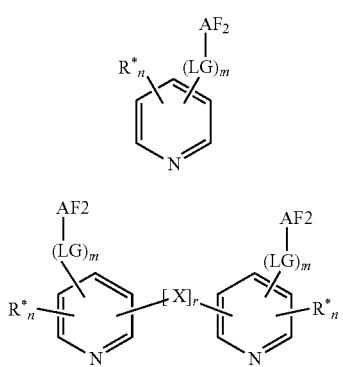

Formula 1a

Formula 1b wherein the definitions named under formula 1 apply.

The part of the molecule of formula 1, 1a or 1b that is not an AF2 is also designate in the above application as AF1.

In one embodiment the chemical units AF2 are selected from the structures shown in Table 1. Possible attachment points for a chemical unit AF2 to a linker group LG or to the pyridine unit are designated using lower-case letters.

TABLE 1

Possible units AF2. Possible attachment points of a chemical unit AF2 to a linker group LG or to the pyridine unit are designated using lower-case letters.

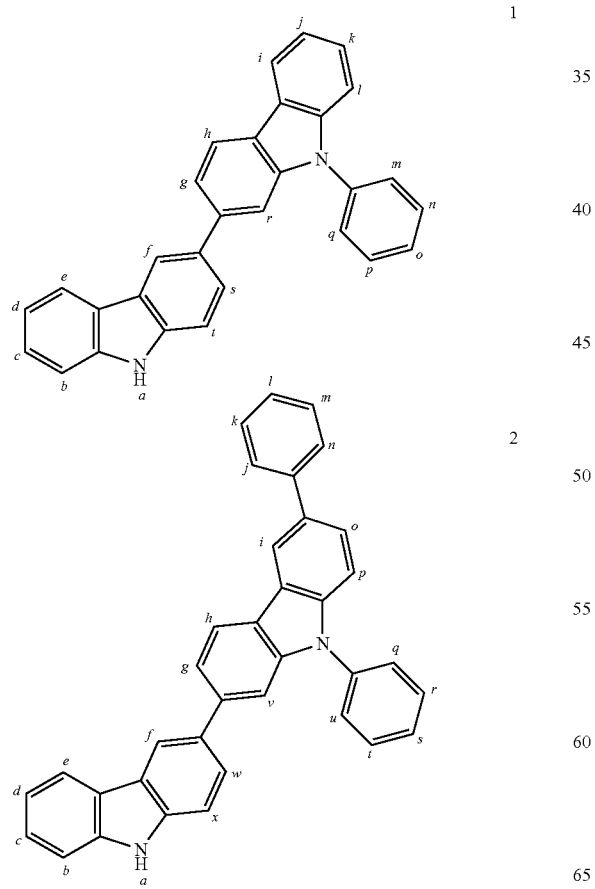

TABLE 1-continued

Possible units AF2. Possible attachment points of a chemical unit AF2 to a linker group LG or to the pyridine unit are designated using lower-case letters.

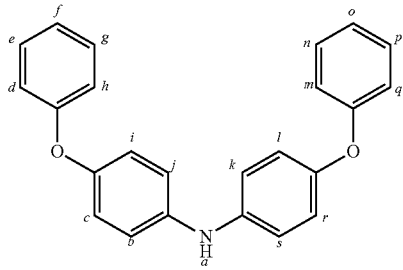

3

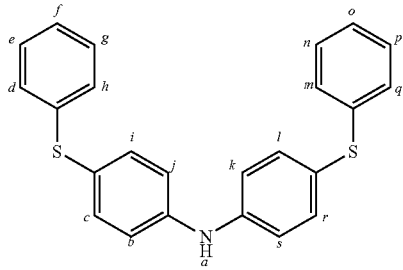

4

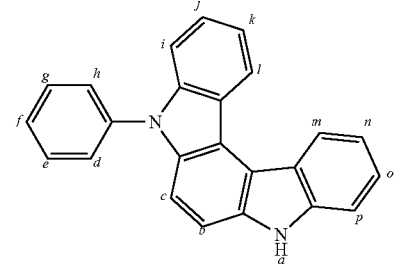

6

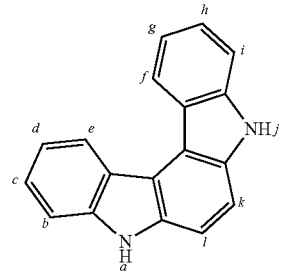

7

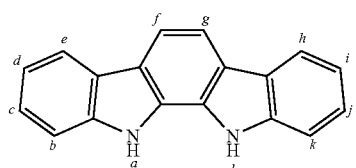

8

TABLE 1-continued
Possible units AF2. Possible attachment points of a chemical unit AF2 to a linker group LG or to the pyridine unit are designated using lower-case letters.
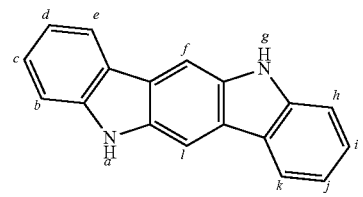
10
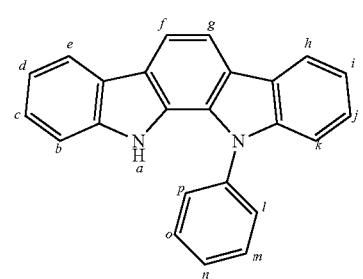
21
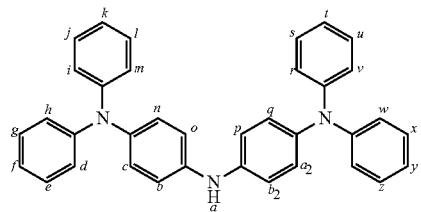
22
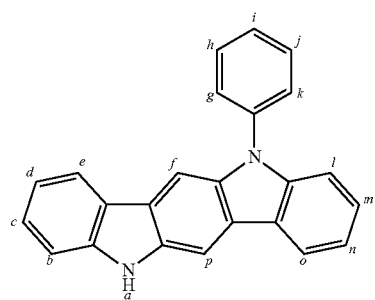
24
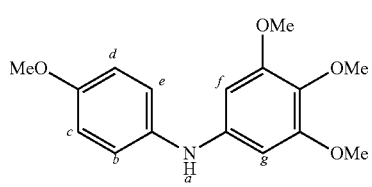
26
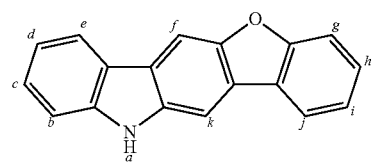
30
TABLE 1-continued
Possible units AF2. Possible attachment points of a chemical unit AF2 to a linker group LG or to the pyridine unit are designated using lower-case letters.
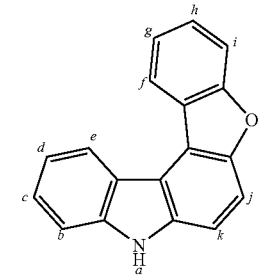
31
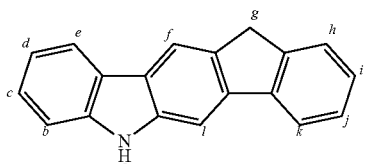
33
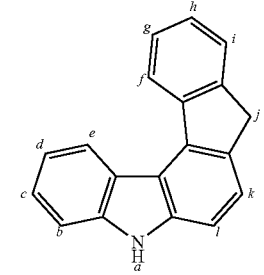
34
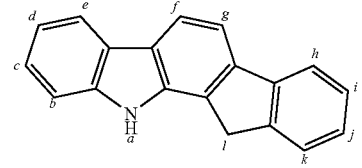
35
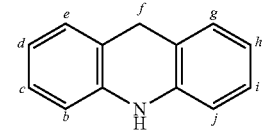
39
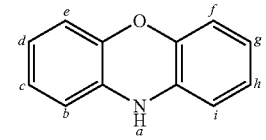
41
49

TABLE 1-continued
Possible units AF2. Possible attachment points of a chemical unit AF2 to a linker group LG or to the pyridine unit are designated using lower-case letters.
53
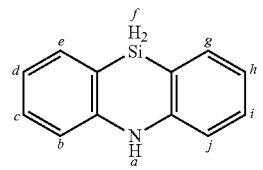
54
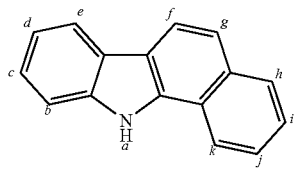
55
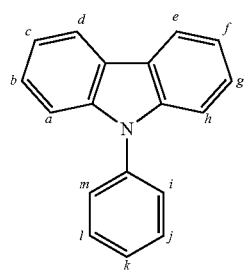
58
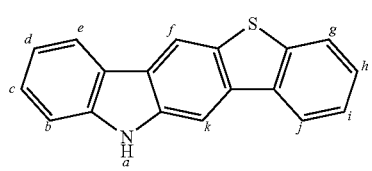
59
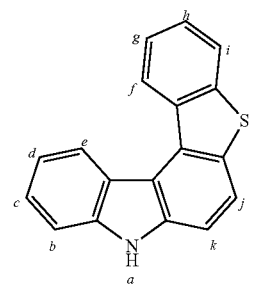
60
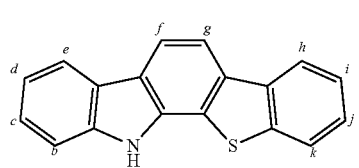
TABLE 1-continued
Possible units AF2. Possible attachment points of a chemical unit AF2 to a linker group LG or to the pyridine unit are designated using lower-case letters.
63
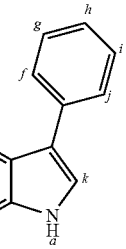
64
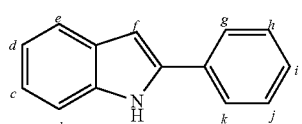
66
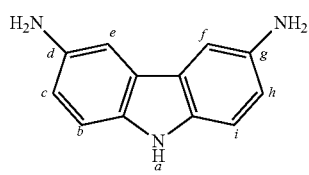
71
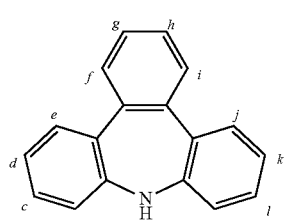
72
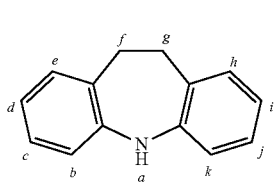
73
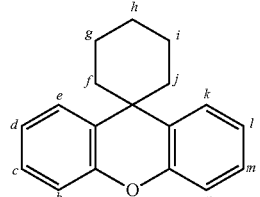
74
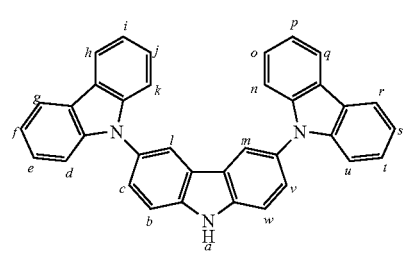

TABLE 1-continued
Possible units AF2. Possible attachment points of a chemical unit AF2 to a linker group LG or to the pyridine unit are designated using lower-case letters.
| | |
|---|---|
| 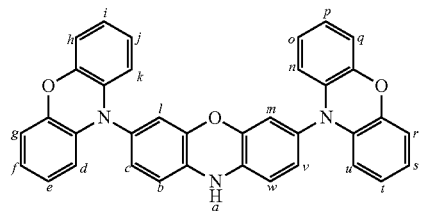 | 75 |
| 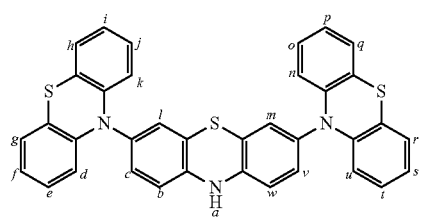 | 76 |
| 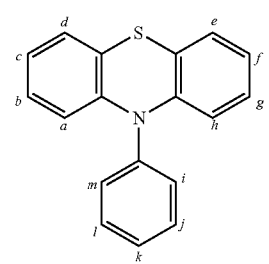 | 77 |
| 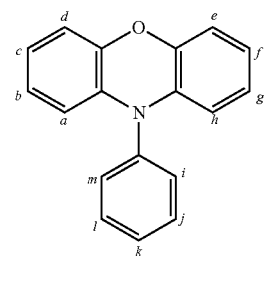 | 78 |
| 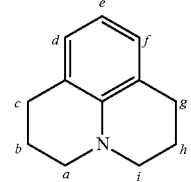 | 91 |
| 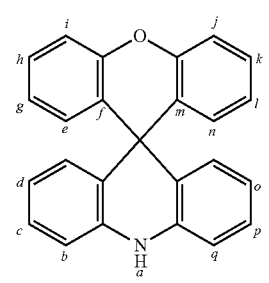 | 94 |
TABLE 1-continued
Possible units AF2. Possible attachment points of a chemical unit AF2 to a linker group LG or to the pyridine unit are designated using lower-case letters.
| | |
|---|---|
| 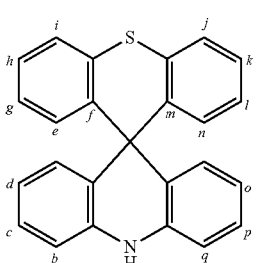 | 95 |
| 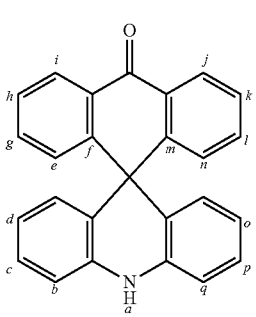 | 96 |
| 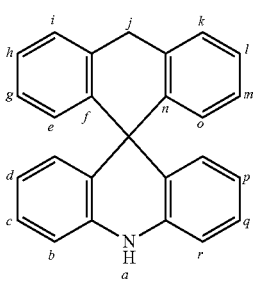 | 97 |
| 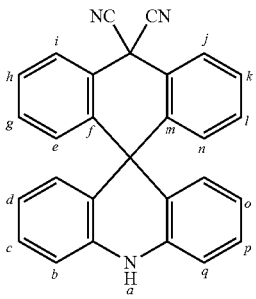 | 98 |
| 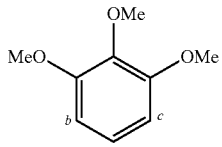 | 120 |
| 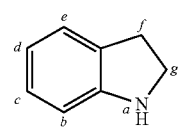 | 128 |

TABLE 1-continued
Possible units AF2. Possible attachment points of a chemical unit AF2 to a linker group LG or to the pyridine unit are designated using lower-case letters.
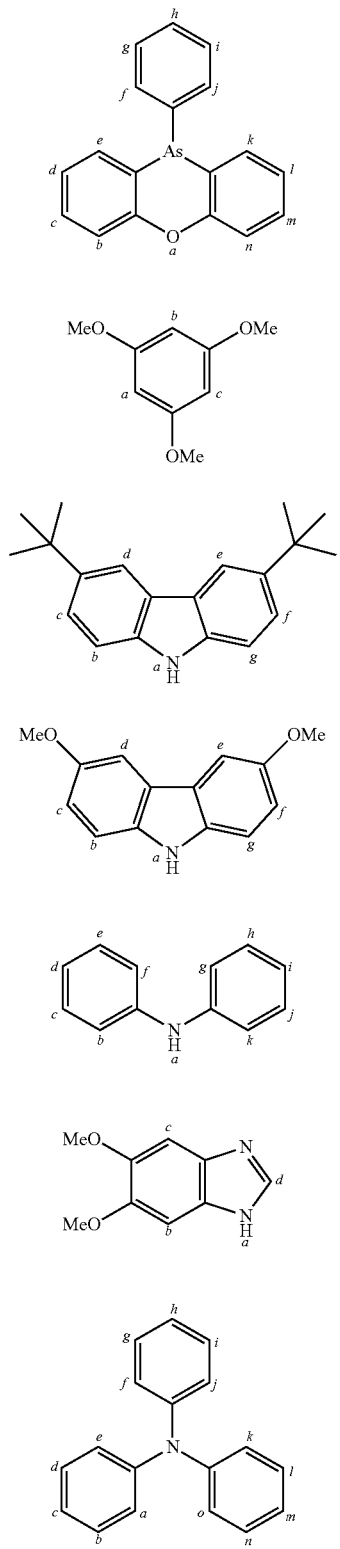
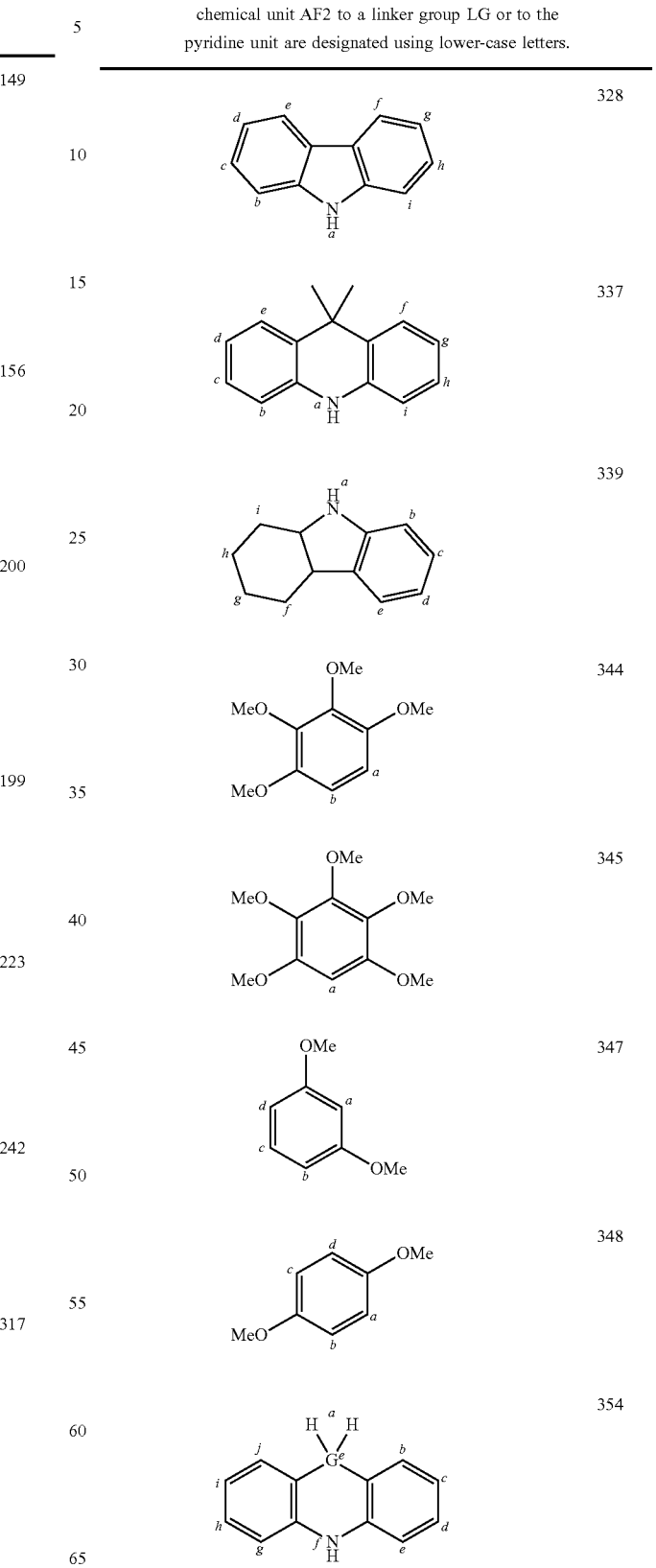

TABLE 1-continued
Possible units AF2. Possible attachment points of a chemical unit AF2 to a linker group LG or to the pyridine unit are designated using lower-case letters.
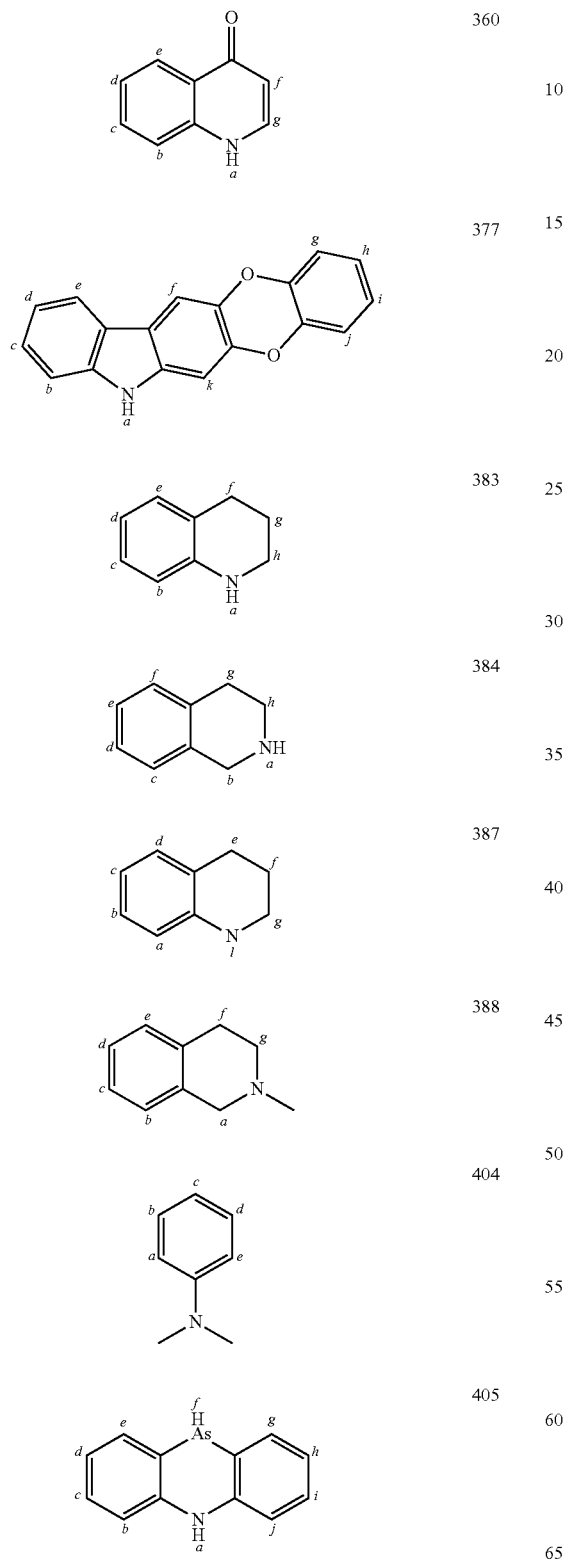
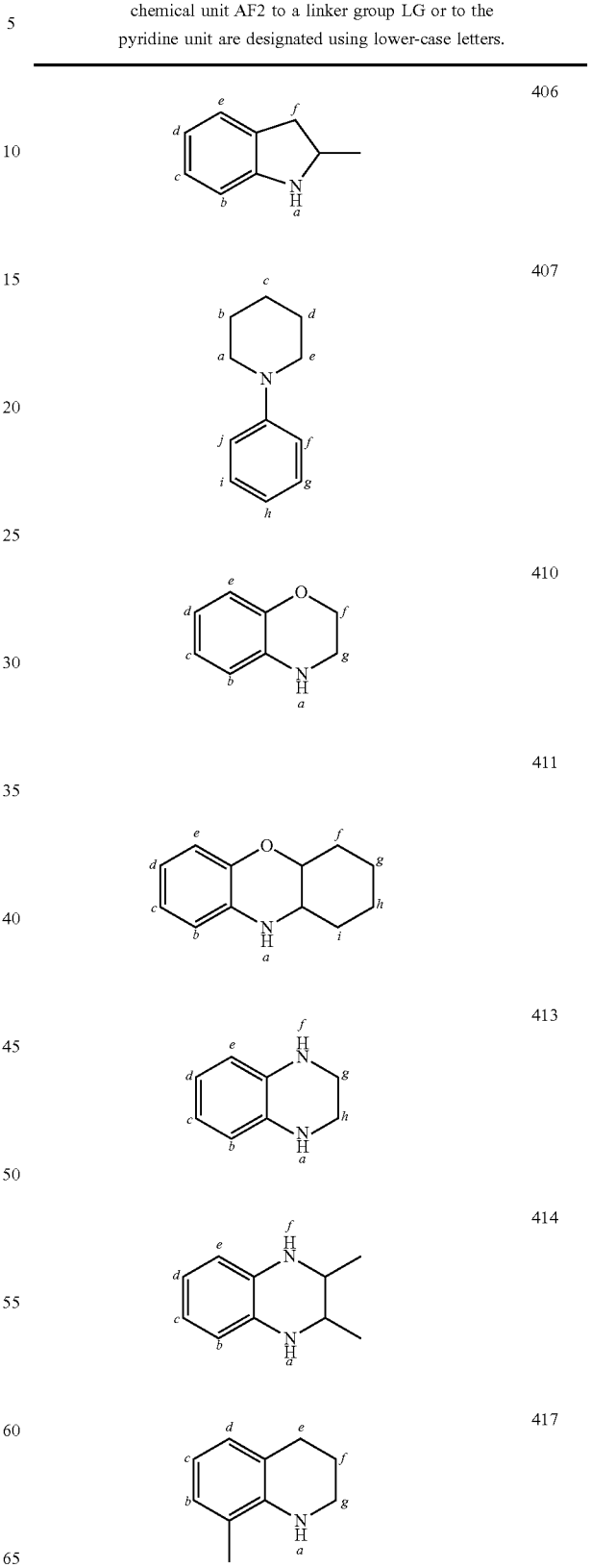

TABLE 1-continued

Possible units AF2. Possible attachment points of a chemical unit AF2 to a linker group LG or to the pyridine unit are designated using lower-case letters.

418
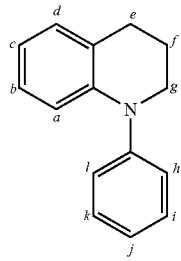

425
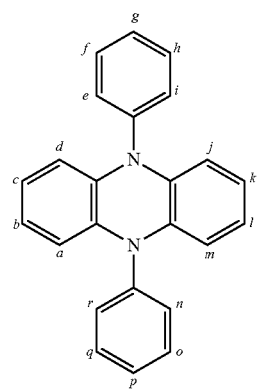

436
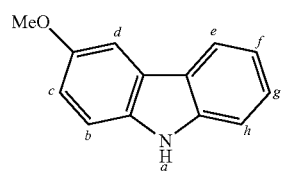

477
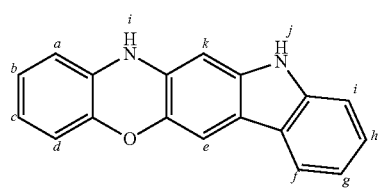

478
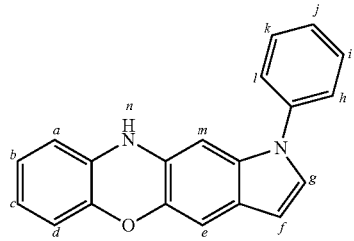

TABLE 1-continued

Possible units AF2. Possible attachment points of a chemical unit AF2 to a linker group LG or to the pyridine unit are designated using lower-case letters.

479
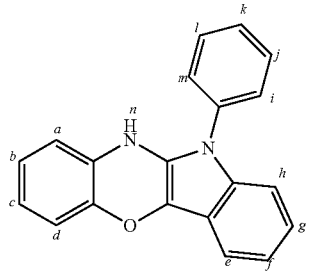

481
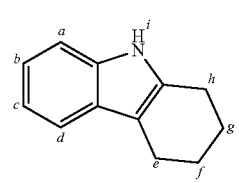 [SMILES: c1ccc2c3c([nH]c2c1)CCCC3]

In one embodiment the positions designated with lower-case letters in Table 1 are functionalized with additional radicals R*.

In an additional embodiment, the molecules according to the invention comprise a structure of formula 3a to 3d or consist of a structure of formula 3a to 3d, wherein the specifications shown for n, m and AF2, LG and R* under formula 1 apply.

Formula 3a
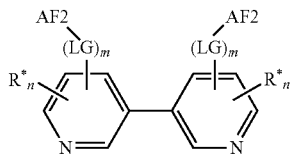

Formula 3b
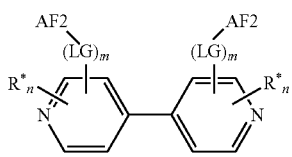

Formula 3c
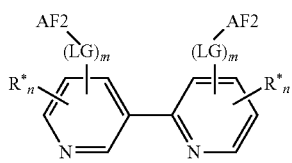

Formula 3d
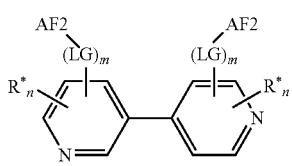

In an additional embodiment, the molecules according to the invention especially comprise or consist of a structure of formula 3.1 to 3.15. Here, optionally all $C_{sp2}$—H groups may also be $C_{sp2}$—R* groups.

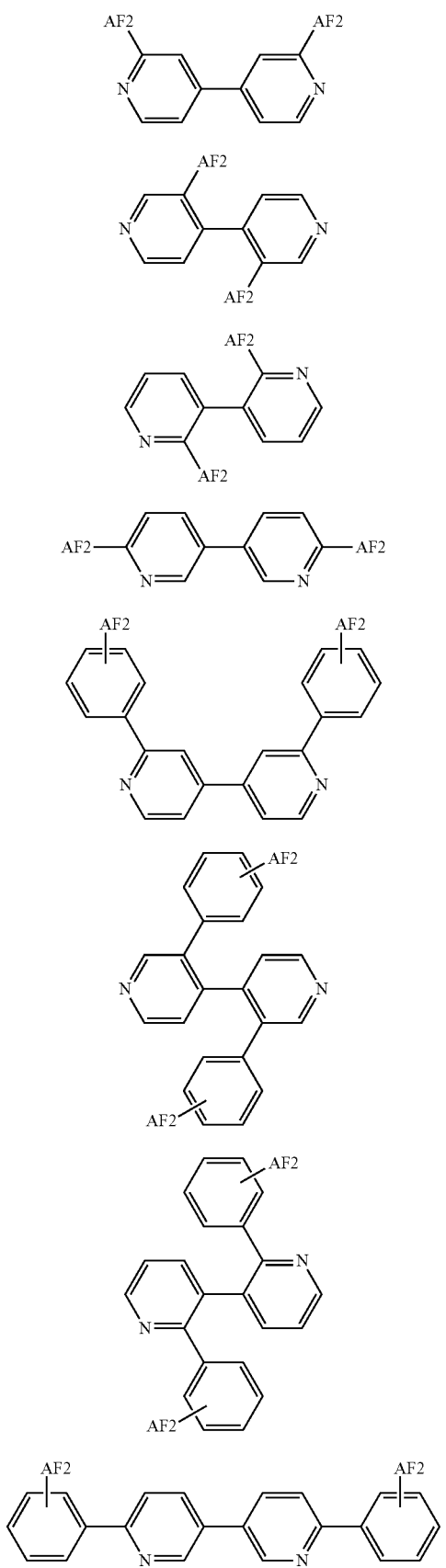
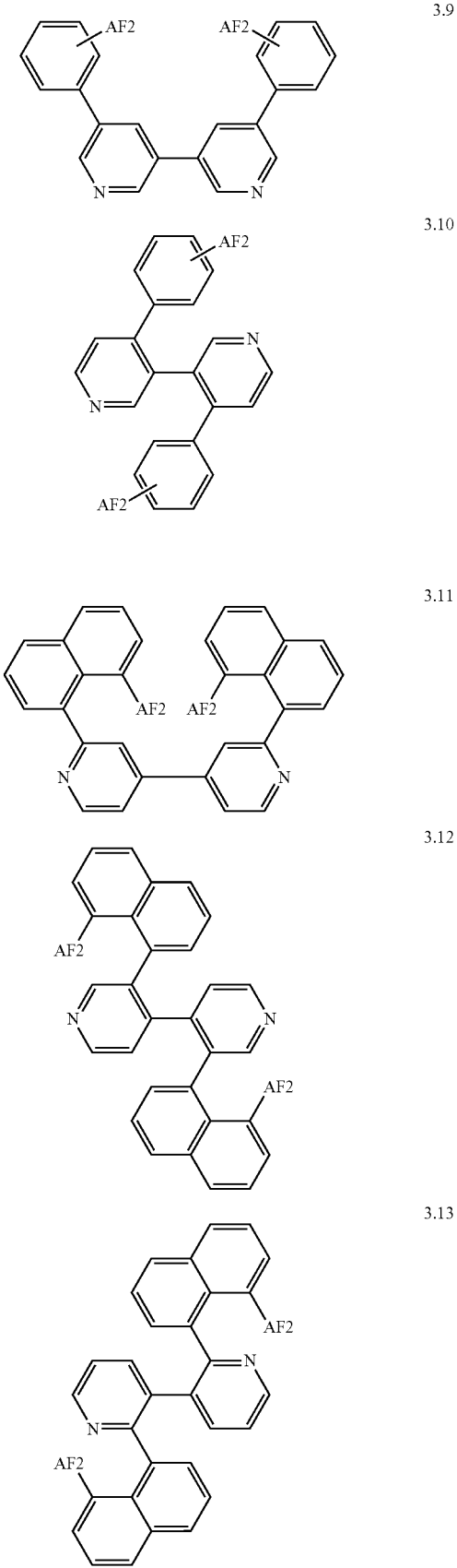

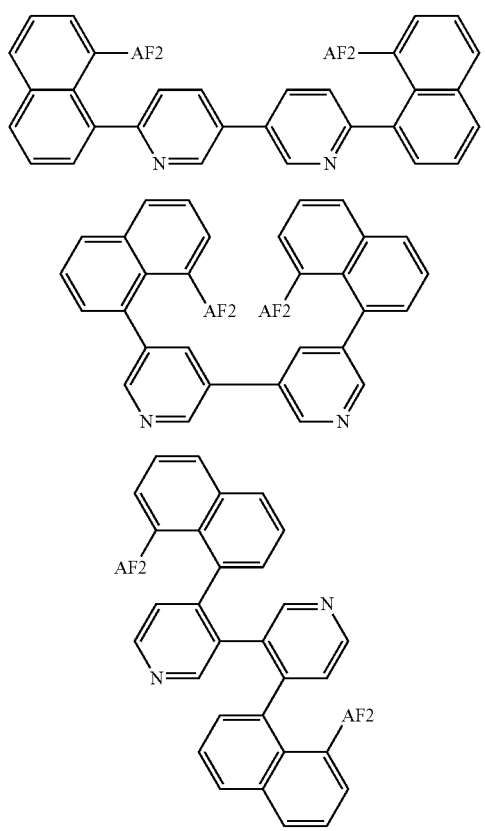

3.13

3.14

3.15

In an additional embodiment the chemical units AF2 contained in molecules according to the invention are described by formula 4;

Formula 4

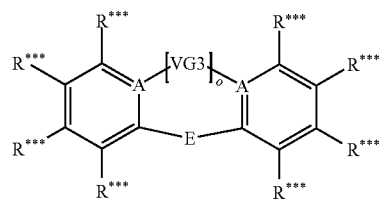

wherein:
o is 0, 1;
A is CR*** when o=0, or otherwise C;
VG3=bridging group is NR, CR$_2$, O, S or a C—C single bond,
E is NR** or

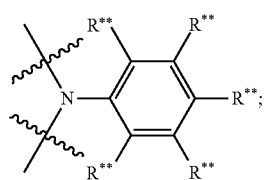

R* is R or is selected from the following units, wherein a maximum of two of the radicals R*** are simultaneously equal to one of the following units:

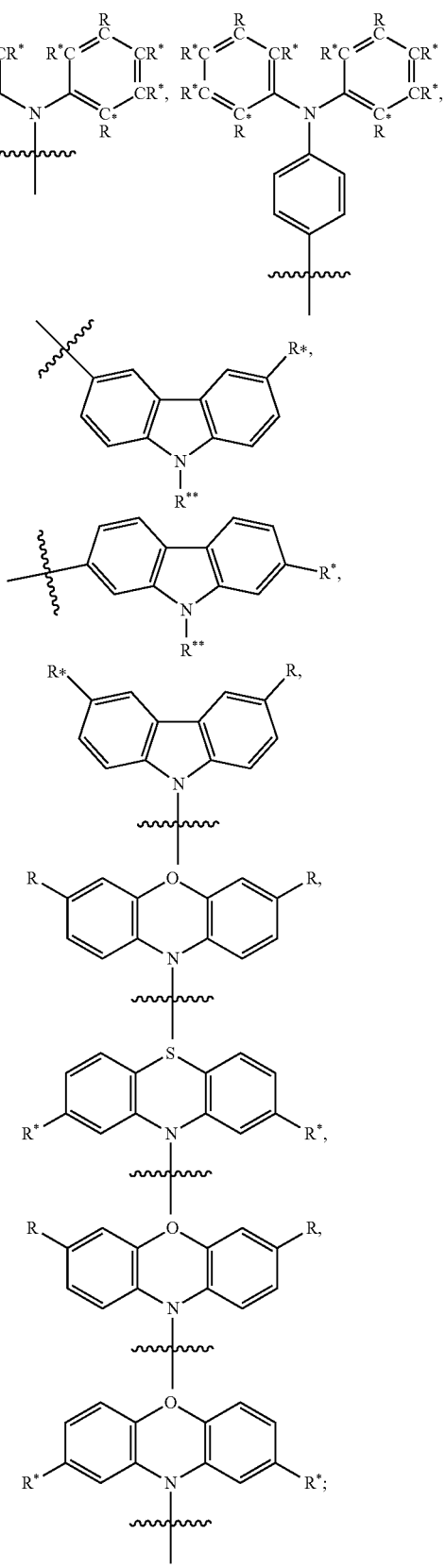

and wherein for R** and R* the definitions mentioned under formula 1 apply.

Examples of organic molecules according to the invention are presented in Table 2. Calculated values for the singlet-triplet distance in the geometry of the S0 base state are shown in parentheses below the corresponding molecular structure.
TABLE 2
Examples of organic molecules according to the invention.
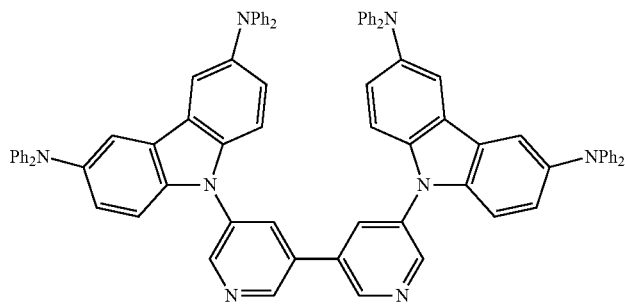
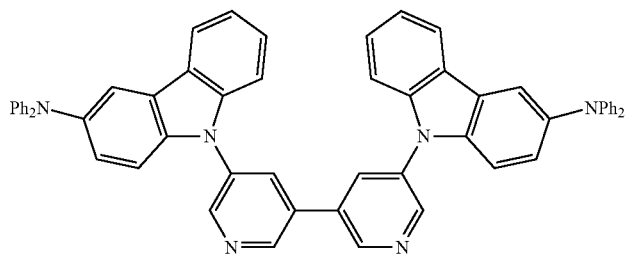
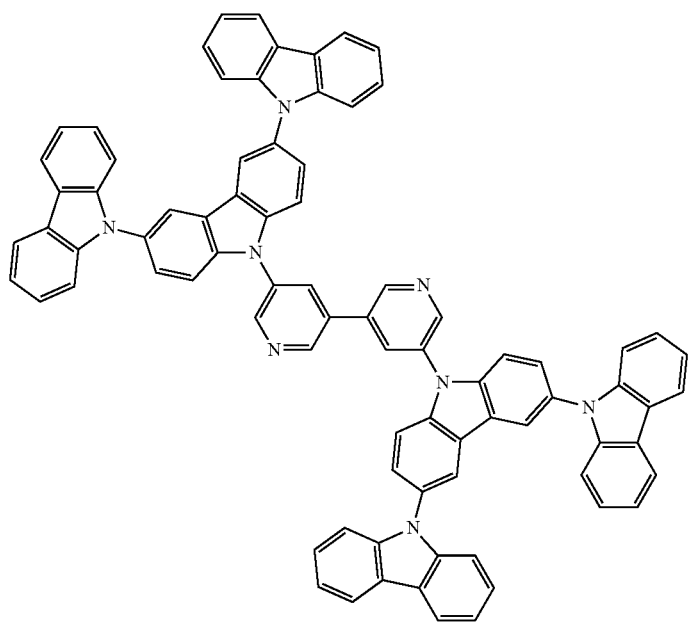 [SMILES: c1ccc2c(c1)c1ccccc1n2-c1ccc2c(c1)c1cc(-n3c4ccccc4c4ccccc43)ccc1n2-c1cncc(-c2cncc(-n3c4ccc(-n5c6ccccc6c6ccccc65)cc4c4cc(-n5c6ccccc6c6ccccc65)ccc43)c2)c1]

TABLE 2-continued
Examples of organic molecules according to the invention.
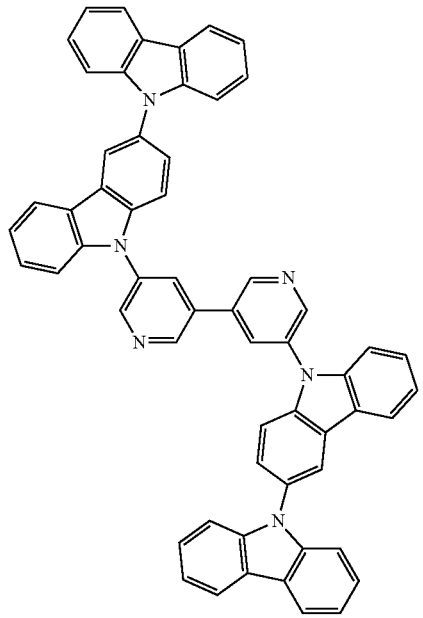 [SMILES: c1ccc2c(c1)c1ccccc1n2-c1ccc2c(c1)c1ccccc1n2-c1cncc(-c2cncc(-n3c4ccccc4c4cc(-n5c6ccccc6c6ccccc65)ccc43)c2)c1]
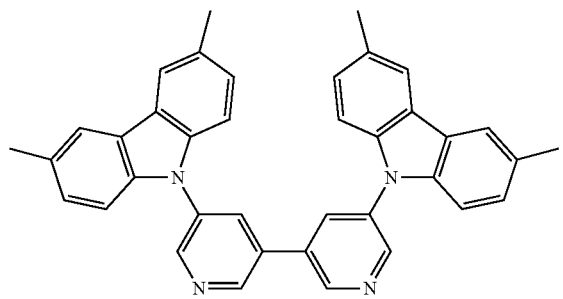
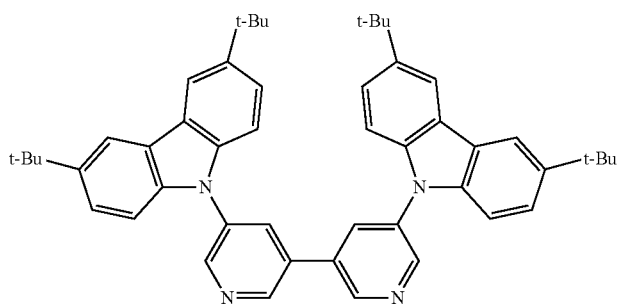 [SMILES: CC(C)(C)c1ccc2c(c1)c1cc(C(C)(C)C)ccc1n2-c1cncc(-c2cncc(-n3c4ccc(C(C)(C)C)cc4c4cc(C(C)(C)C)ccc43)c2)c1]
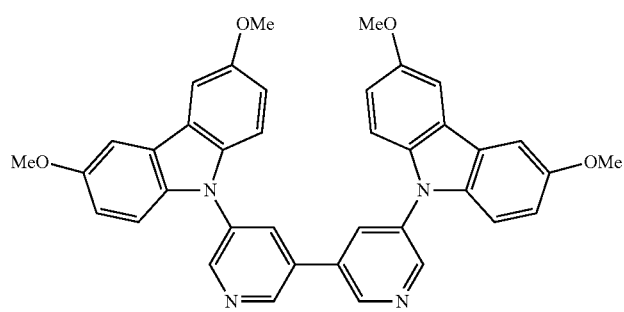 [SMILES: COc1ccc2c(c1)c1cc(OC)ccc1n2-c1cncc(-c2cncc(-n3c4ccc(OC)cc4c4cc(OC)ccc43)c2)c1]

TABLE 2-continued
Examples of organic molecules according to the invention.
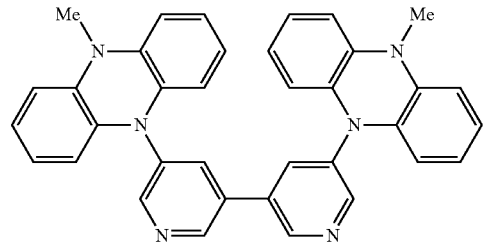 [SMILES: CN1c2ccccc2N(c2cncc(-c3cncc(N4c5ccccc5N(C)c5ccccc54)c3)c2)c2ccccc21]
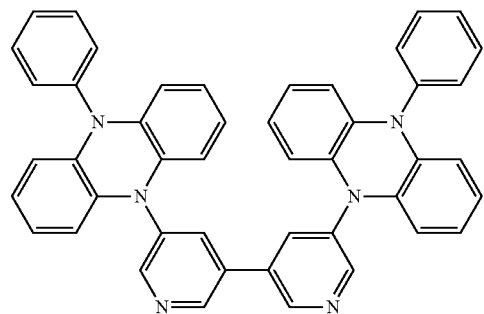 [SMILES: c1ccc(N2c3ccccc3N(c3cncc(-c4cncc(N5c6ccccc6N(c6ccccc6)c6ccccc65)c4)c3)c3ccccc32)cc1]
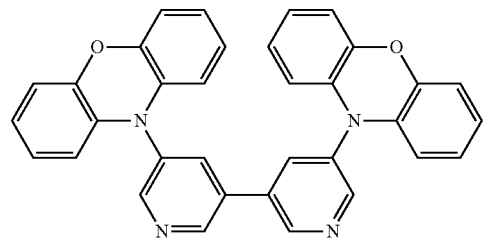
(0.052 eV)
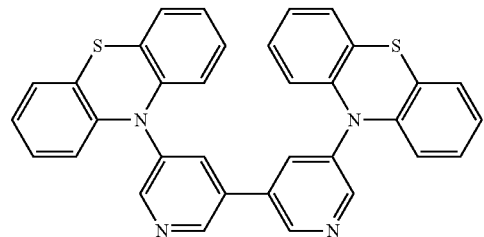 [SMILES: c1ccc2c(c1)Oc1ccccc1N2c1cncc(-c2cncc(N3c4ccccc4Oc4ccccc43)c2)c1]
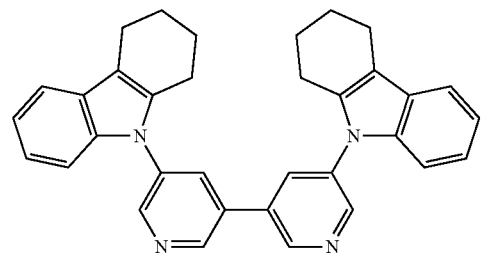 [SMILES: c1ccc2c(c1)c1c(n2-c2cncc(-c3cncc(-n4c5c(c6ccccc64)CCCC5)c3)c2)CCCC1]
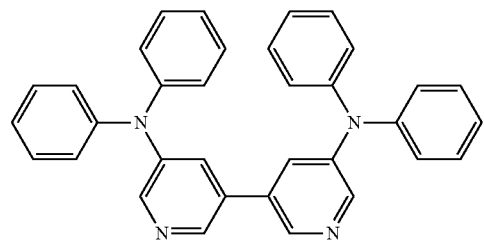 [SMILES: c1ccc(N(c2ccccc2)c2cncc(-c3cncc(N(c4ccccc4)c4ccccc4)c3)c2)cc1]

TABLE 2-continued
Examples of organic molecules according to the invention.
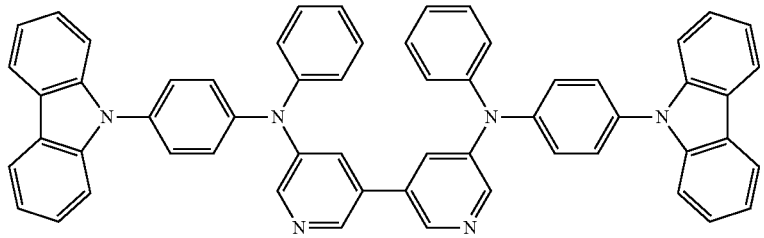 [SMILES: c1ccc(N(c2ccc(-n3c4ccccc4c4ccccc43)cc2)c2cncc(-c3cncc(N(c4ccccc4)c4ccc(-n5c6ccccc6c6ccccc65)cc4)c3)c2)cc1]
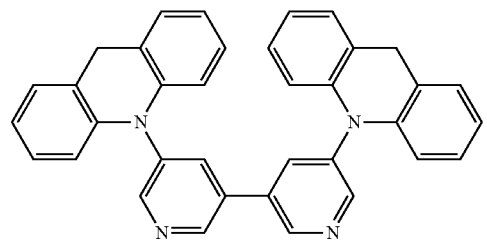
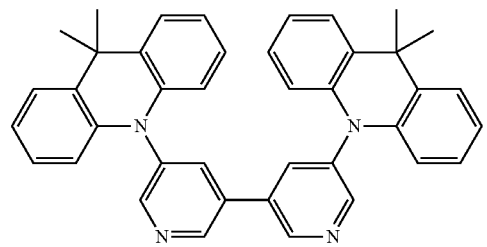 [SMILES: CC1(C)c2ccccc2N(c2cncc(-c3cncc(N4c5ccccc5C(C)(C)c5ccccc54)c3)c2)c2ccccc21]
(0.046 eV)
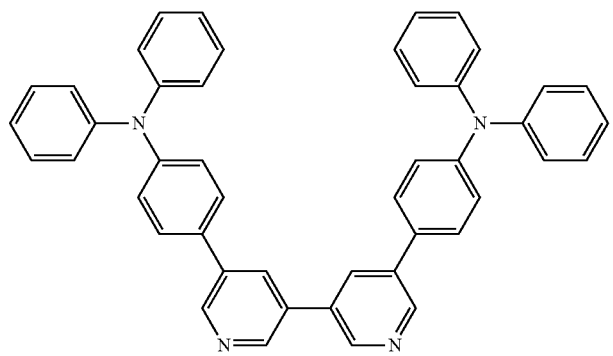 [SMILES: c1ccc(N(c2ccccc2)c2ccc(-c3cncc(-c4cncc(-c5ccc(N(c6ccccc6)c6ccccc6)cc5)c4)c3)cc2)cc1]
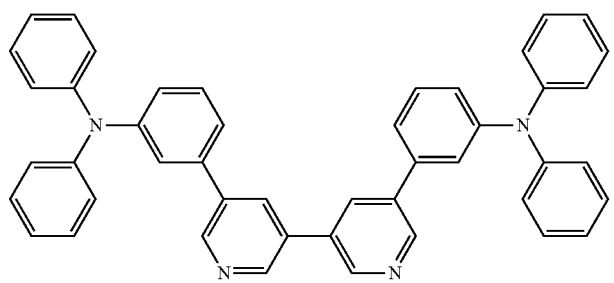 [SMILES: c1ccc(N(c2ccccc2)c2cccc(-c3cncc(-c4cncc(-c5cccc(N(c6ccccc6)c6ccccc6)c5)c4)c3)c2)cc1]

TABLE 2-continued
Examples of organic molecules according to the invention.
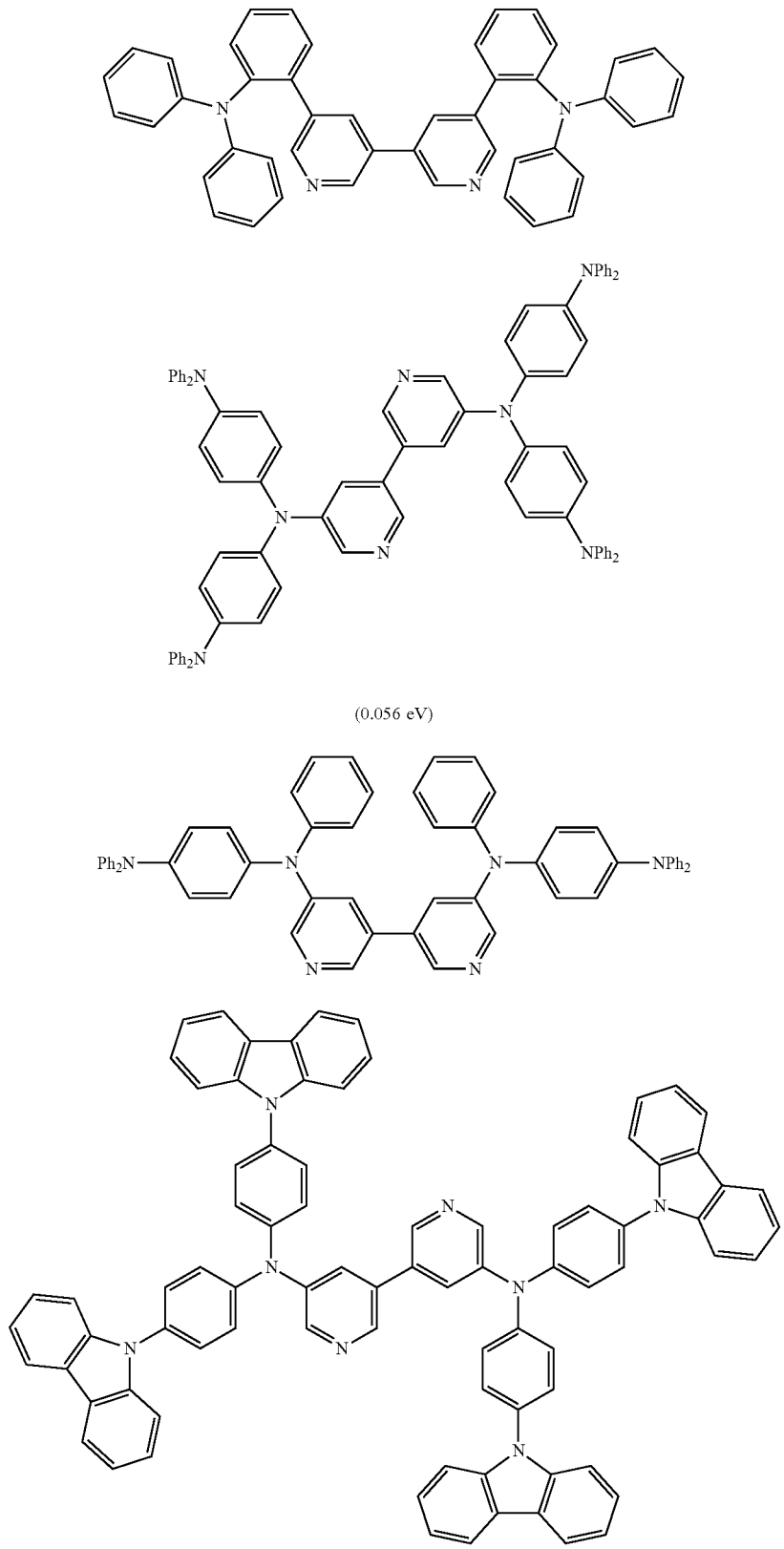
(0.056 eV)

TABLE 2-continued
Examples of organic molecules according to the invention.
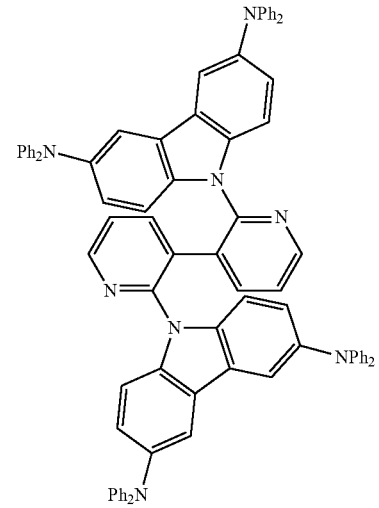
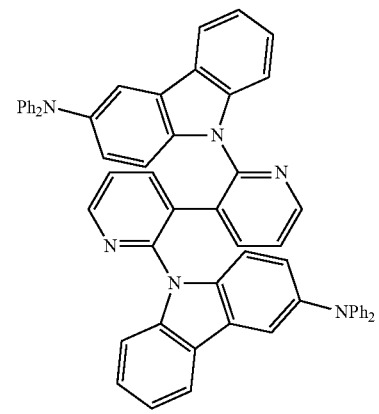
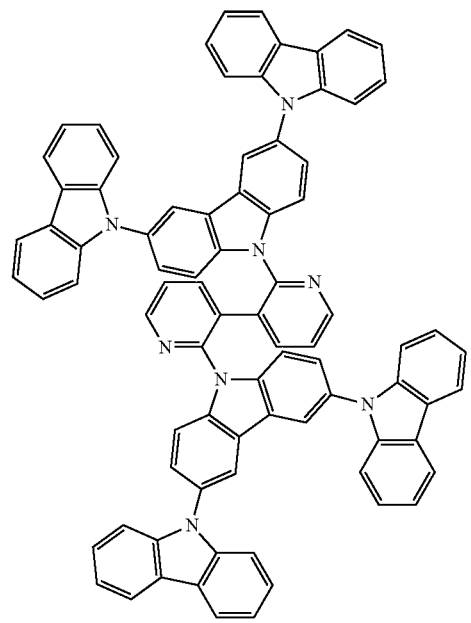 [SMILES: c1cnc(-n2c3ccc(-n4c5ccccc5c5ccccc54)cc3c3cc(-n4c5ccccc5c5ccccc54)ccc32)c(-c2cccnc2-n2c3ccc(-n4c5ccccc5c5ccccc54)cc3c3cc(-n4c5ccccc5c5ccccc54)ccc32)c1]

TABLE 2-continued
Examples of organic molecules according to the invention.
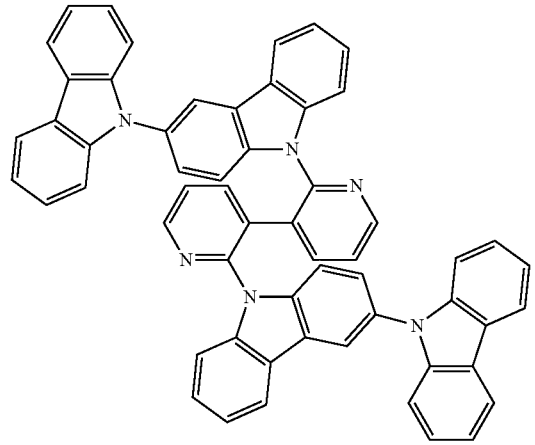 [SMILES: c1cnc(-n2c3ccccc3c3cc(-n4c5ccccc5c5ccccc54)ccc32)c(-c2cccnc2-n2c3ccccc3c3cc(-n4c5ccccc5c5ccccc54)ccc32)c1]
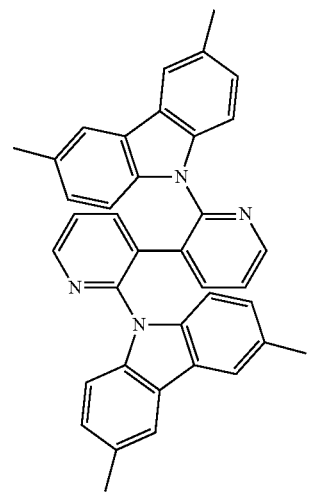
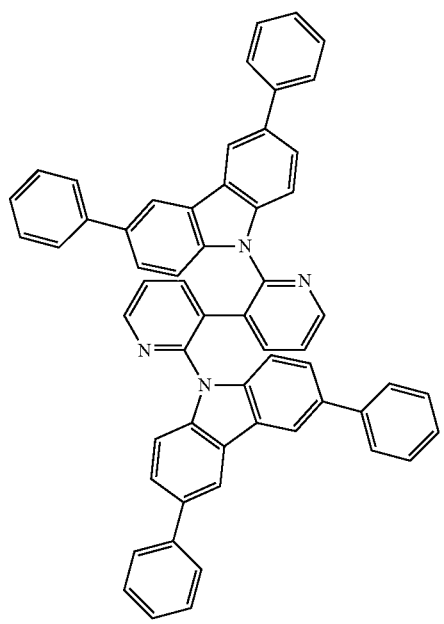 [SMILES: c1ccc(-c2ccc3c(c2)c2cc(-c4ccccc4)ccc2n3-c2ncccc2-c2cccnc2-n2c3ccc(-c4ccccc4)cc3c3cc(-c4ccccc4)ccc32)cc1]

TABLE 2-continued
Examples of organic molecules according to the invention.
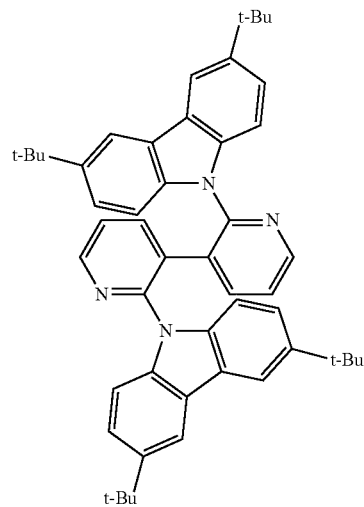 [SMILES: CC(C)(C)c1ccc2c(c1)c1cc(C(C)(C)C)ccc1n2-c1ncccc1-c1cccnc1-n1c2ccc(C(C)(C)C)cc2c2cc(C(C)(C)C)ccc21]
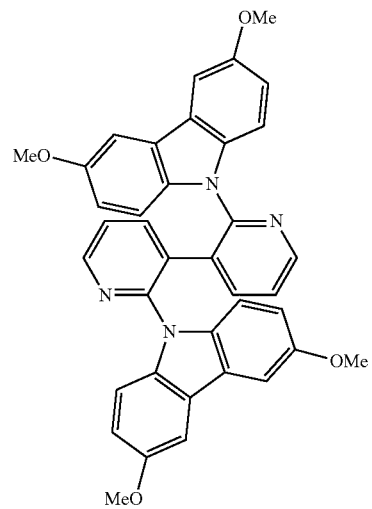
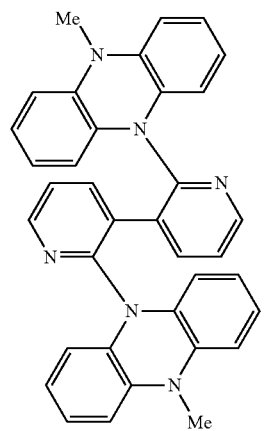 [SMILES: CN1c2ccccc2N(c2ncccc2-c2cccnc2N2c3ccccc3N(C)c3ccccc32)c2ccccc21]

TABLE 2-continued
Examples of organic molecules according to the invention.
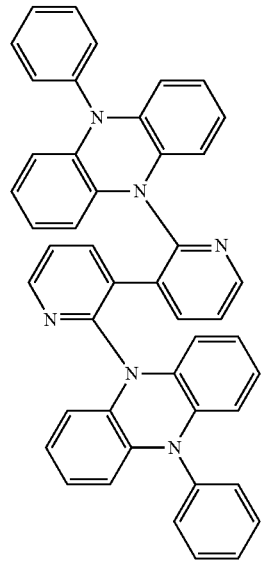 [SMILES: c1ccc(N2c3ccccc3N(c3ncccc3-c3cccnc3N3c4ccccc4N(c4ccccc4)c4ccccc43)c3ccccc32)cc1]
(0.027 eV)
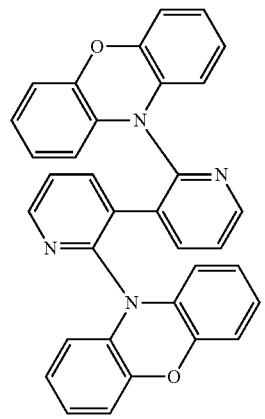 [SMILES: c1ccc2c(c1)Oc1ccccc1N2c1ncccc1-c1cccnc1N1c2ccccc2Oc2ccccc21]
(0.062 eV)
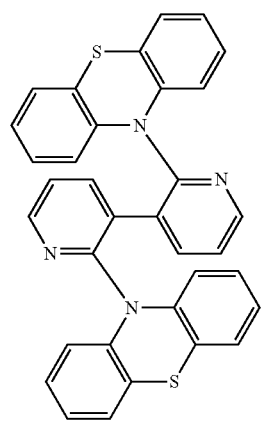

TABLE 2-continued
Examples of organic molecules according to the invention.
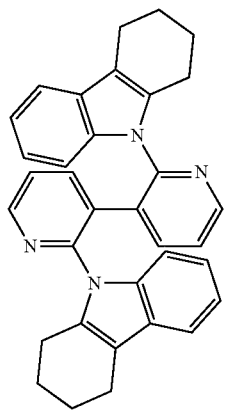 [SMILES: c1cnc(-n2c3c(c4ccccc42)CCCC3)c(-c2cccnc2-n2c3c(c4ccccc42)CCCC3)c1]
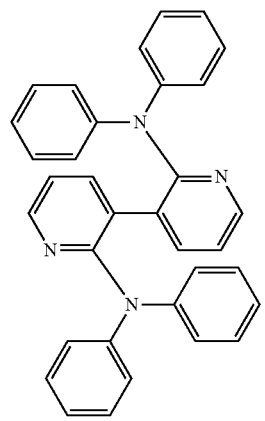 [SMILES: c1ccc(N(c2ccccc2)c2ncccc2-c2cccnc2N(c2ccccc2)c2ccccc2)cc1]
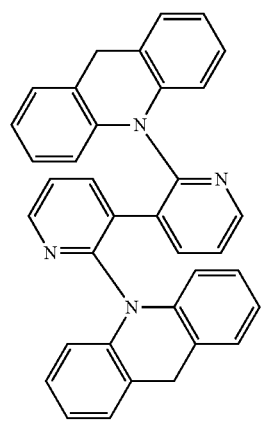 [SMILES: c1ccc2c(c1)Cc1ccccc1N2c1ncccc1-c1cccnc1N1c2ccccc2Cc2ccccc21]

TABLE 2-continued
Examples of organic molecules according to the invention.
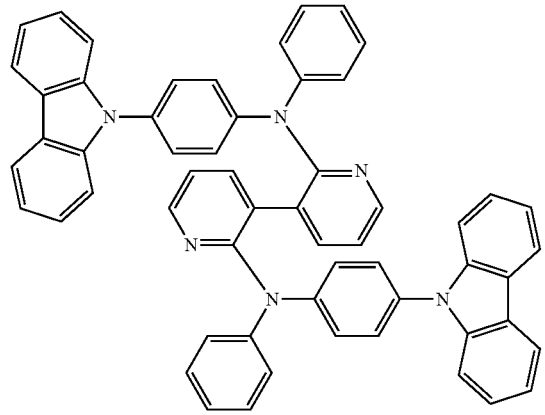 [SMILES: c1ccc(N(c2ccc(-n3c4ccccc4c4ccccc43)cc2)c2ncccc2-c2cccnc2N(c2ccccc2)c2ccc(-n3c4ccccc4c4ccccc43)cc2)cc1]
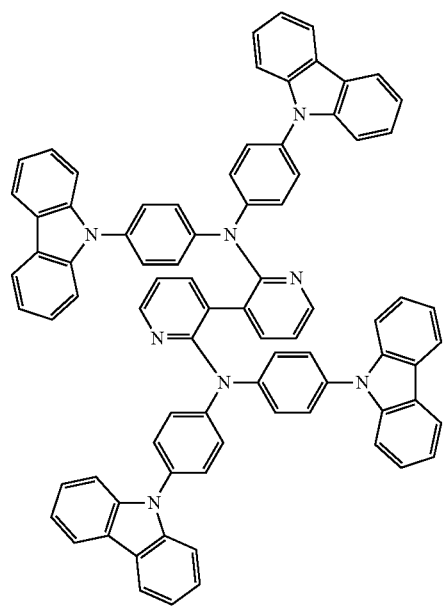 [SMILES: c1cnc(N(c2ccc(-n3c4ccccc4c4ccccc43)cc2)c2ccc(-n3c4ccccc4c4ccccc43)cc2)c(-c2cccnc2N(c2ccc(-n3c4ccccc4c4ccccc43)cc2)c2ccc(-n3c4ccccc4c4ccccc43)cc2)c1]
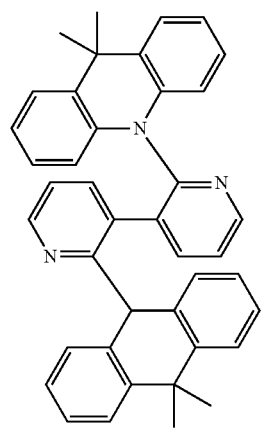 [SMILES: CC1(C)c2ccccc2C(c2ncccc2-c2cccnc2N2c3ccccc3C(C)(C)c3ccccc32)c2ccccc21]

TABLE 2-continued
Examples of organic molecules according to the invention.
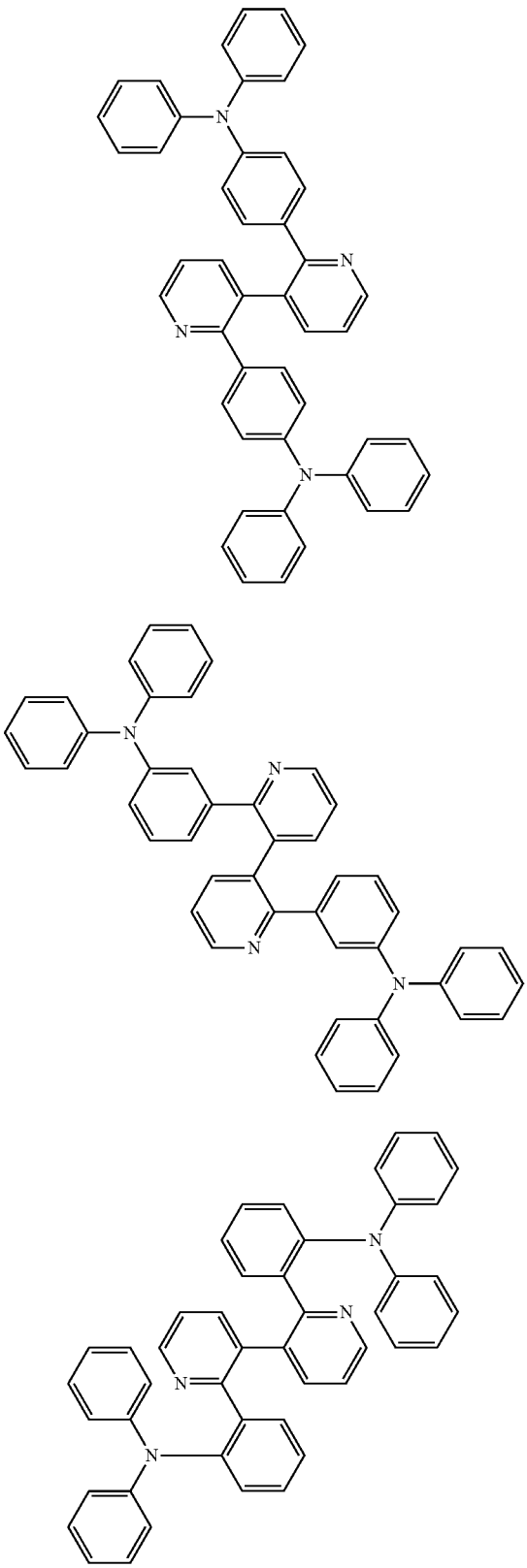

TABLE 2-continued
Examples of organic molecules according to the invention.
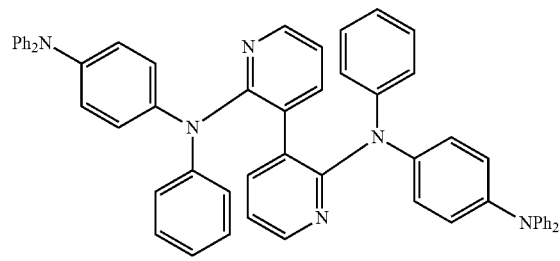
(0.285 eV)
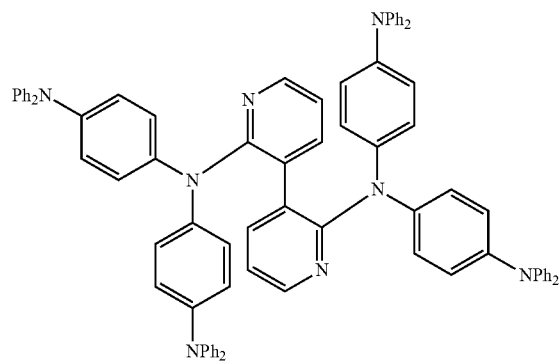
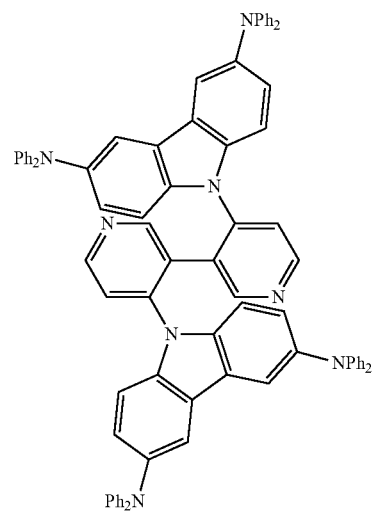
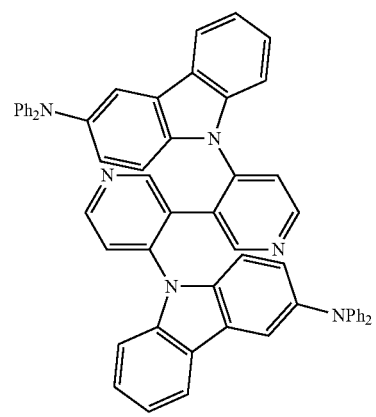

TABLE 2-continued
Examples of organic molecules according to the invention.
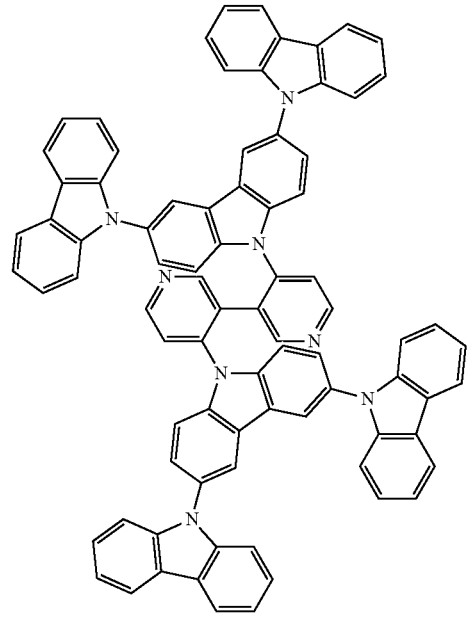 [SMILES: c1ccc2c(c1)c1ccccc1n2-c1ccc2c(c1)c1cc(-n3c4ccccc4c4ccccc43)ccc1n2-c1ccncc1-c1cnccc1-n1c2ccc(-n3c4ccccc4c4ccccc43)cc2c2cc(-n3c4ccccc4c4ccccc43)ccc21]
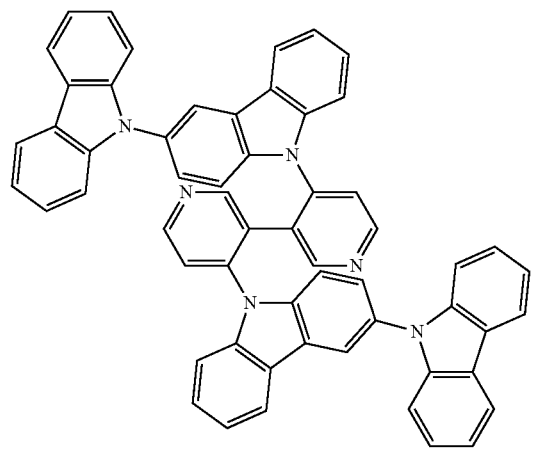 [SMILES: c1ccc2c(c1)c1ccccc1n2-c1ccc2c(c1)c1ccccc1n2-c1ccncc1-c1cnccc1-n1c2ccccc2c2cc(-n3c4ccccc4c4ccccc43)ccc21]
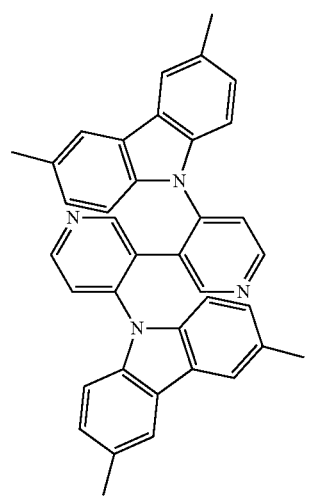

TABLE 2-continued
Examples of organic molecules according to the invention.
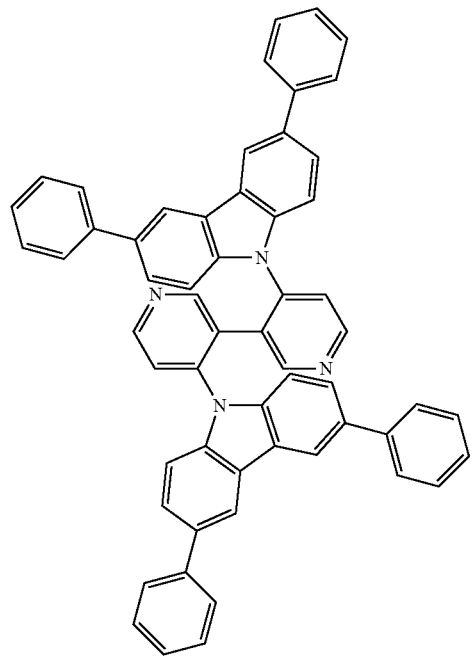 [SMILES: c1ccc(-c2ccc3c(c2)c2cc(-c4ccccc4)ccc2n3-c2ccncc2-c2cnccc2-n2c3ccc(-c4ccccc4)cc3c3cc(-c4ccccc4)ccc32)cc1]
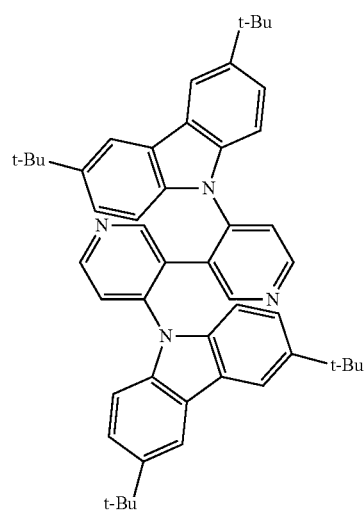 [SMILES: CC(C)(C)c1ccc2c(c1)c1cc(C(C)(C)C)ccc1n2-c1ccncc1-c1cnccc1-n1c2ccc(C(C)(C)C)cc2c2cc(C(C)(C)C)ccc21]

TABLE 2-continued
Examples of organic molecules according to the invention.
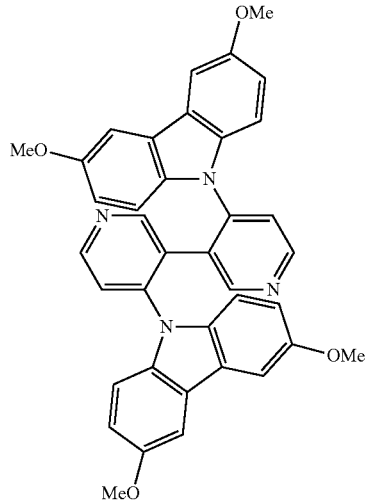
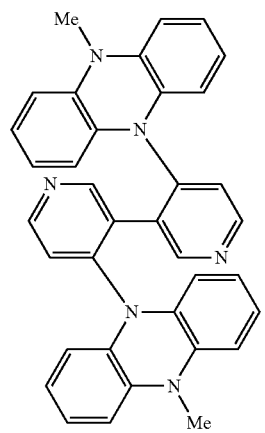 [SMILES: CN1c2ccccc2N(c2ccncc2-c2cnccc2N2c3ccccc3N(C)c3ccccc32)c2ccccc21]
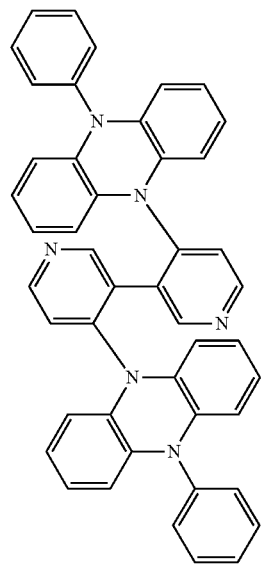 [SMILES: c1ccc(N2c3ccccc3N(c3ccncc3-c3cnccc3N3c4ccccc4N(c4ccccc4)c4ccccc43)c3ccccc32)cc1]

TABLE 2-continued
Examples of organic molecules according to the invention.
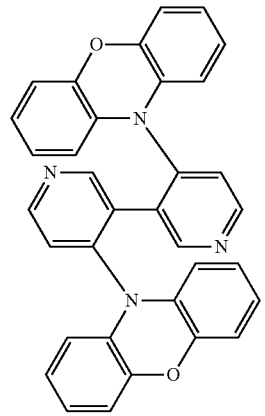
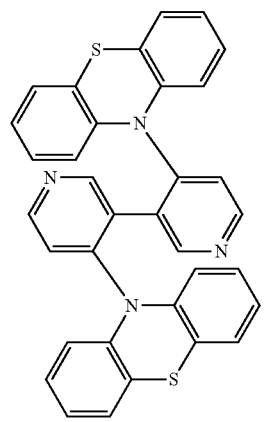 [SMILES: c1ccc2c(c1)Sc1ccccc1N2c1ccncc1-c1cnccc1N1c2ccccc2Sc2ccccc21]
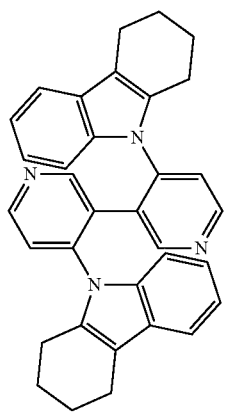 [SMILES: c1ccc2c(c1)c1c(n2-c2ccncc2-c2cnccc2-n2c3c(c4ccccc42)CCCC3)CCCC1]

TABLE 2-continued
Examples of organic molecules according to the invention.
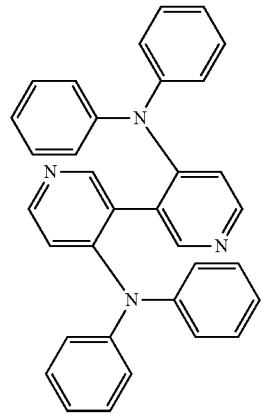 [SMILES: c1ccc(N(c2ccccc2)c2ccncc2-c2cnccc2N(c2ccccc2)c2ccccc2)cc1]
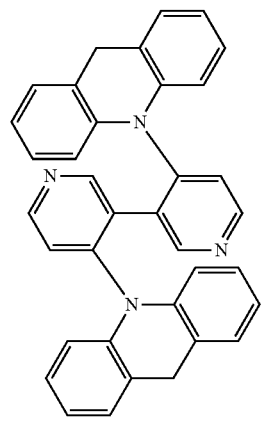
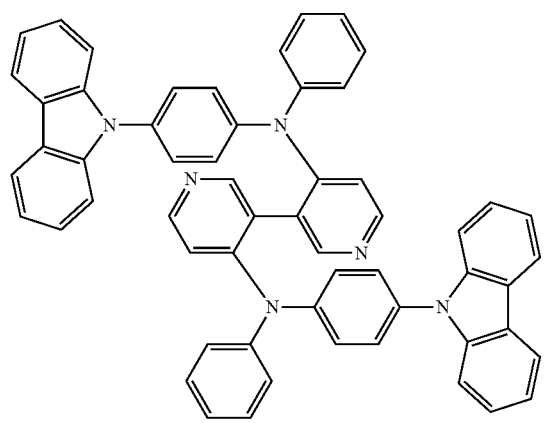

TABLE 2-continued
Examples of organic molecules according to the invention.
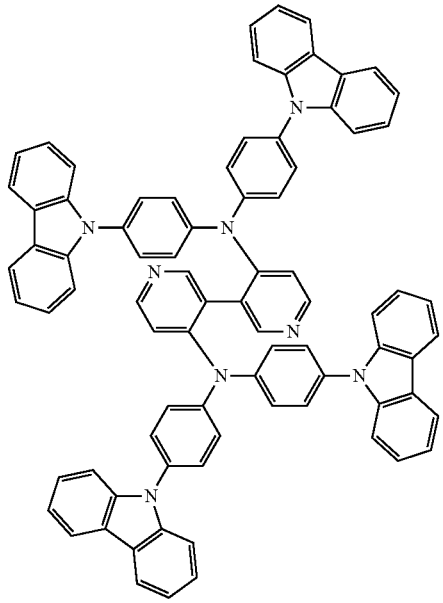 [SMILES: c1ccc2c(c1)c1ccccc1n2-c1ccc(N(c2ccc(-n3c4ccccc4c4ccccc43)cc2)c2ccncc2-c2cnccc2N(c2ccc(-n3c4ccccc4c4ccccc43)cc2)c2ccc(-n3c4ccccc4c4ccccc43)cc2)cc1]
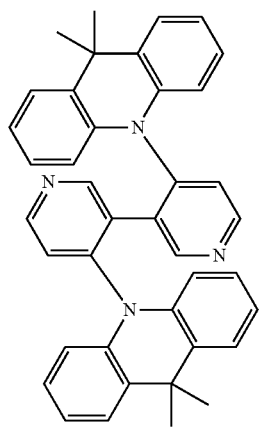 [SMILES: CC1(C)c2ccccc2N(c2ccncc2-c2cnccc2N2c3ccccc3C(C)(C)c3ccccc32)c2ccccc21]
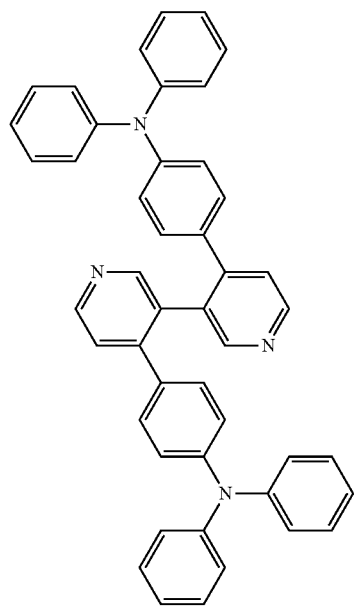 [SMILES: c1ccc(N(c2ccccc2)c2ccc(-c3ccncc3-c3cnccc3-c3ccc(N(c4ccccc4)c4ccccc4)cc3)cc2)cc1]

TABLE 2-continued
Examples of organic molecules according to the invention.
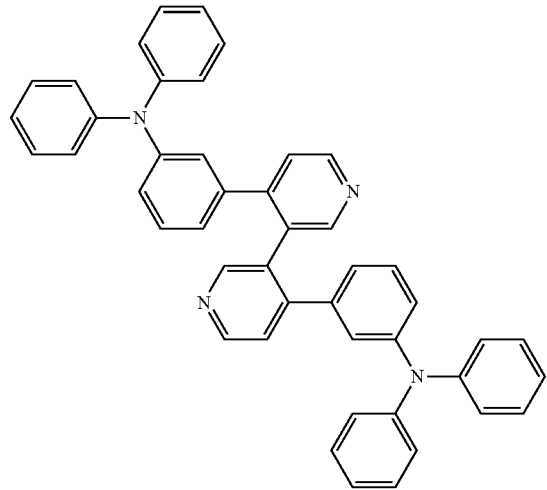 [SMILES: c1ccc(N(c2ccccc2)c2cccc(-c3ccncc3-c3cnccc3-c3cccc(N(c4ccccc4)c4ccccc4)c3)c2)cc1]
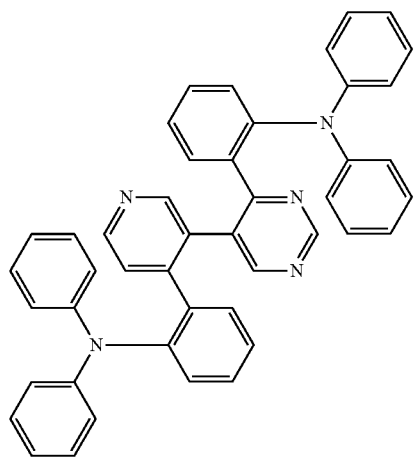 [SMILES: c1ccc(N(c2ccccc2)c2ccccc2-c2ccncc2-c2cncnc2-c2ccccc2N(c2ccccc2)c2ccccc2)cc1]
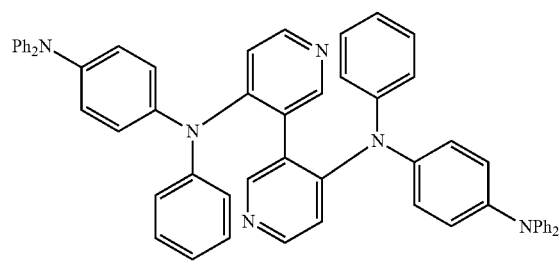
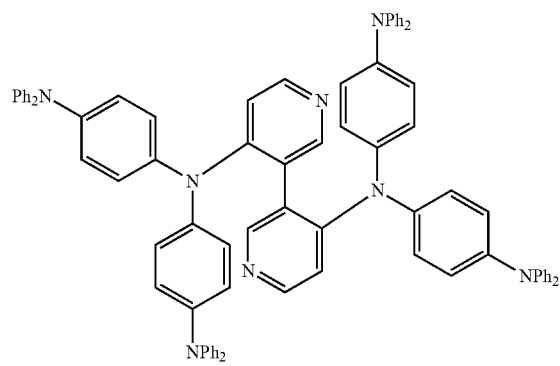

TABLE 2-continued
Examples of organic molecules according to the invention.
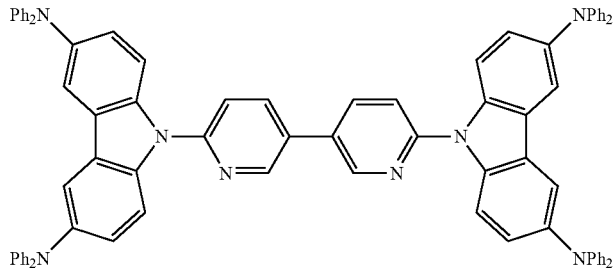
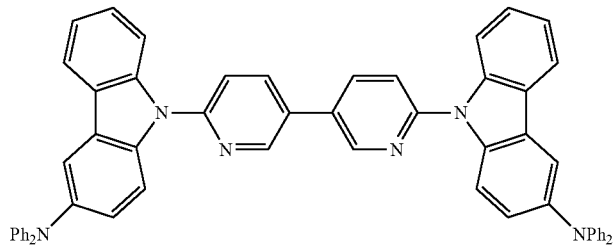
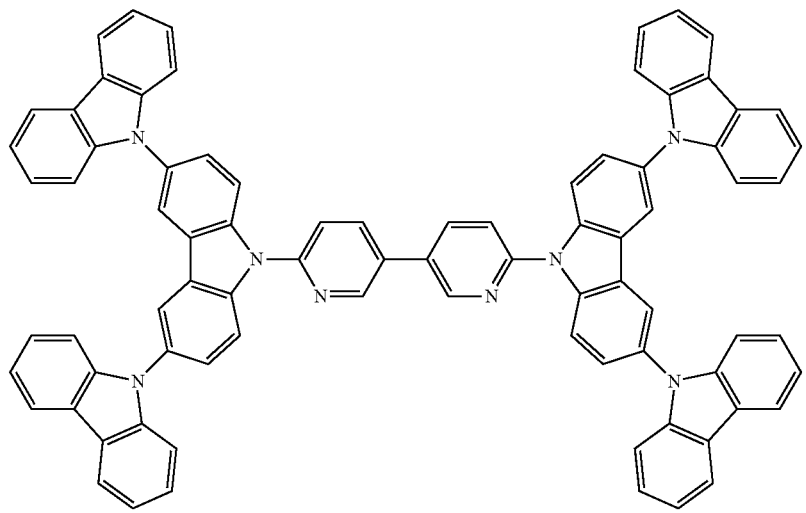 [SMILES: c1ccc2c(c1)c1ccccc1n2-c1ccc2c(c1)c1cc(-n3c4ccccc4c4ccccc43)ccc1n2-c1ccc(-c2ccc(-n3c4ccc(-n5c6ccccc6c6ccccc65)cc4c4cc(-n5c6ccccc6c6ccccc65)ccc43)nc2)cn1]
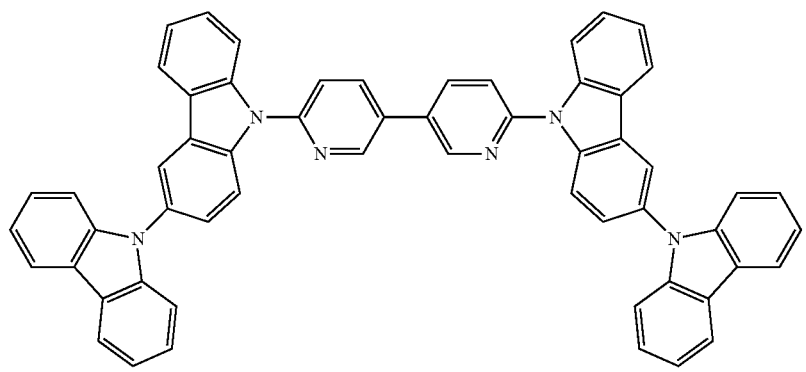 [SMILES: c1ccc2c(c1)c1ccccc1n2-c1ccc2c(c1)c1ccccc1n2-c1ccc(-c2ccc(-n3c4ccccc4c4cc(-n5c6ccccc6c6ccccc65)ccc43)nc2)cn1]

TABLE 2-continued
Examples of organic molecules according to the invention.
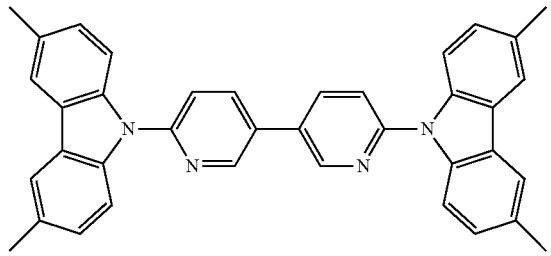
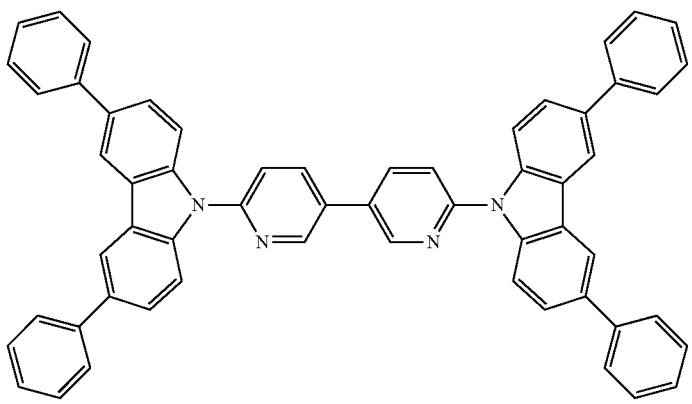 [SMILES: c1ccc(-c2ccc3c(c2)c2cc(-c4ccccc4)ccc2n3-c2ccc(-c3ccc(-n4c5ccc(-c6ccccc6)cc5c5cc(-c6ccccc6)ccc54)nc3)cn2)cc1]
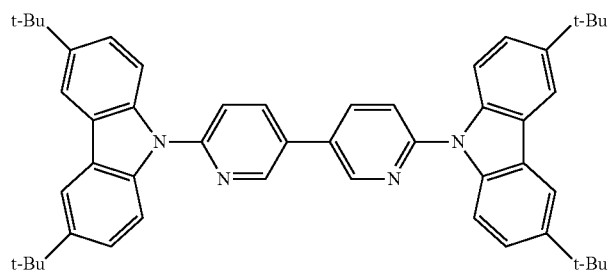 [SMILES: CC(C)(C)c1ccc2c(c1)c1cc(C(C)(C)C)ccc1n2-c1ccc(-c2ccc(-n3c4ccc(C(C)(C)C)cc4c4cc(C(C)(C)C)ccc43)nc2)cn1]
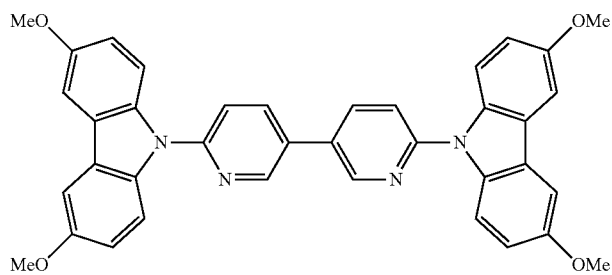 [SMILES: COc1ccc2c(c1)c1cc(OC)ccc1n2-c1ccc(-c2ccc(-n3c4ccc(OC)cc4c4cc(OC)ccc43)nc2)cn1]
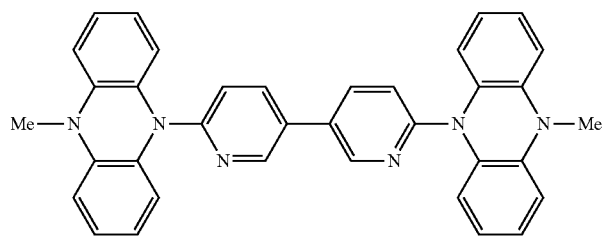 [SMILES: CN1c2ccccc2N(c2ccc(-c3ccc(N4c5ccccc5N(C)c5ccccc54)nc3)cn2)c2ccccc21]

TABLE 2-continued
Examples of organic molecules according to the invention.
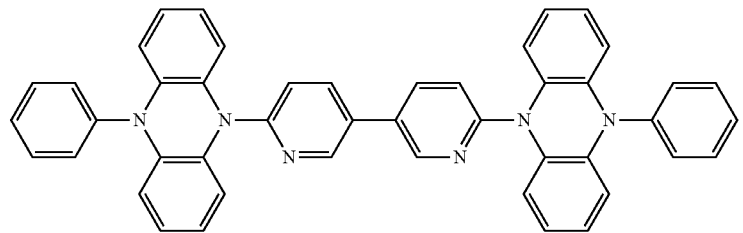 [SMILES: c1ccc(N2c3ccccc3N(c3ccc(-c4ccc(N5c6ccccc6N(c6ccccc6)c6ccccc65)nc4)cn3)c3ccccc32)cc1]
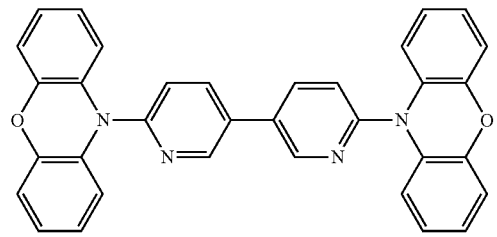 [SMILES: c1ccc2c(c1)Oc1ccccc1N2c1ccc(-c2ccc(N3c4ccccc4Oc4ccccc43)nc2)cn1]
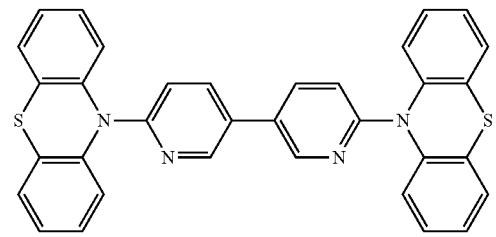 [SMILES: c1ccc2c(c1)Sc1ccccc1N2c1ccc(-c2ccc(N3c4ccccc4Sc4ccccc43)nc2)cn1]
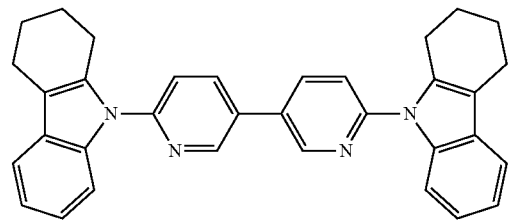 [SMILES: c1ccc2c(c1)c1c(n2-c2ccc(-c3ccc(-n4c5c(c6ccccc64)CCCC5)nc3)cn2)CCCC1]
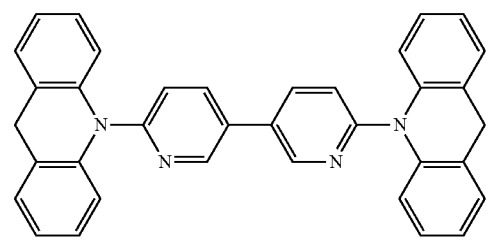 [SMILES: c1ccc2c(c1)Cc1ccccc1N2c1ccc(-c2ccc(N3c4ccccc4Cc4ccccc43)nc2)cn1]
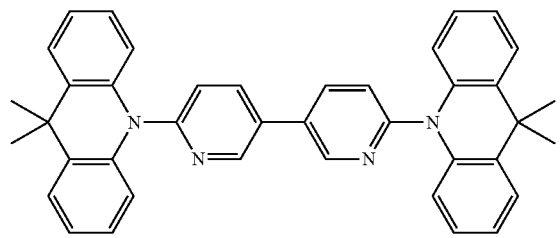
(0.029 eV)

TABLE 2-continued
Examples of organic molecules according to the invention.
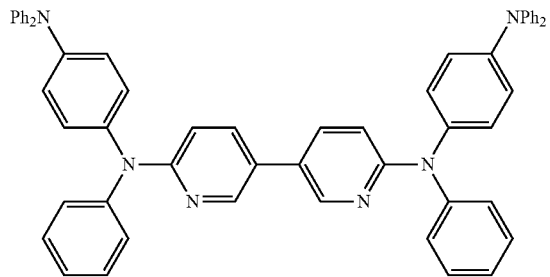
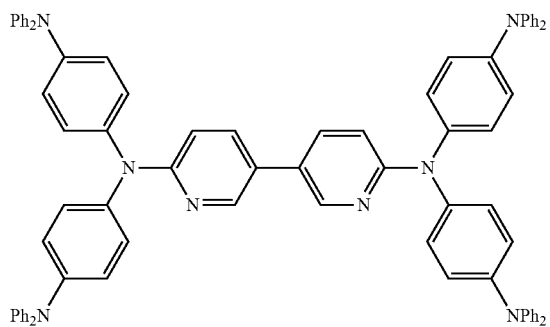
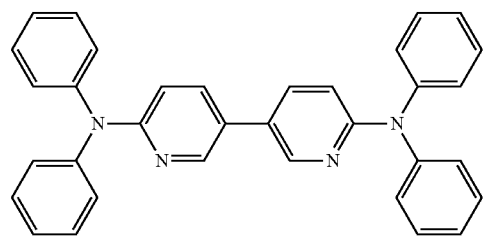 [SMILES: c1ccc(N(c2ccccc2)c2ccc(-c3ccc(N(c4ccccc4)c4ccccc4)nc3)cn2)cc1]
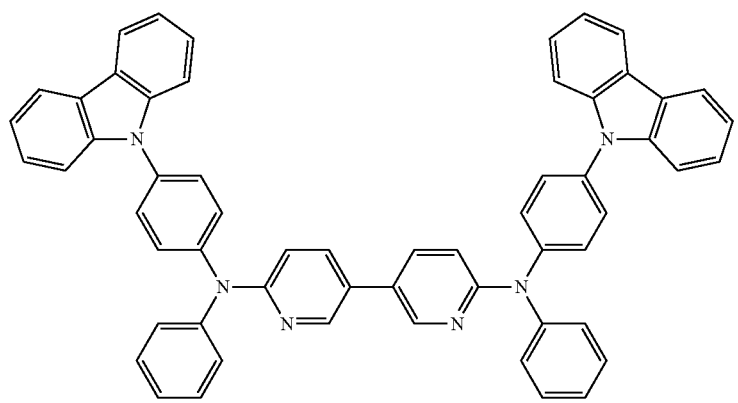 [SMILES: c1ccc(N(c2ccc(-n3c4ccccc4c4ccccc43)cc2)c2ccc(-c3ccc(N(c4ccccc4)c4ccc(-n5c6ccccc6c6ccccc65)cc4)nc3)cn2)cc1]
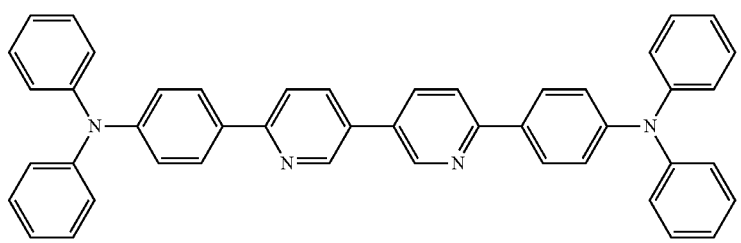 [SMILES: c1ccc(N(c2ccccc2)c2ccc(-c3ccc(-c4ccc(-c5ccc(N(c6ccccc6)c6ccccc6)cc5)nc4)cn3)cc2)cc1]

TABLE 2-continued
Examples of organic molecules according to the invention.
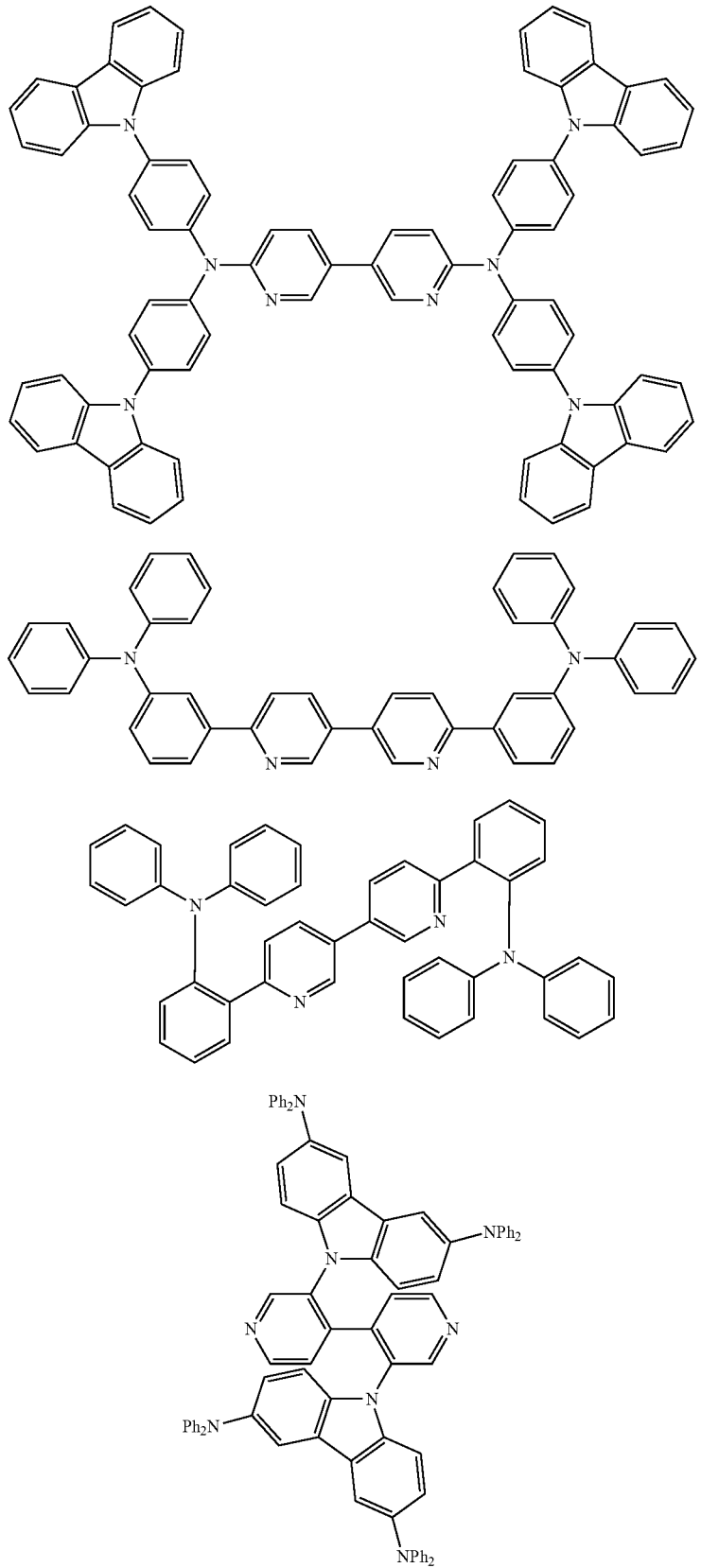

TABLE 2-continued
Examples of organic molecules according to the invention.
(0.014 eV)
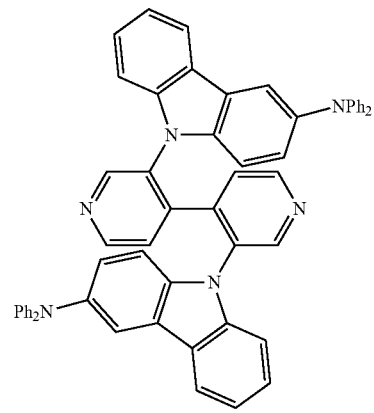
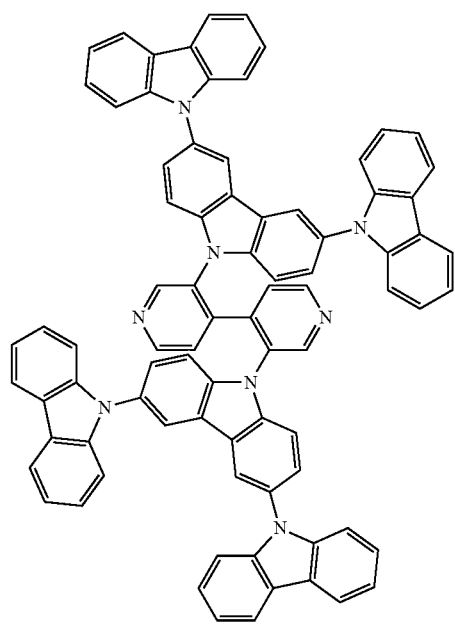 [SMILES: c1ccc2c(c1)c1ccccc1n2-c1ccc2c(c1)c1cc(-n3c4ccccc4c4ccccc43)ccc1n2-c1cnccc1-c1ccncc1-n1c2ccc(-n3c4ccccc4c4ccccc43)cc2c2cc(-n3c4ccccc4c4ccccc43)ccc21]
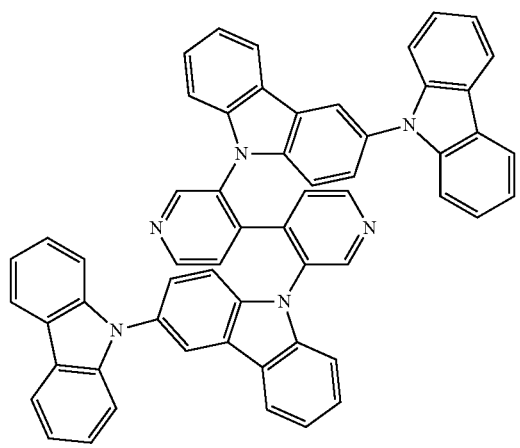 [SMILES: c1ccc2c(c1)c1ccccc1n2-c1ccc2c(c1)c1ccccc1n2-c1cnccc1-c1ccncc1-n1c2ccccc2c2cc(-n3c4ccccc4c4ccccc43)ccc21]

TABLE 2-continued
Examples of organic molecules according to the invention.
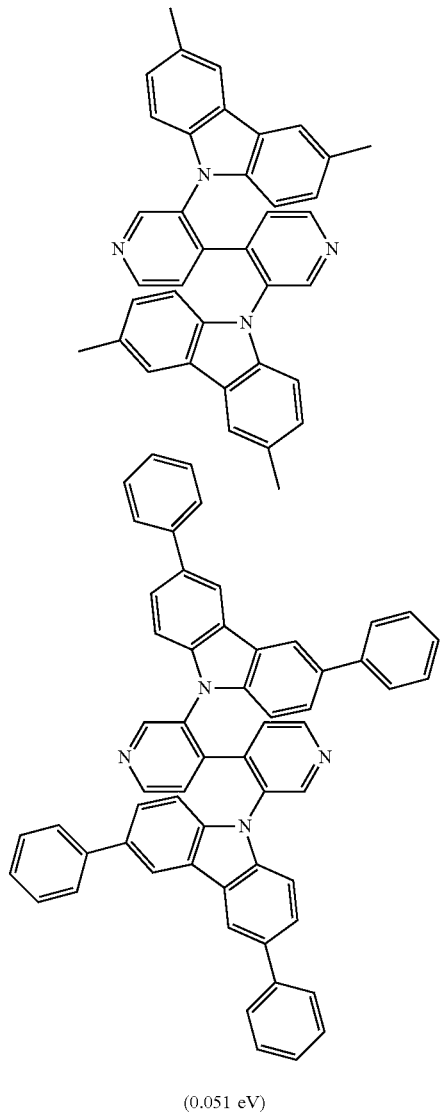
(0.051 eV)
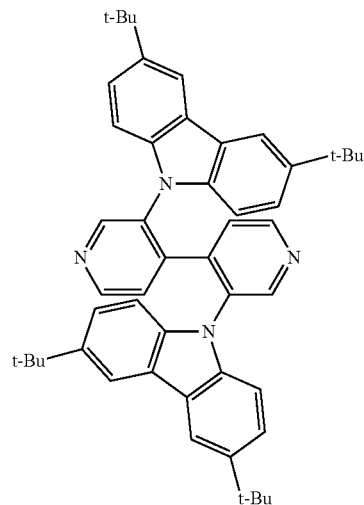 [SMILES: CC(C)(C)c1ccc2c(c1)c1cc(C(C)(C)C)ccc1n2-c1cnccc1-c1ccncc1-n1c2ccc(C(C)(C)C)cc2c2cc(C(C)(C)C)ccc21]

TABLE 2-continued
Examples of organic molecules according to the invention.
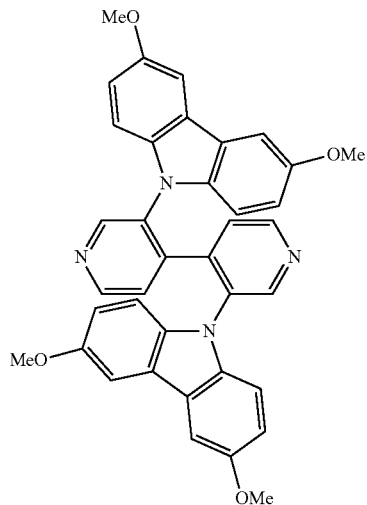
(0.033 eV)
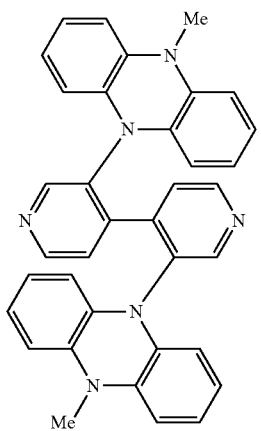 [SMILES: CN1c2ccccc2N(c2cnccc2-c2ccncc2N2c3ccccc3N(C)c3ccccc32)c2ccccc21]
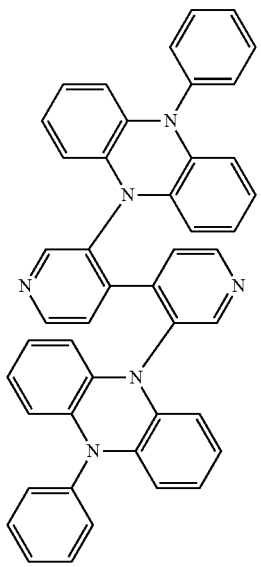 [SMILES: c1ccc(N2c3ccccc3N(c3cnccc3-c3ccncc3N3c4ccccc4N(c4ccccc4)c4ccccc43)c3ccccc32)cc1]

TABLE 2-continued
Examples of organic molecules according to the invention.
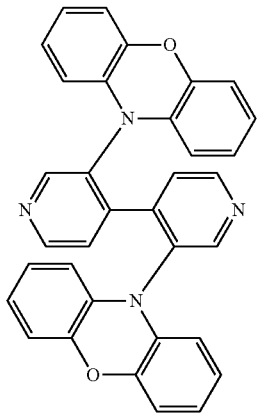
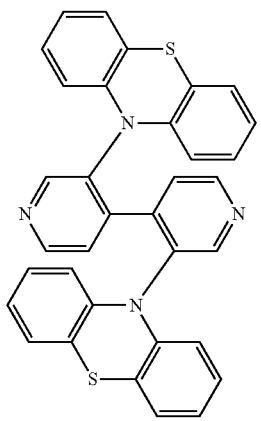 [SMILES: c1ccc2c(c1)Sc1ccccc1N2c1cnccc1-c1ccncc1N1c2ccccc2Sc2ccccc21]
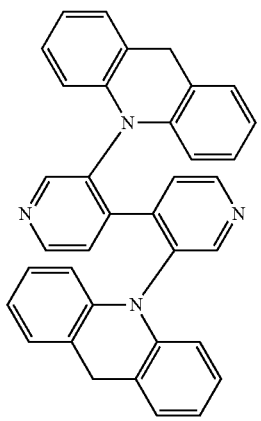 [SMILES: c1ccc2c(c1)Cc1ccccc1N2c1cnccc1-c1ccncc1N1c2ccccc2Cc2ccccc21]

TABLE 2-continued
Examples of organic molecules according to the invention.
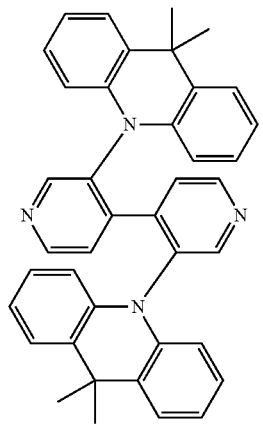 [SMILES: CC1(C)c2ccccc2N(c2cnccc2-c2ccncc2N2c3ccccc3C(C)(C)c3ccccc32)c2ccccc21]
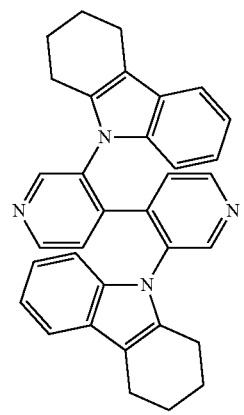 [SMILES: c1ccc2c(c1)c1c(n2-c2cnccc2-c2ccncc2-n2c3c(c4ccccc42)CCCC3)CCCC1]
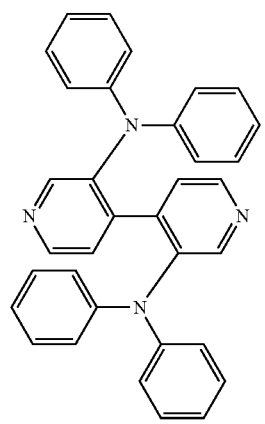 [SMILES: c1ccc(N(c2ccccc2)c2cnccc2-c2ccncc2N(c2ccccc2)c2ccccc2)cc1]

TABLE 2-continued
Examples of organic molecules according to the invention.
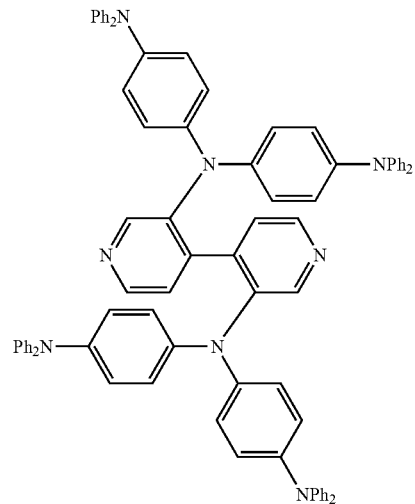
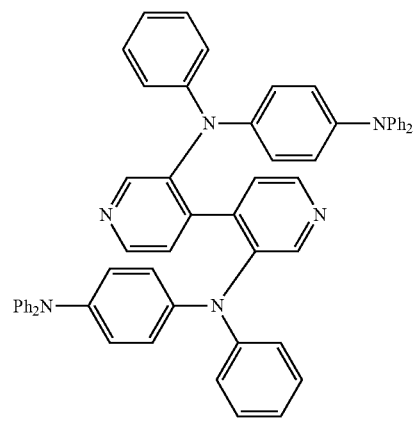
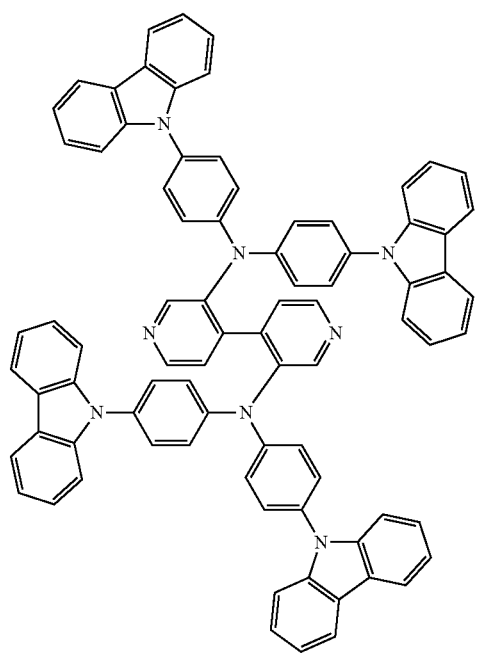 [SMILES: c1ccc2c(c1)c1ccccc1n2-c1ccc(N(c2ccc(-n3c4ccccc4c4ccccc43)cc2)c2cnccc2-c2ccncc2N(c2ccc(-n3c4ccccc4c4ccccc43)cc2)c2ccc(-n3c4ccccc4c4ccccc43)cc2)cc1]

TABLE 2-continued
Examples of organic molecules according to the invention.
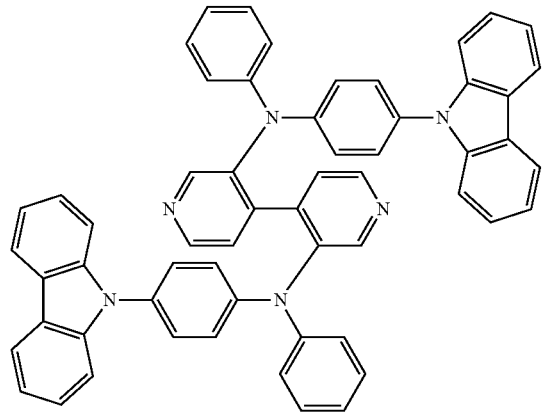 [SMILES: c1ccc(N(c2ccc(-n3c4ccccc4c4ccccc43)cc2)c2cnccc2-c2ccncc2N(c2ccccc2)c2ccc(-n3c4ccccc4c4ccccc43)cc2)cc1]
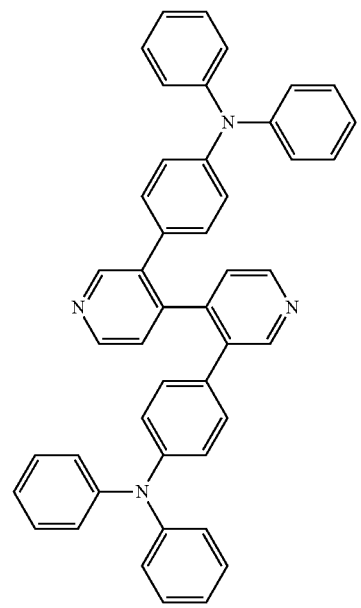 [SMILES: c1ccc(N(c2ccccc2)c2ccc(-c3cnccc3-c3ccncc3-c3ccc(N(c4ccccc4)c4ccccc4)cc3)cc2)cc1]
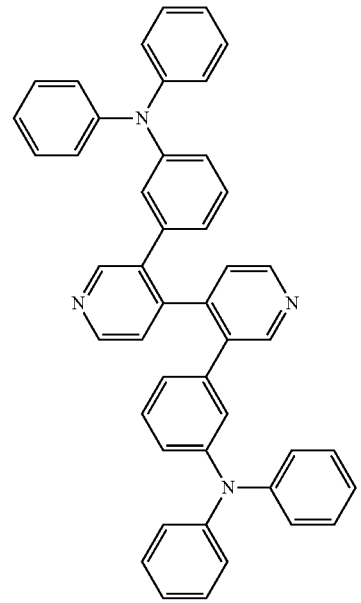 [SMILES: c1ccc(N(c2ccccc2)c2cccc(-c3cnccc3-c3ccncc3-c3cccc(N(c4ccccc4)c4ccccc4)c3)c2)cc1]

TABLE 2-continued
Examples of organic molecules according to the invention.
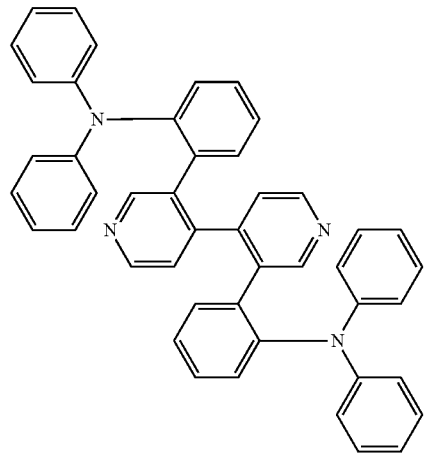 [SMILES: c1ccc(N(c2ccccc2)c2ccccc2-c2cnccc2-c2ccncc2-c2ccccc2N(c2ccccc2)c2ccccc2)cc1]
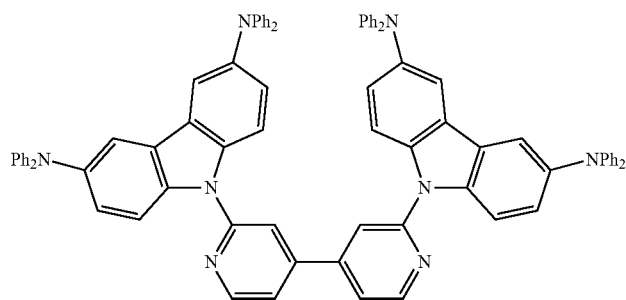
(0.093 eV)
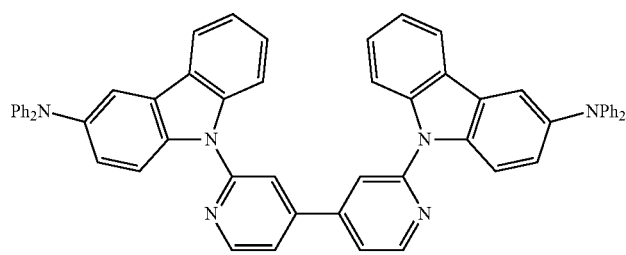

TABLE 2-continued
Examples of organic molecules according to the invention.
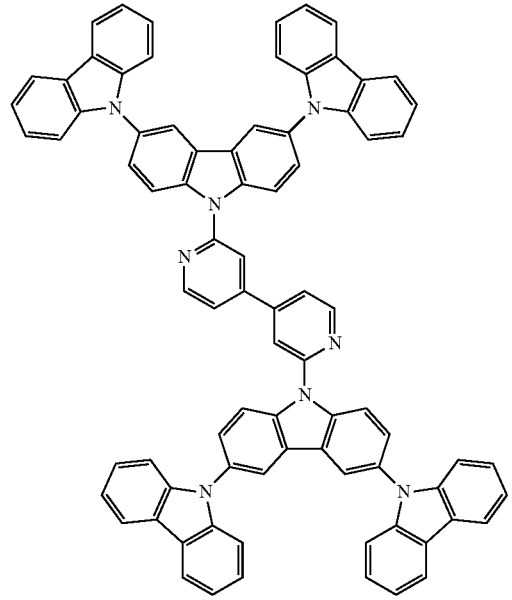 [SMILES: c1ccc2c(c1)c1ccccc1n2-c1ccc2c(c1)c1cc(-n3c4ccccc4c4ccccc43)ccc1n2-c1cc(-c2ccnc(-n3c4ccc(-n5c6ccccc6c6ccccc65)cc4c4cc(-n5c6ccccc6c6ccccc65)ccc43)c2)ccn1]
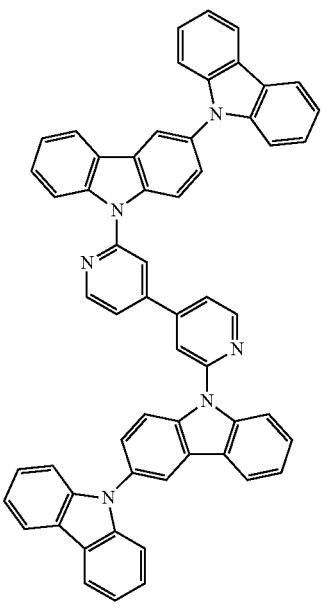 [SMILES: c1ccc2c(c1)c1ccccc1n2-c1ccc2c(c1)c1ccccc1n2-c1cc(-c2ccnc(-n3c4ccccc4c4cc(-n5c6ccccc6c6ccccc65)ccc43)c2)ccn1]
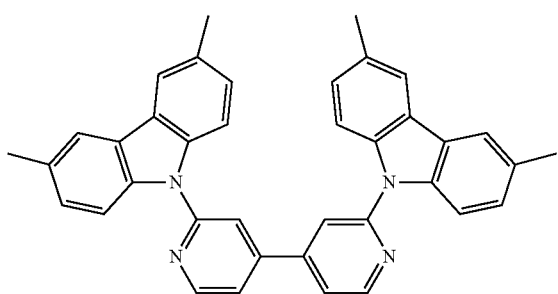

TABLE 2-continued
Examples of organic molecules according to the invention.
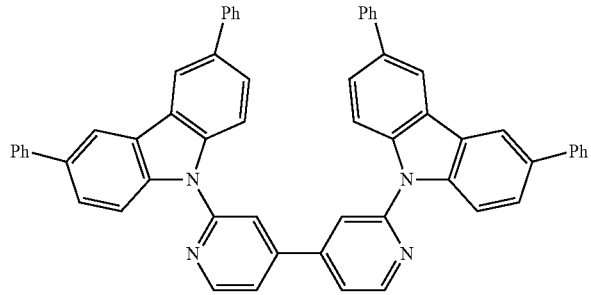 [SMILES: c1ccc(-c2ccc3c(c2)c2cc(-c4ccccc4)ccc2n3-c2cc(-c3ccnc(-n4c5ccc(-c6ccccc6)cc5c5cc(-c6ccccc6)ccc54)c3)ccn2)cc1]
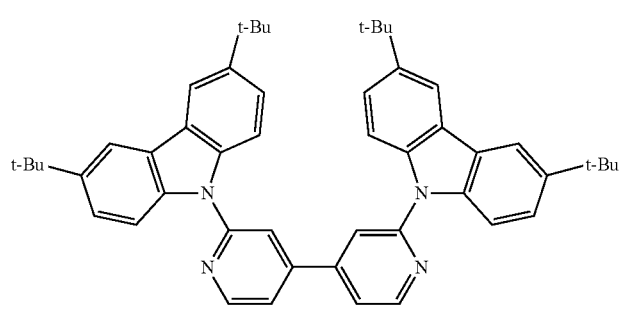 [SMILES: CC(C)(C)c1ccc2c(c1)c1cc(C(C)(C)C)ccc1n2-c1cc(-c2ccnc(-n3c4ccc(C(C)(C)C)cc4c4cc(C(C)(C)C)ccc43)c2)ccn1]
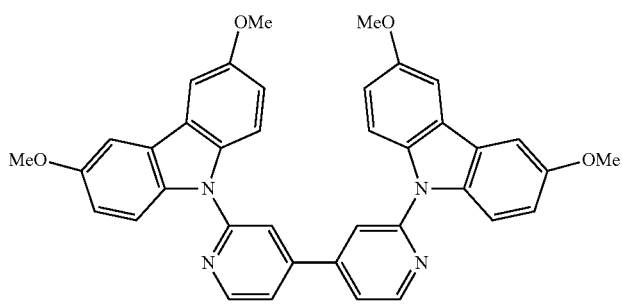 [SMILES: COc1ccc2c(c1)c1cc(OC)ccc1n2-c1cc(-c2ccnc(-n3c4ccc(OC)cc4c4cc(OC)ccc43)c2)ccn1]
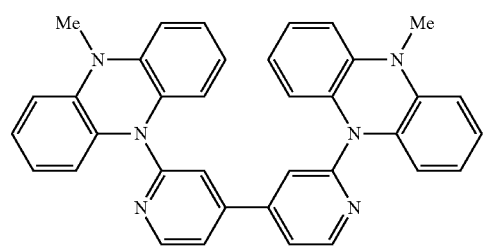 [SMILES: CN1c2ccccc2N(c2cc(-c3ccnc(N4c5ccccc5N(C)c5ccccc54)c3)ccn2)c2ccccc21]
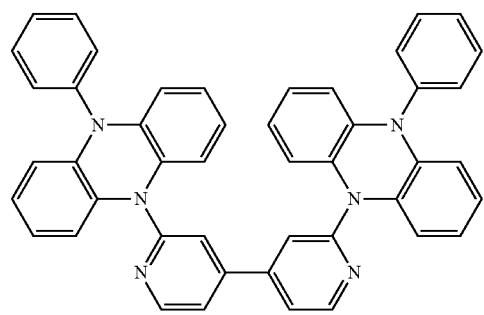 [SMILES: c1ccc(N2c3ccccc3N(c3cc(-c4ccnc(N5c6ccccc6N(c6ccccc6)c6ccccc65)c4)ccn3)c3ccccc32)cc1]

TABLE 2-continued
Examples of organic molecules according to the invention.
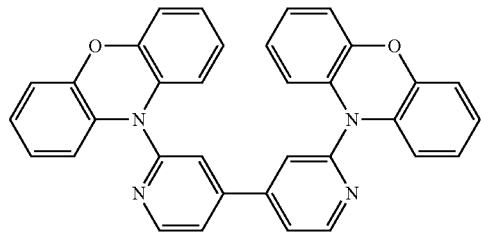 [SMILES: c1ccc2c(c1)Sc1ccccc1N2c1cc(-c2ccnc(N3c4ccccc4Sc4ccccc43)c2)ccn1]
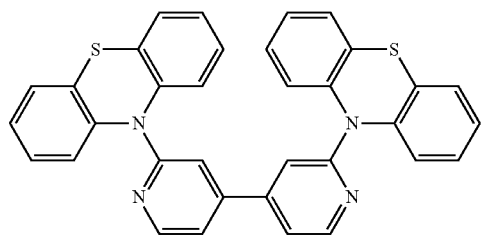
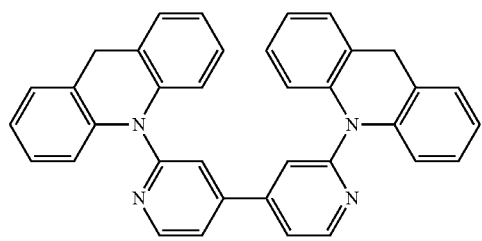 [SMILES: c1ccc2c(c1)Cc1ccccc1N2c1cc(-c2ccnc(N3c4ccccc4Cc4ccccc43)c2)ccn1]
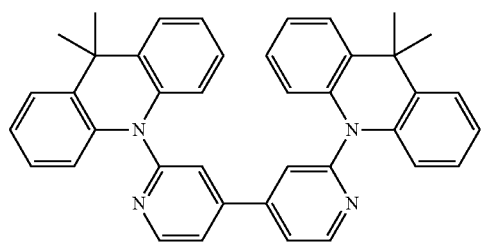 [SMILES: CC1(C)c2ccccc2N(c2cc(-c3ccnc(N4c5ccccc5C(C)(C)c5ccccc54)c3)ccn2)c2ccccc21]
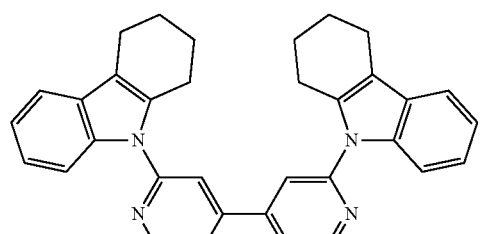
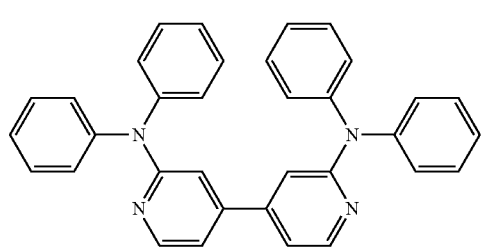 [SMILES: c1ccc(N(c2ccccc2)c2cc(-c3ccnc(N(c4ccccc4)c4ccccc4)c3)ccn2)cc1]

TABLE 2-continued
Examples of organic molecules according to the invention.
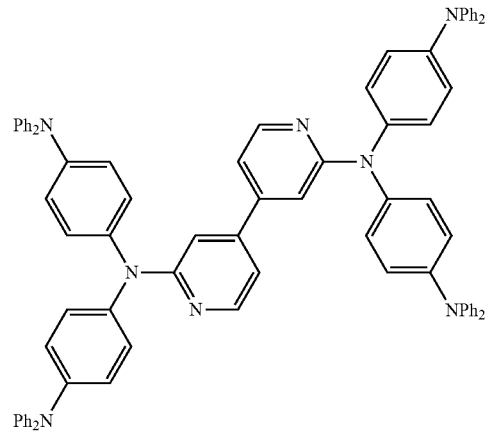
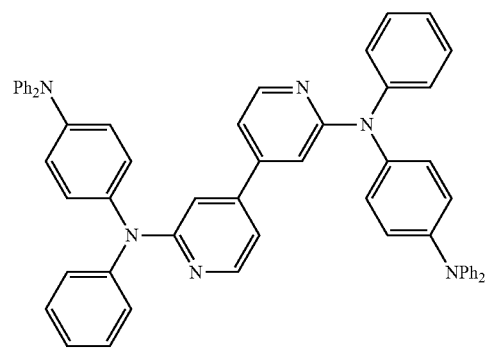
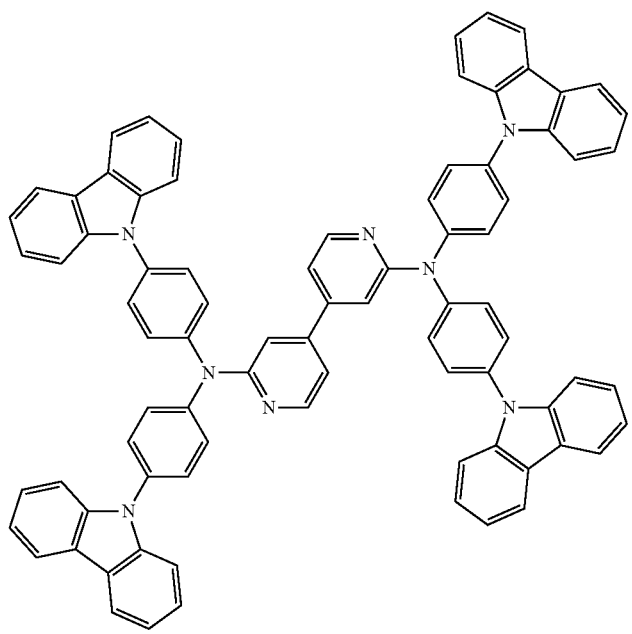 [SMILES: c1ccc2c(c1)c1ccccc1n2-c1ccc(N(c2ccc(-n3c4ccccc4c4ccccc43)cc2)c2cc(-c3ccnc(N(c4ccc(-n5c6ccccc6c6ccccc65)cc4)c4ccc(-n5c6ccccc6c6ccccc65)cc4)c3)ccn2)cc1]

TABLE 2-continued
Examples of organic molecules according to the invention.
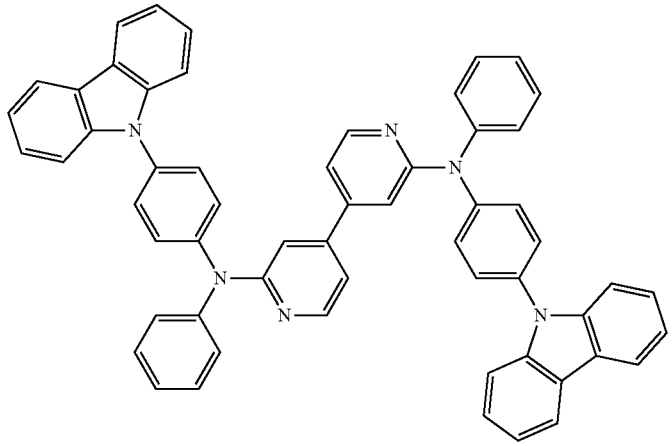 [SMILES: c1ccc(N(c2ccc(-n3c4ccccc4c4ccccc43)cc2)c2cc(-c3ccnc(N(c4ccccc4)c4ccc(-n5c6ccccc6c6ccccc65)cc4)c3)ccn2)cc1]
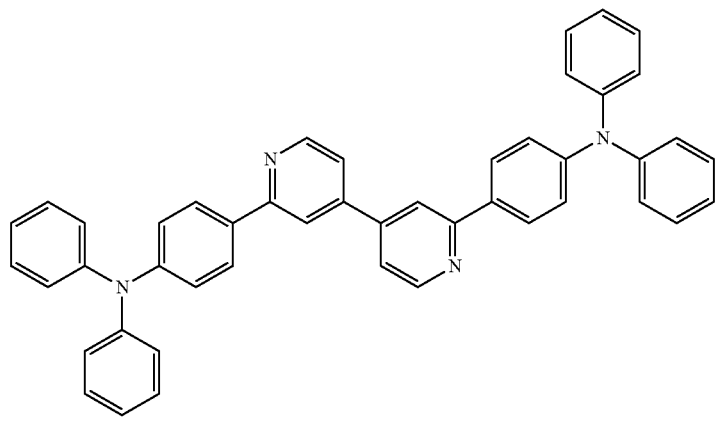 [SMILES: c1ccc(N(c2ccccc2)c2ccc(-c3cc(-c4ccnc(-c5ccc(N(c6ccccc6)c6ccccc6)cc5)c4)ccn3)cc2)cc1]
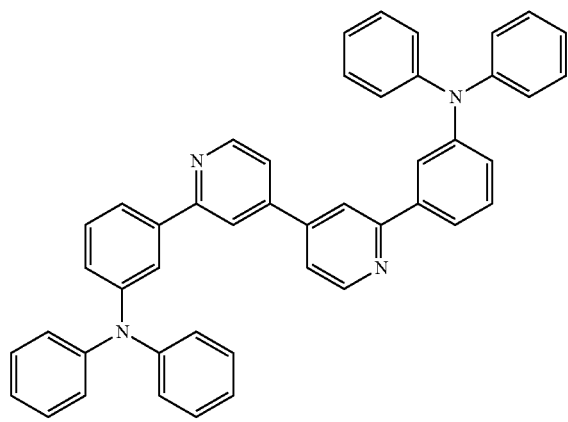 [SMILES: c1ccc(N(c2ccccc2)c2cccc(-c3cc(-c4ccnc(-c5cccc(N(c6ccccc6)c6ccccc6)c5)c4)ccn3)c2)cc1]
(0.215 eV)

TABLE 2-continued
Examples of organic molecules according to the invention.
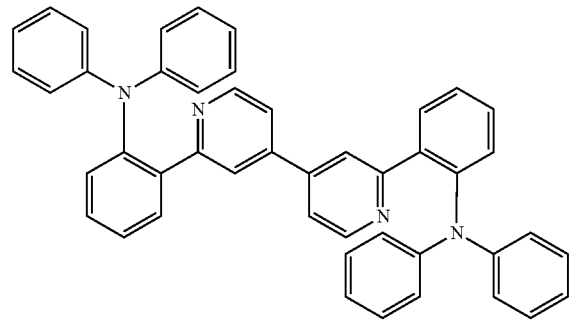 [SMILES: c1ccc(N(c2ccccc2)c2ccccc2-c2cc(-c3ccnc(-c4ccccc4N(c4ccccc4)c4ccccc4)c3)ccn2)cc1]
(0.099 eV)
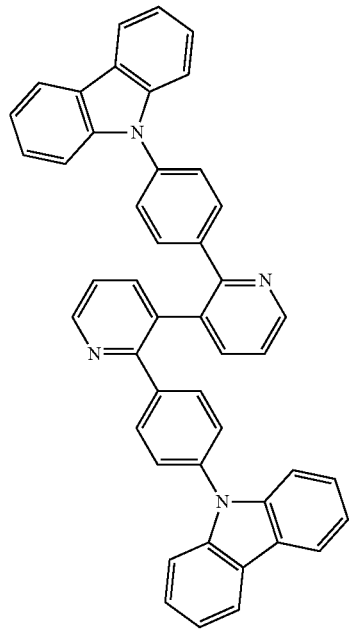 [SMILES: c1cnc(-c2ccc(-n3c4ccccc4c4ccccc43)cc2)c(-c2cccnc2-c2ccc(-n3c4ccccc4c4ccccc43)cc2)c1]
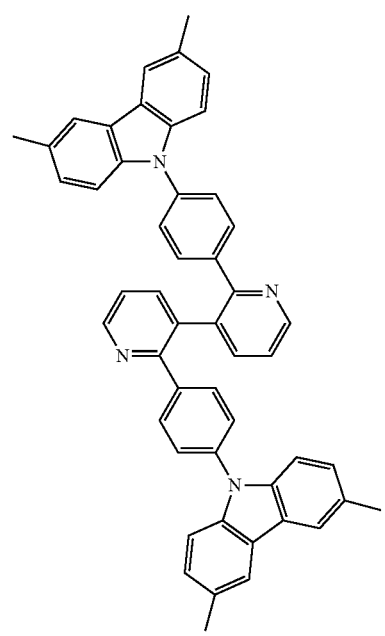

TABLE 2-continued
Examples of organic molecules according to the invention.
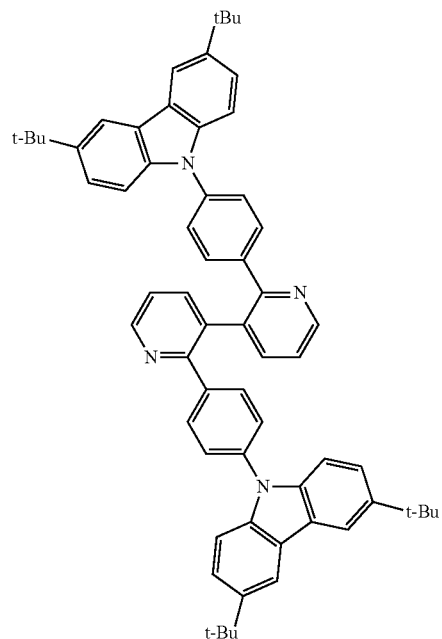 [SMILES: CC(C)(C)c1ccc2c(c1)c1cc(C(C)(C)C)ccc1n2-c1ccc(-c2ncccc2-c2cccnc2-c2ccc(-n3c4ccc(C(C)(C)C)cc4c4cc(C(C)(C)C)ccc43)cc2)cc1]
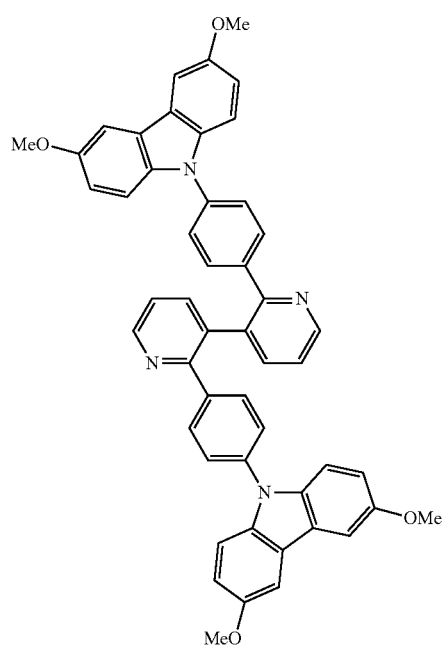 [SMILES: COc1ccc2c(c1)c1cc(OC)ccc1n2-c1ccc(-c2ncccc2-c2cccnc2-c2ccc(-n3c4ccc(OC)cc4c4cc(OC)ccc43)cc2)cc1]

TABLE 2-continued
Examples of organic molecules according to the invention.
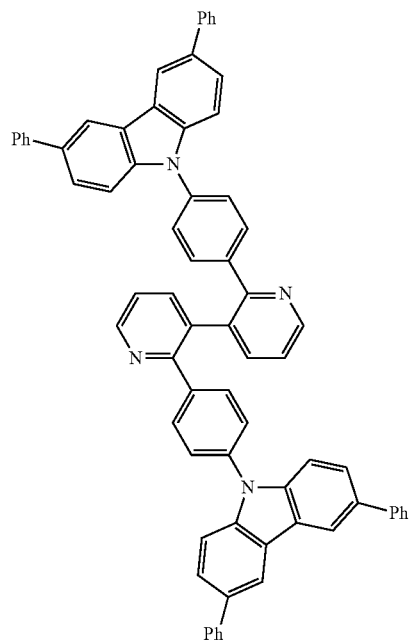 [SMILES: c1ccc(-c2ccc3c(c2)c2cc(-c4ccccc4)ccc2n3-c2ccc(-c3ncccc3-c3cccnc3-c3ccc(-n4c5ccc(-c6ccccc6)cc5c5cc(-c6ccccc6)ccc54)cc3)cc2)cc1]
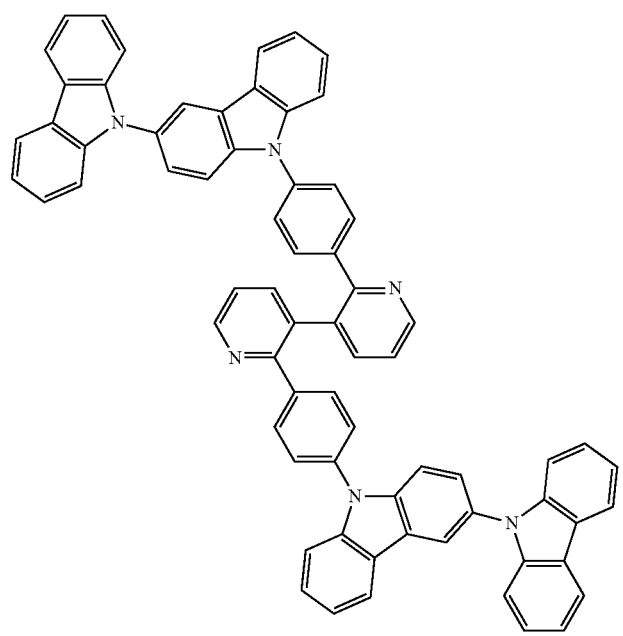

TABLE 2-continued
Examples of organic molecules according to the invention.
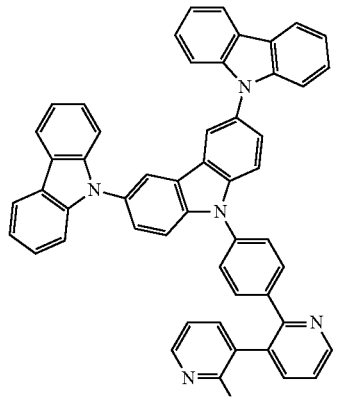
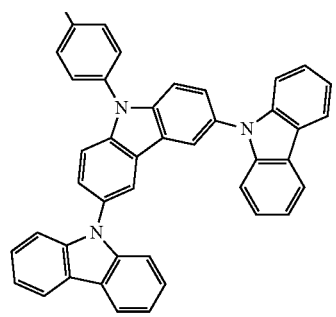
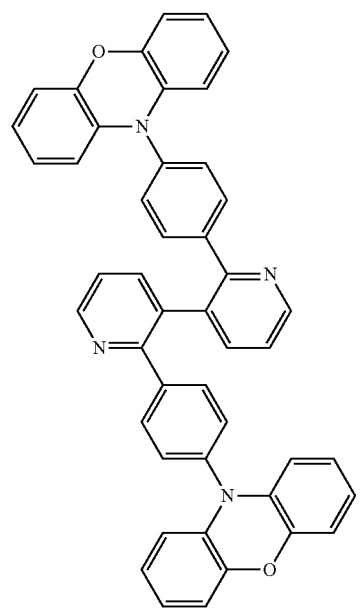
(0.067 eV)

TABLE 2-continued
Examples of organic molecules according to the invention.
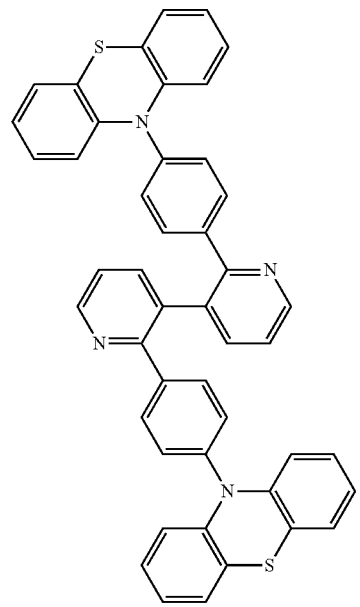 [SMILES: c1ccc2c(c1)Cc1ccccc1N2c1ccc(-c2ncccc2-c2cccnc2-c2ccc(N3c4ccccc4Cc4ccccc43)cc2)cc1]
(0.014 eV)
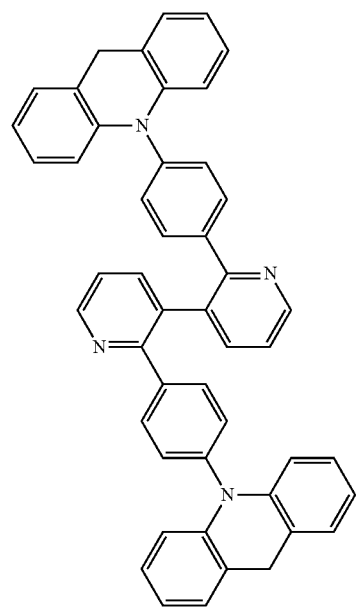

TABLE 2-continued
Examples of organic molecules according to the invention.
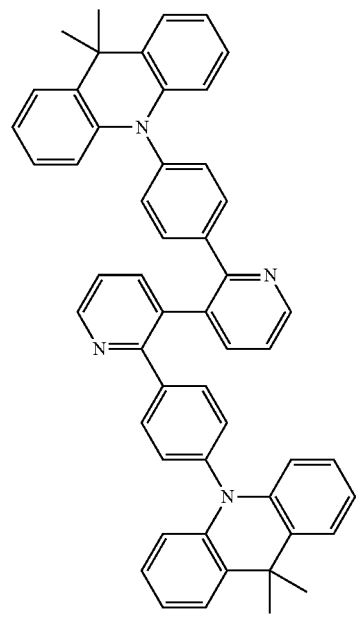 [SMILES: CC1(C)c2ccccc2N(c2ccc(-c3ncccc3-c3cccnc3-c3ccc(N4c5ccccc5C(C)(C)c5ccccc54)cc3)cc2)c2ccccc21]
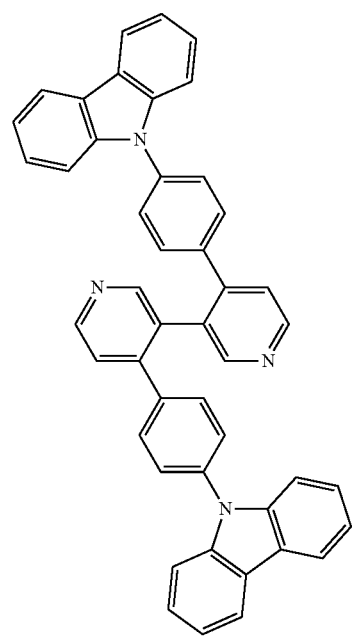 [SMILES: c1ccc2c(c1)c1ccccc1n2-c1ccc(-c2ccncc2-c2cnccc2-c2ccc(-n3c4ccccc4c4ccccc43)cc2)cc1]

TABLE 2-continued
Examples of organic molecules according to the invention.
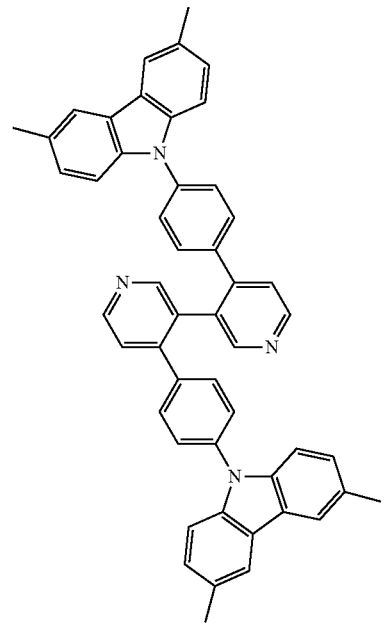
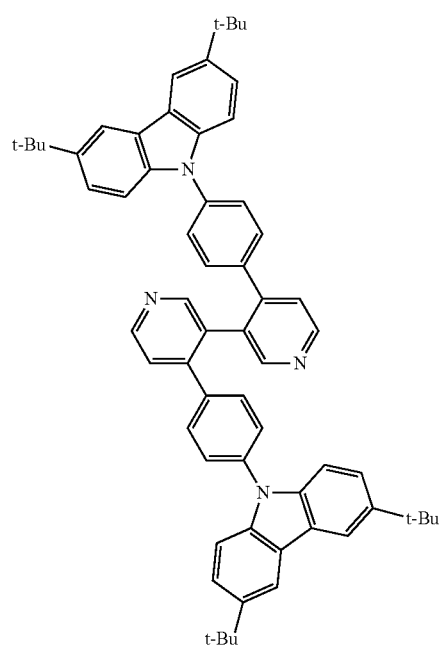 [SMILES: CC(C)(C)c1ccc2c(c1)c1cc(C(C)(C)C)ccc1n2-c1ccc(-c2ccncc2-c2cnccc2-c2ccc(-n3c4ccc(C(C)(C)C)cc4c4cc(C(C)(C)C)ccc43)cc2)cc1]

TABLE 2-continued
Examples of organic molecules according to the invention.
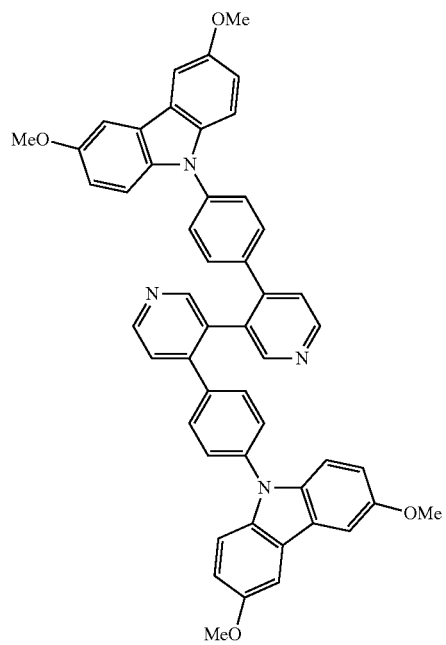 [SMILES: COc1ccc2c(c1)c1cc(OC)ccc1n2-c1ccc(-c2ccncc2-c2cnccc2-c2ccc(-n3c4ccc(OC)cc4c4cc(OC)ccc43)cc2)cc1]
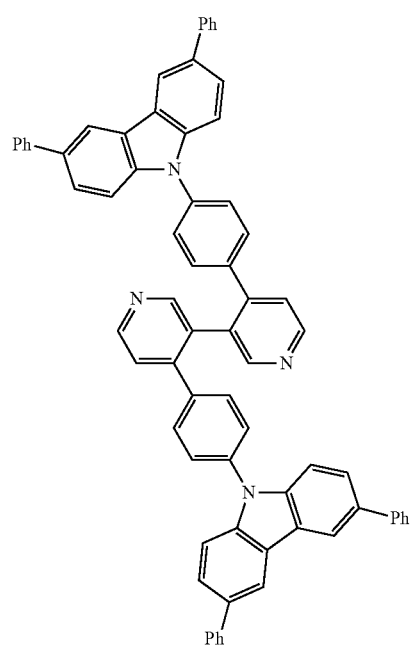

TABLE 2-continued
Examples of organic molecules according to the invention.
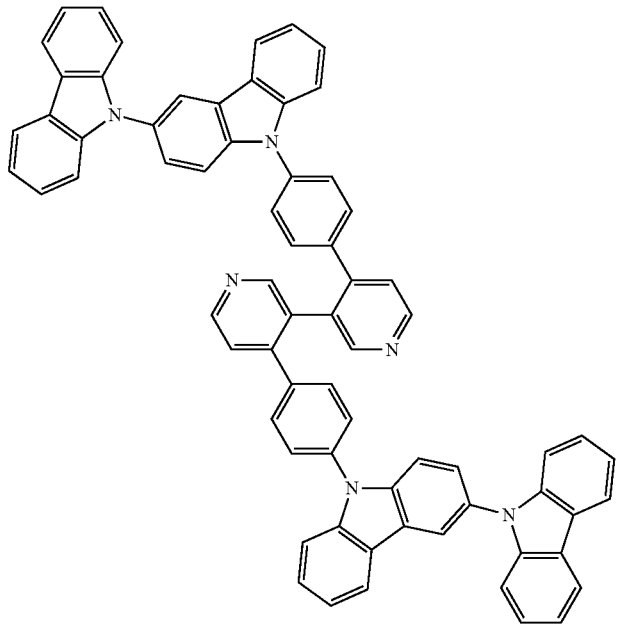 [SMILES: c1ccc2c(c1)c1ccccc1n2-c1ccc2c(c1)c1ccccc1n2-c1ccc(-c2ccncc2-c2cnccc2-c2ccc(-n3c4ccccc4c4cc(-n5c6ccccc6c6ccccc65)ccc43)cc2)cc1]
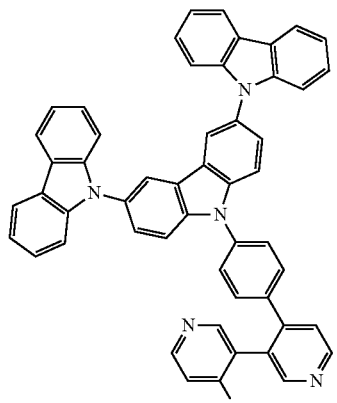
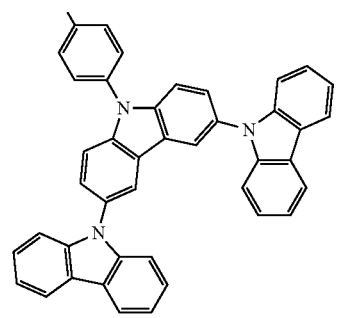

TABLE 2-continued
Examples of organic molecules according to the invention.
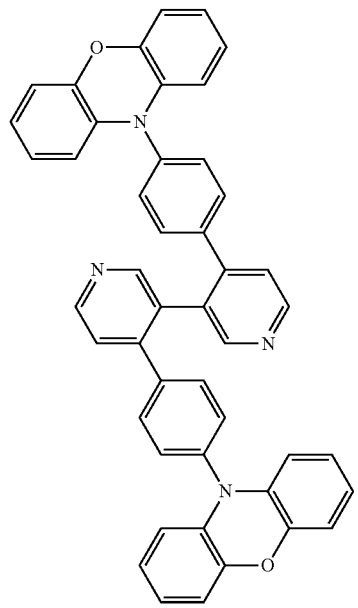 [SMILES: c1ccc2c(c1)Sc1ccccc1N2c1ccc(-c2ccncc2-c2cnccc2-c2ccc(N3c4ccccc4Sc4ccccc43)cc2)cc1]
(0.036 eV)
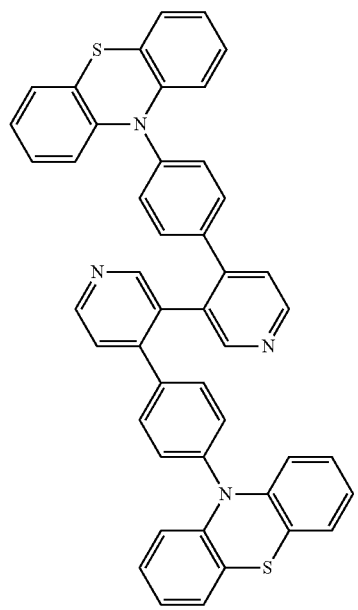 [SMILES: c1ccc2c(c1)Cc1ccccc1N2c1ccc(-c2ccncc2-c2cnccc2-c2ccc(N3c4ccccc4Cc4ccccc43)cc2)cc1]

TABLE 2-continued
Examples of organic molecules according to the invention.
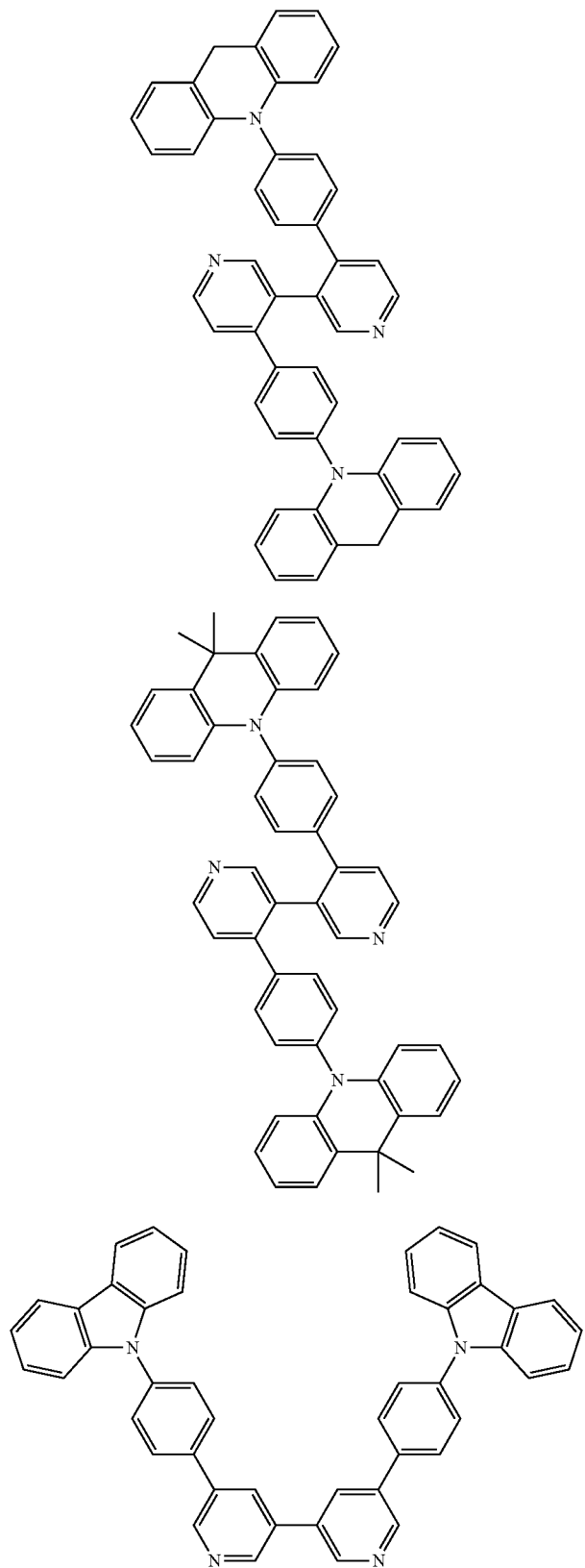

TABLE 2-continued
Examples of organic molecules according to the invention.
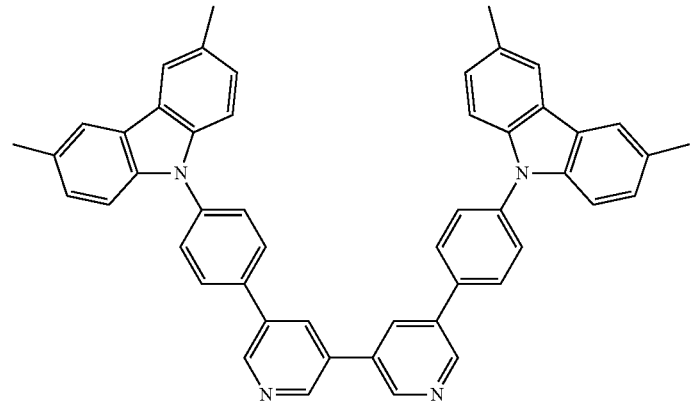
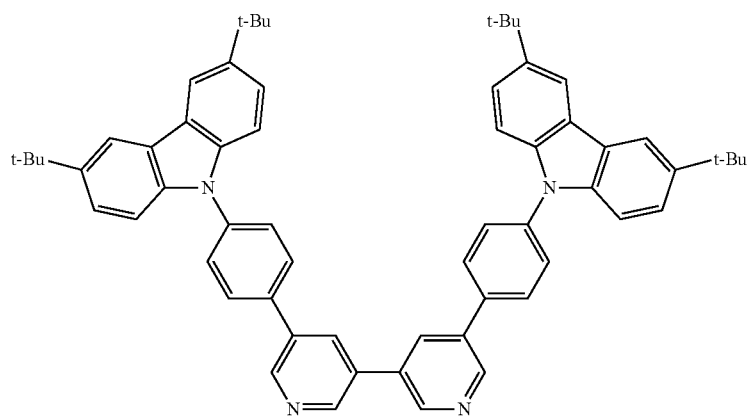 [SMILES: CC(C)(C)c1ccc2c(c1)c1cc(C(C)(C)C)ccc1n2-c1ccc(-c2cncc(-c3cncc(-c4ccc(-n5c6ccc(C(C)(C)C)cc6c6cc(C(C)(C)C)ccc65)cc4)c3)c2)cc1]
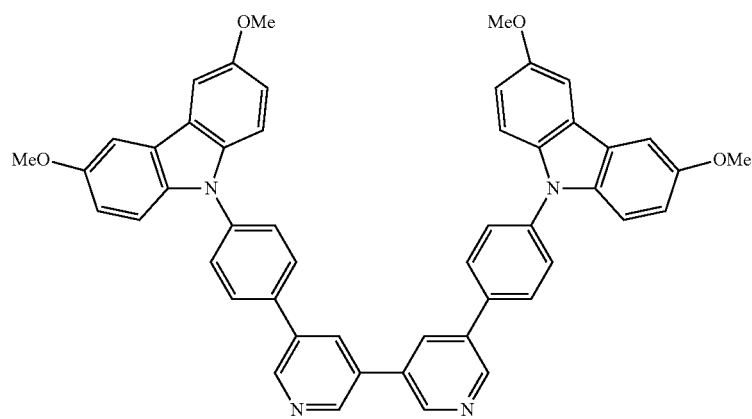 [SMILES: COc1ccc2c(c1)c1cc(OC)ccc1n2-c1ccc(-c2cncc(-c3cncc(-c4ccc(-n5c6ccc(OC)cc6c6cc(OC)ccc65)cc4)c3)c2)cc1]

TABLE 2-continued
Examples of organic molecules according to the invention.
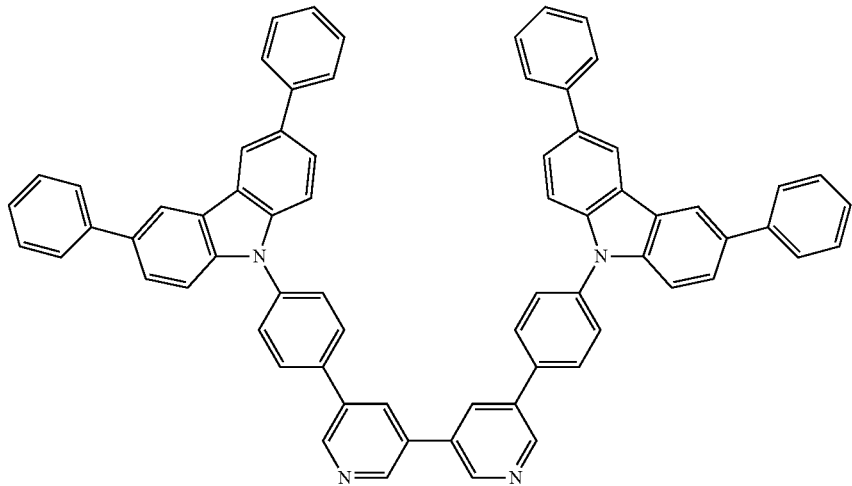 [SMILES: c1ccc(-c2ccc3c(c2)c2cc(-c4ccccc4)ccc2n3-c2ccc(-c3cncc(-c4cncc(-c5ccc(-n6c7ccc(-c8ccccc8)cc7c7cc(-c8ccccc8)ccc76)cc5)c4)c3)cc2)cc1]
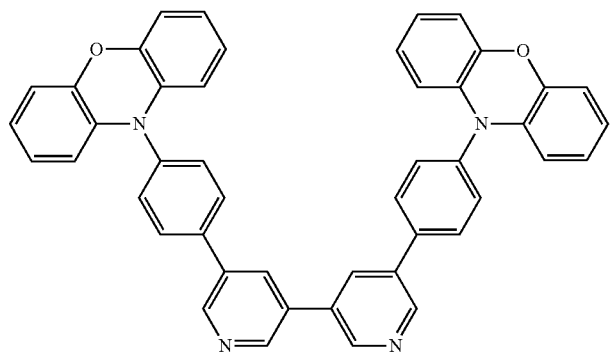
(0.008 eV)
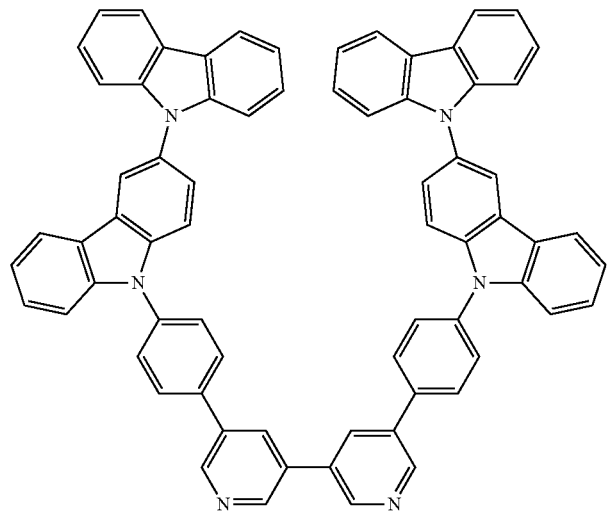 [SMILES: c1ccc2c(c1)c1ccccc1n2-c1ccc2c(c1)c1ccccc1n2-c1ccc(-c2cncc(-c3cncc(-c4ccc(-n5c6ccccc6c6cc(-n7c8ccccc8c8ccccc87)ccc65)cc4)c3)c2)cc1]

TABLE 2-continued
Examples of organic molecules according to the invention.
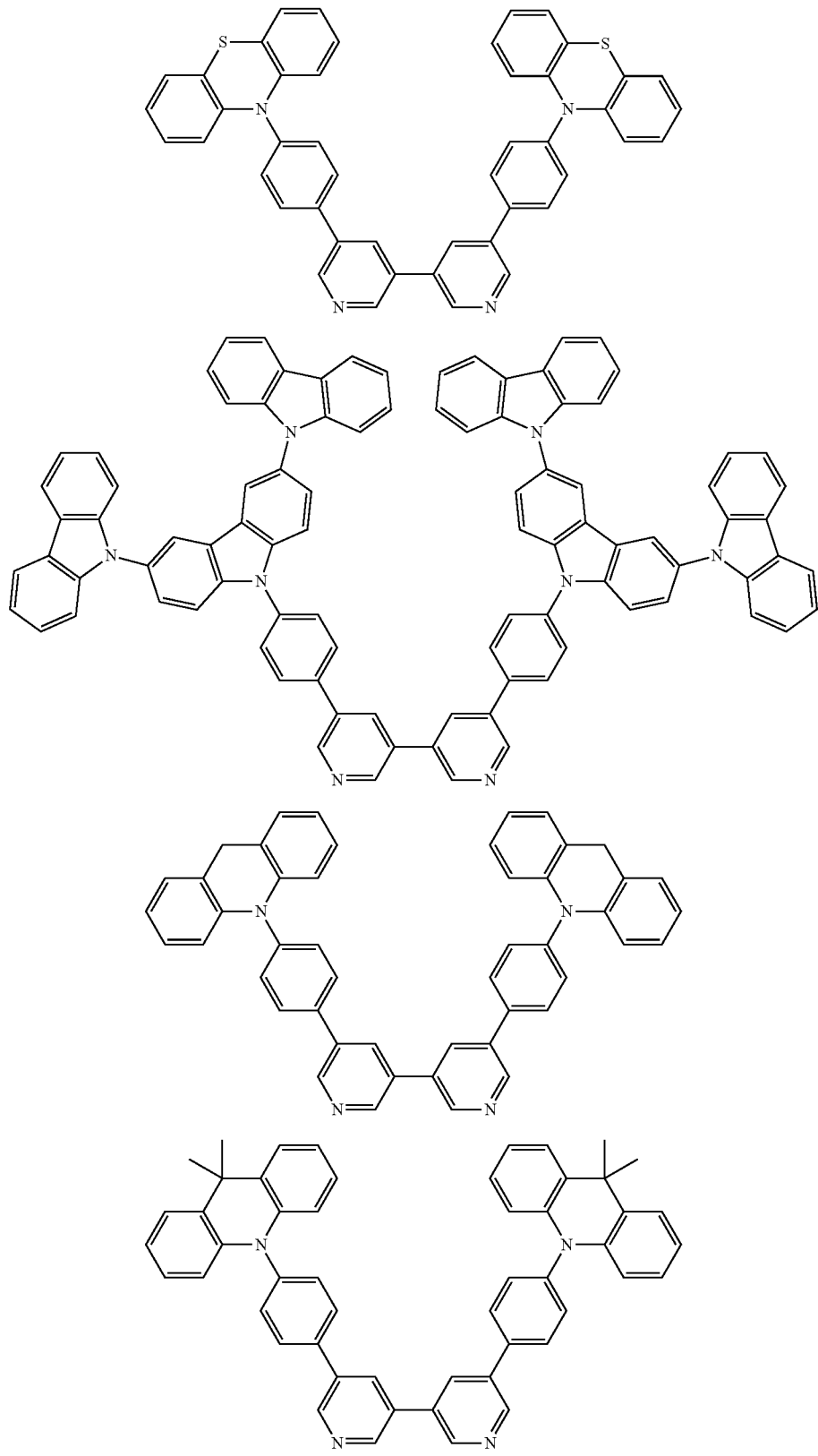
(0.008 eV)

TABLE 2-continued
Examples of organic molecules according to the invention.
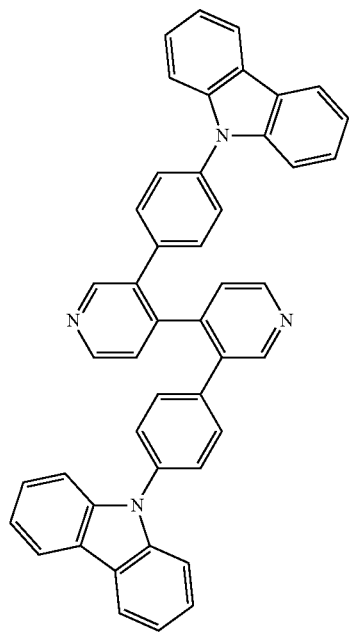 [SMILES: c1ccc2c(c1)c1ccccc1n2-c1ccc(-c2cnccc2-c2ccncc2-c2ccc(-n3c4ccccc4c4ccccc43)cc2)cc1]
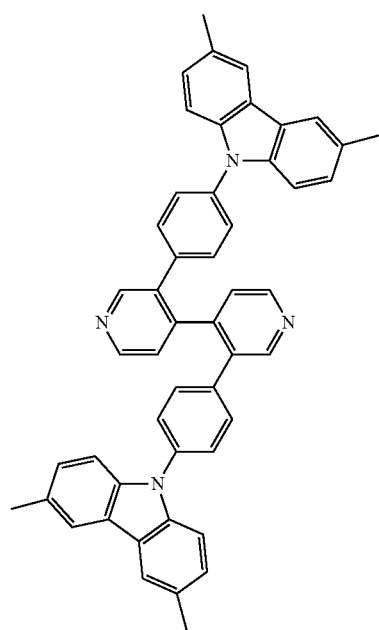

TABLE 2-continued
Examples of organic molecules according to the invention.
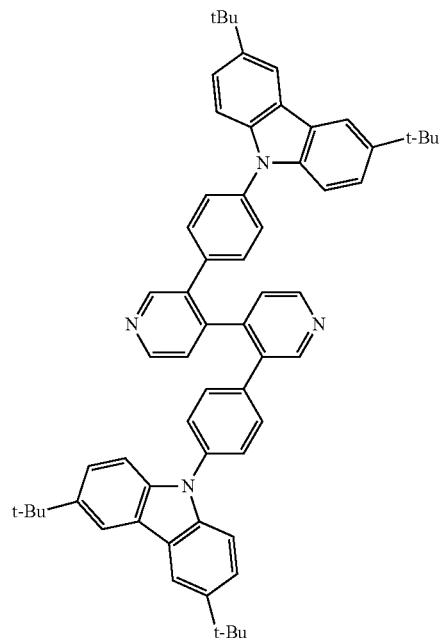 [SMILES: CC(C)(C)c1ccc2c(c1)c1cc(C(C)(C)C)ccc1n2-c1ccc(-c2cnccc2-c2ccncc2-c2ccc(-n3c4ccc(C(C)(C)C)cc4c4cc(C(C)(C)C)ccc43)cc2)cc1]
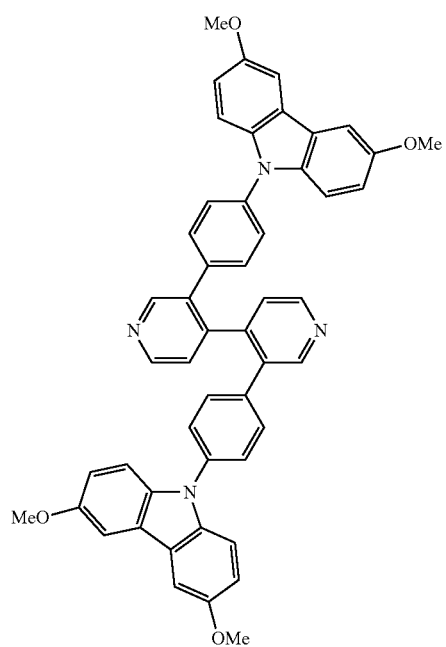 [SMILES: COc1ccc2c(c1)c1cc(OC)ccc1n2-c1ccc(-c2cnccc2-c2ccncc2-c2ccc(-n3c4ccc(OC)cc4c4cc(OC)ccc43)cc2)cc1]

TABLE 2-continued
Examples of organic molecules according to the invention.
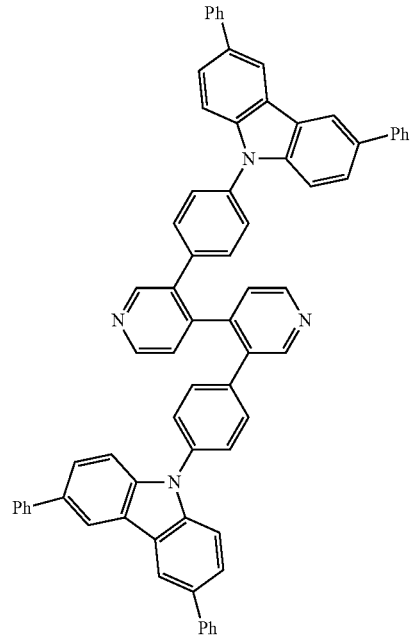 [SMILES: c1ccc(-c2ccc3c(c2)c2cc(-c4ccccc4)ccc2n3-c2ccc(-c3cnccc3-c3ccncc3-c3ccc(-n4c5ccc(-c6ccccc6)cc5c5cc(-c6ccccc6)ccc54)cc3)cc2)cc1]
(0.239 eV)
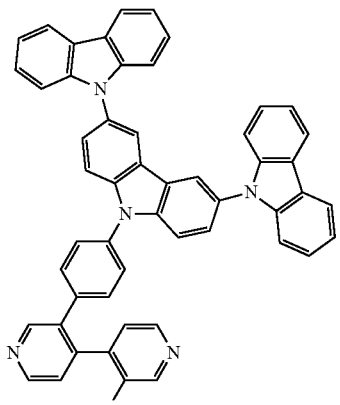
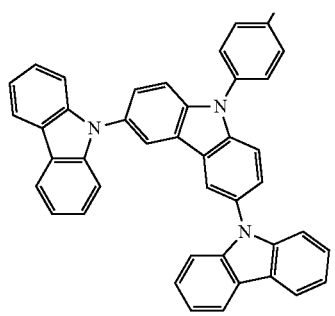

TABLE 2-continued
Examples of organic molecules according to the invention.
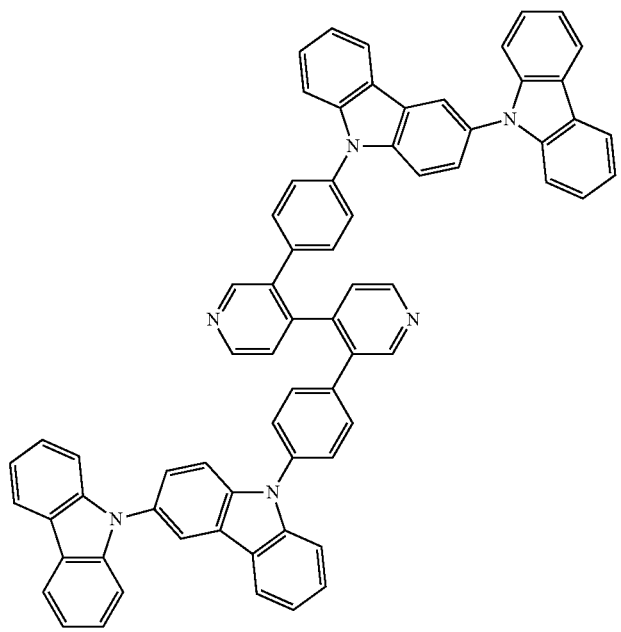 [SMILES: c1ccc2c(c1)c1ccccc1n2-c1ccc2c(c1)c1ccccc1n2-c1ccc(-c2cnccc2-c2ccncc2-c2ccc(-n3c4ccccc4c4cc(-n5c6ccccc6c6ccccc65)ccc43)cc2)cc1]
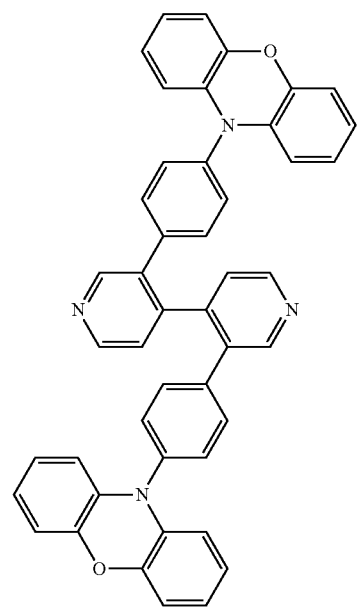
(0.016 eV)

TABLE 2-continued
Examples of organic molecules according to the invention.
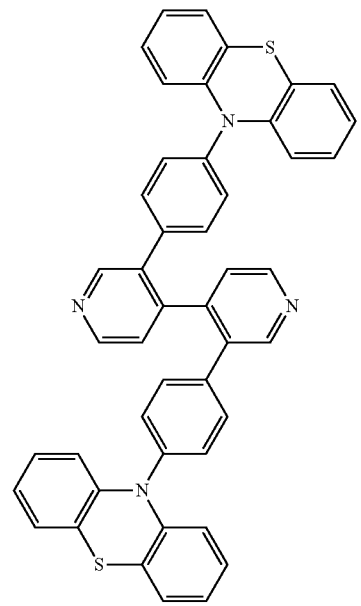 [SMILES: c1ccc2c(c1)Sc1ccccc1N2c1ccc(-c2cnccc2-c2ccncc2-c2ccc(N3c4ccccc4Sc4ccccc43)cc2)cc1]
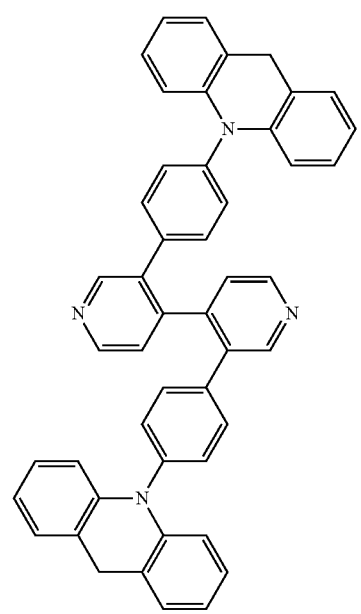

TABLE 2-continued
Examples of organic molecules according to the invention.
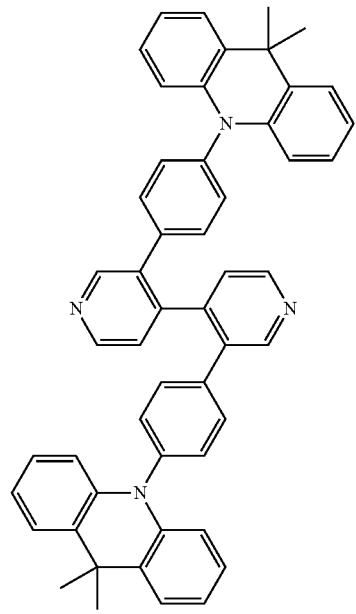 [SMILES: CC1(C)c2ccccc2N(c2ccc(-c3cnccc3-c3ccncc3-c3ccc(N4c5ccccc5C(C)(C)c5ccccc54)cc3)cc2)c2ccccc21]
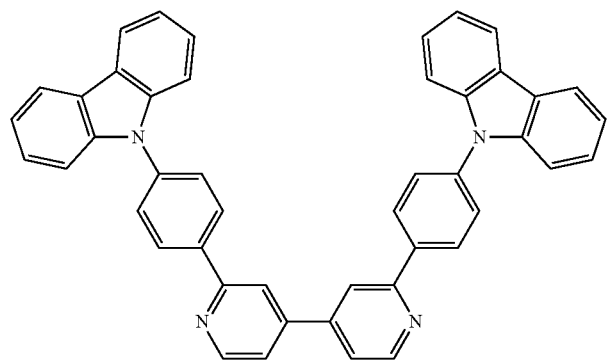 [SMILES: c1ccc2c(c1)c1ccccc1n2-c1ccc(-c2cc(-c3ccnc(-c4ccc(-n5c6ccccc6c6ccccc65)cc4)c3)ccn2)cc1]
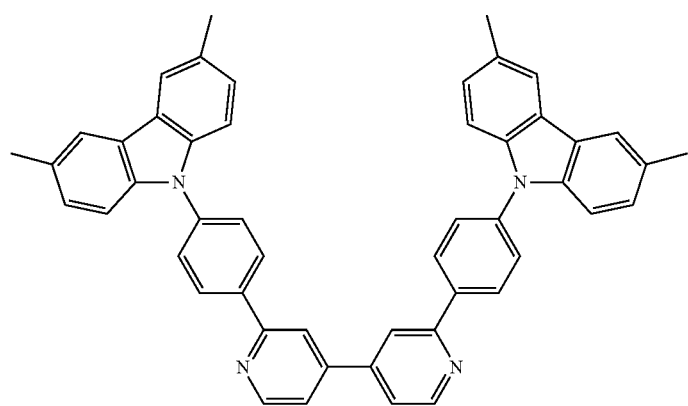

TABLE 2-continued
Examples of organic molecules according to the invention.
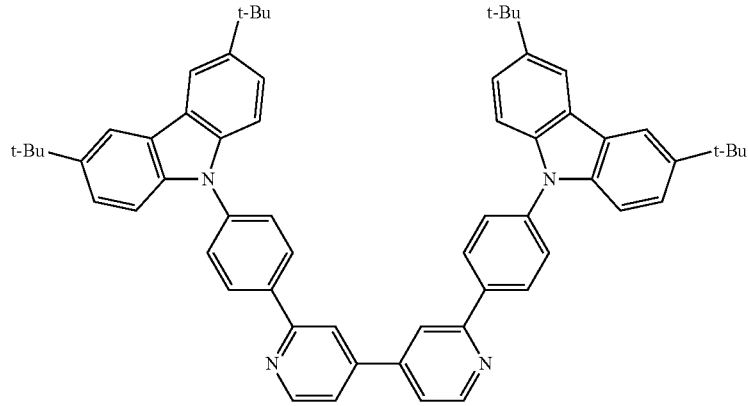 [SMILES: CC(C)(C)c1ccc2c(c1)c1cc(C(C)(C)C)ccc1n2-c1ccc(-c2cc(-c3ccnc(-c4ccc(-n5c6ccc(C(C)(C)C)cc6c6cc(C(C)(C)C)ccc65)cc4)c3)ccn2)cc1]
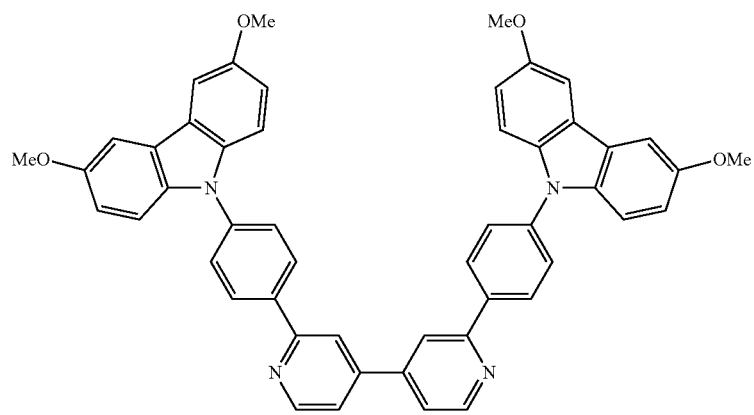 [SMILES: COc1ccc2c(c1)c1cc(OC)ccc1n2-c1ccc(-c2cc(-c3ccnc(-c4ccc(-n5c6ccc(OC)cc6c6cc(OC)ccc65)cc4)c3)ccn2)cc1]
(0.217 eV)
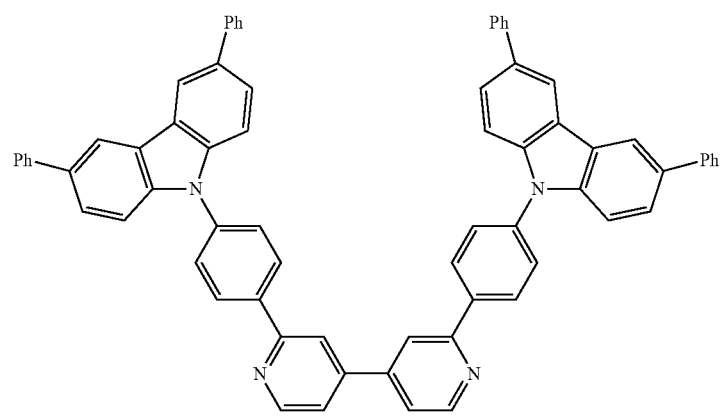 [SMILES: c1ccc(-c2ccc3c(c2)c2cc(-c4ccccc4)ccc2n3-c2ccc(-c3cc(-c4ccnc(-c5ccc(-n6c7ccc(-c8ccccc8)cc7c7cc(-c8ccccc8)ccc76)cc5)c4)ccn3)cc2)cc1]
(0.295 eV)

TABLE 2-continued
Examples of organic molecules according to the invention.
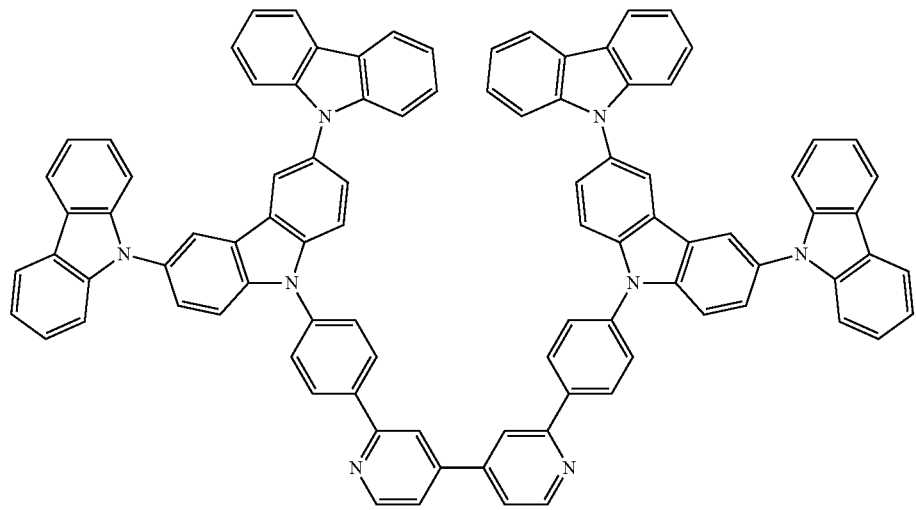 [SMILES: c1ccc2c(c1)c1ccccc1n2-c1ccc2c(c1)c1cc(-n3c4ccccc4c4ccccc43)ccc1n2-c1ccc(-c2cc(-c3ccnc(-c4ccc(-n5c6ccc(-n7c8ccccc8c8ccccc87)cc6c6cc(-n7c8ccccc8c8ccccc87)ccc65)cc4)c3)ccn2)cc1]
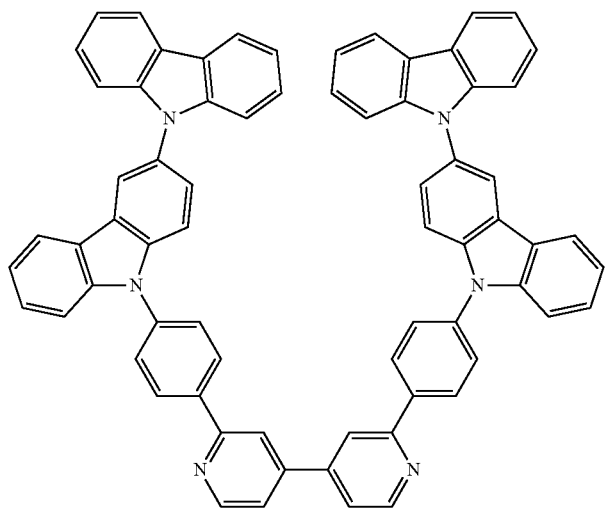 [SMILES: c1ccc2c(c1)c1ccccc1n2-c1ccc2c(c1)c1ccccc1n2-c1ccc(-c2cc(-c3ccnc(-c4ccc(-n5c6ccccc6c6cc(-n7c8ccccc8c8ccccc87)ccc65)cc4)c3)ccn2)cc1]
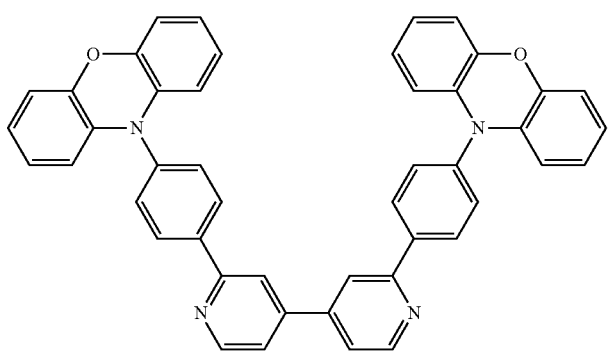 [SMILES: c1ccc2c(c1)Cc1ccccc1N2c1ccc(-c2cc(-c3ccnc(-c4ccc(N5c6ccccc6Cc6ccccc65)cc4)c3)ccn2)cc1]

TABLE 2-continued
Examples of organic molecules according to the invention.
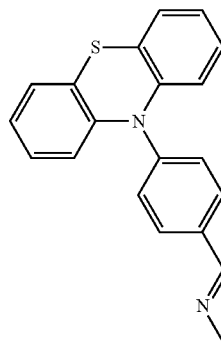
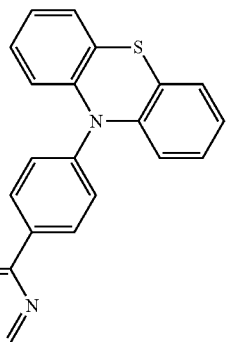
(0.013 eV)
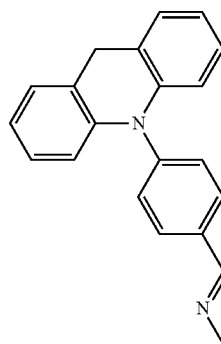
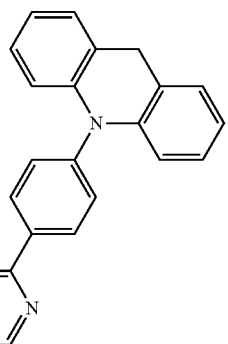
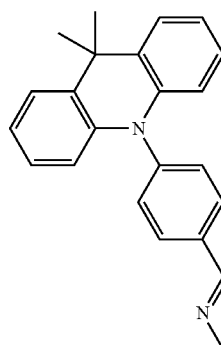
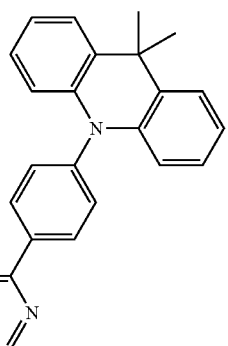
(0.005 eV)
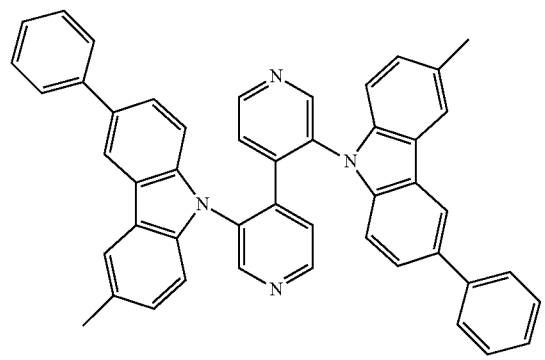 [SMILES: Cc1ccc2c(c1)c1cc(-c3ccccc3)ccc1n2-c1cnccc1-c1ccncc1-n1c2ccc(C)cc2c2cc(-c3ccccc3)ccc21]
(0.043 eV)

TABLE 2-continued
Examples of organic molecules according to the invention.
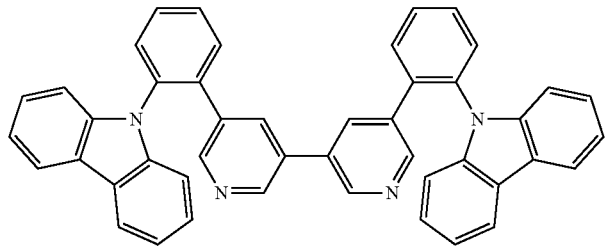 [SMILES: c1ccc(-n2c3ccccc3c3ccccc32)c(-c2cncc(-c3cncc(-c4ccccc4-n4c5ccccc5c5ccccc54)c3)c2)c1]
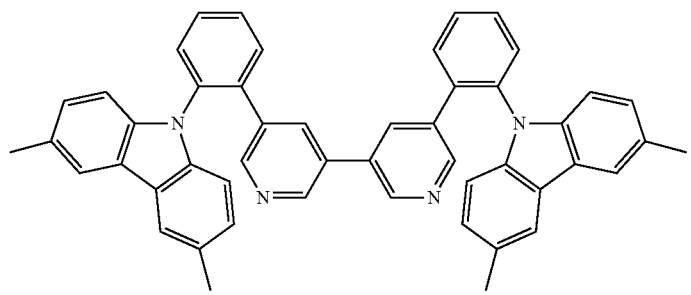
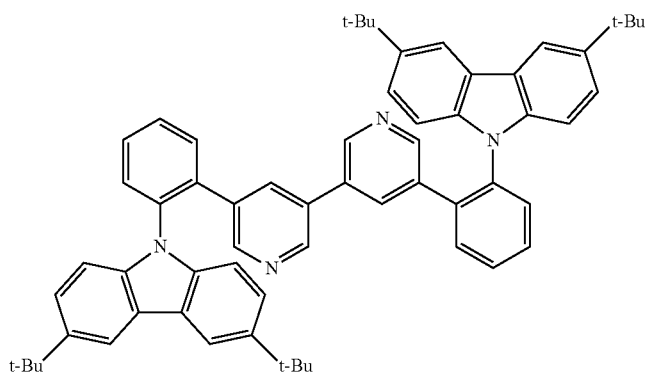 [SMILES: CC(C)(C)c1ccc2c(c1)c1cc(C(C)(C)C)ccc1n2-c1ccccc1-c1cncc(-c2cncc(-c3ccccc3-n3c4ccc(C(C)(C)C)cc4c4cc(C(C)(C)C)ccc43)c2)c1]
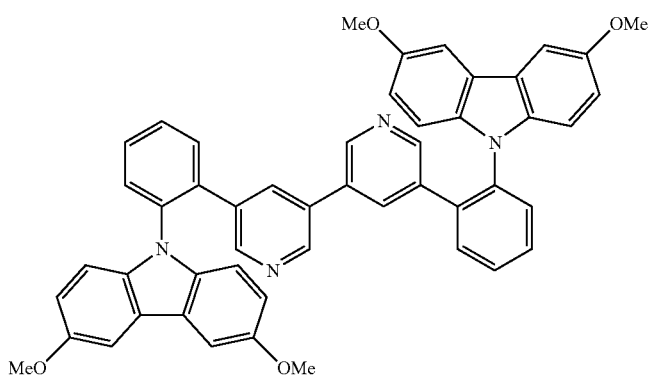 [SMILES: COc1ccc2c(c1)c1cc(OC)ccc1n2-c1ccccc1-c1cncc(-c2cncc(-c3ccccc3-n3c4ccc(OC)cc4c4cc(OC)ccc43)c2)c1]

TABLE 2-continued
Examples of organic molecules according to the invention.
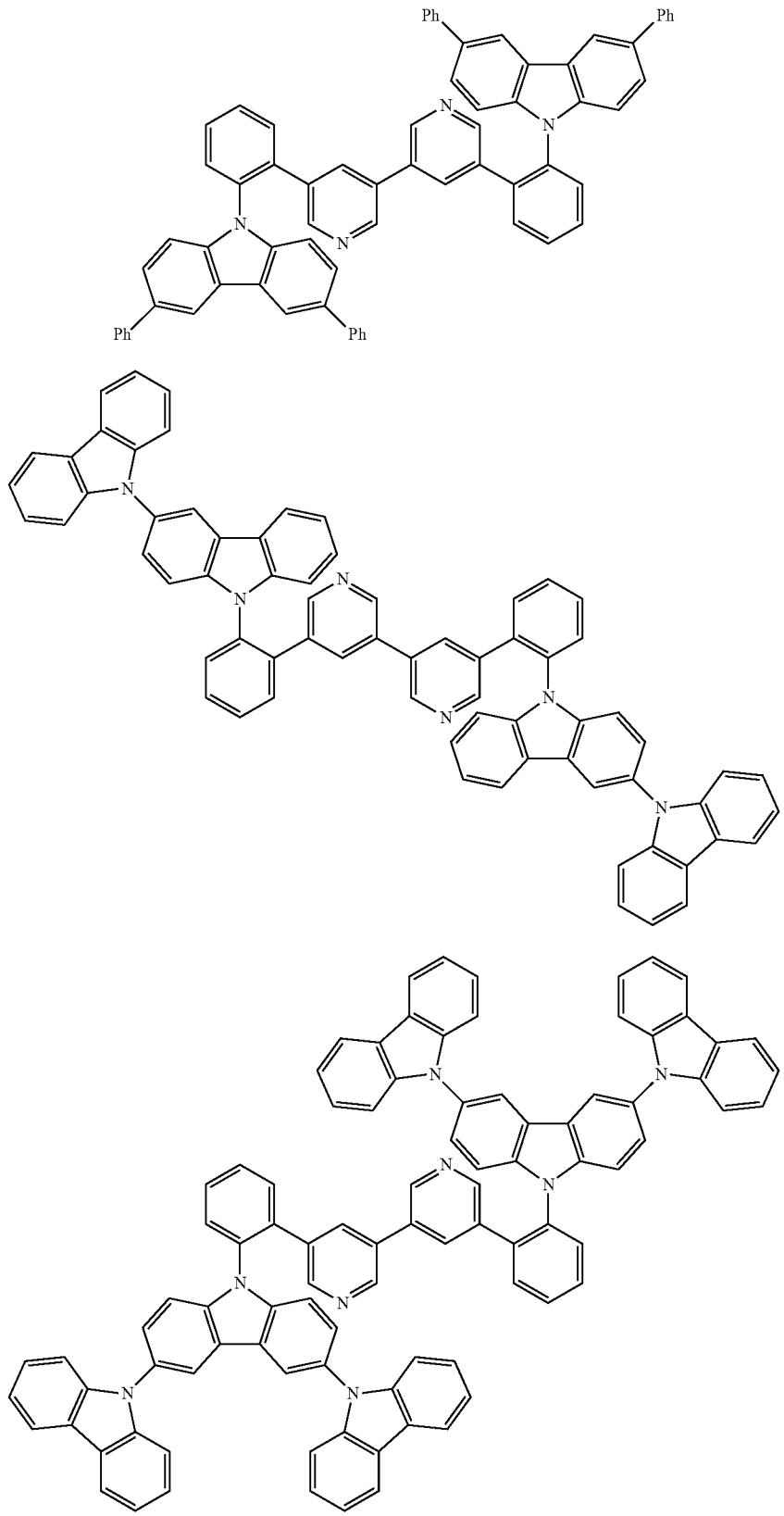

TABLE 2-continued
Examples of organic molecules according to the invention.
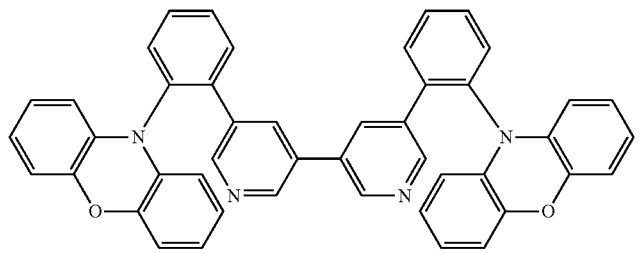
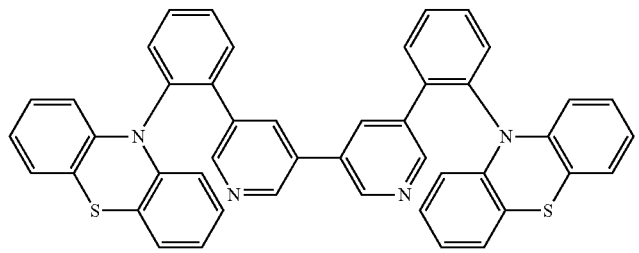 [SMILES: c1ccc2c(c1)Oc1ccccc1N2c1ccccc1-c1cncc(-c2cncc(-c3ccccc3N3c4ccccc4Oc4ccccc43)c2)c1]
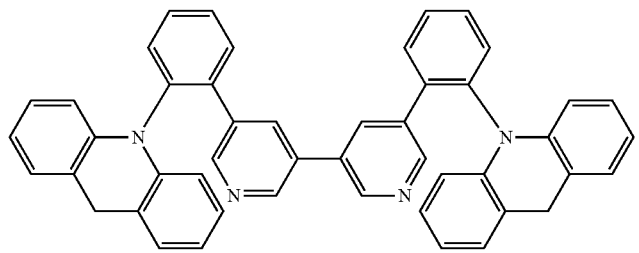
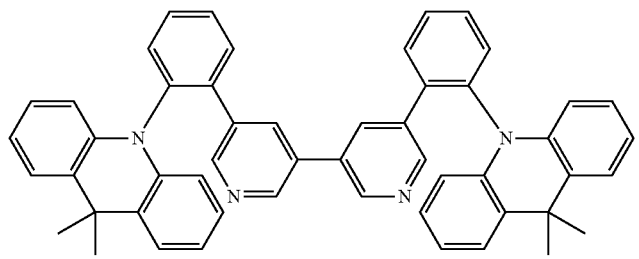 [SMILES: CC1(C)c2ccccc2N(c2ccccc2-c2cncc(-c3cncc(-c4ccccc4N4c5ccccc5C(C)(C)c5ccccc54)c3)c2)c2ccccc21]
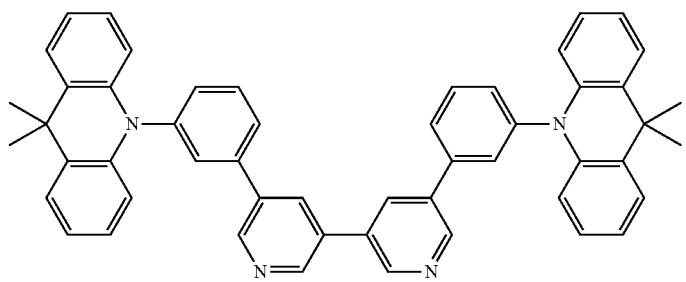
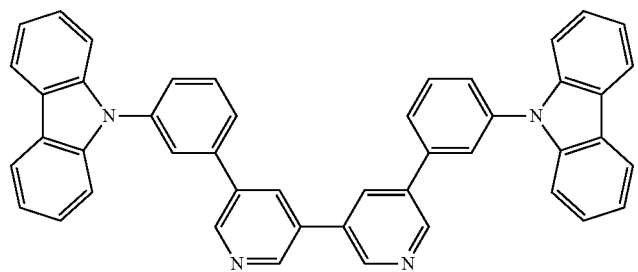 [SMILES: c1cc(-c2cncc(-c3cncc(-c4cccc(-n5c6ccccc6c6ccccc65)c4)c3)c2)cc(-n2c3ccccc3c3ccccc32)c1]

TABLE 2-continued
Examples of organic molecules according to the invention.
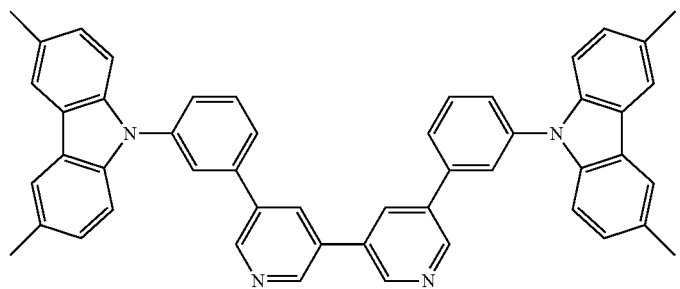
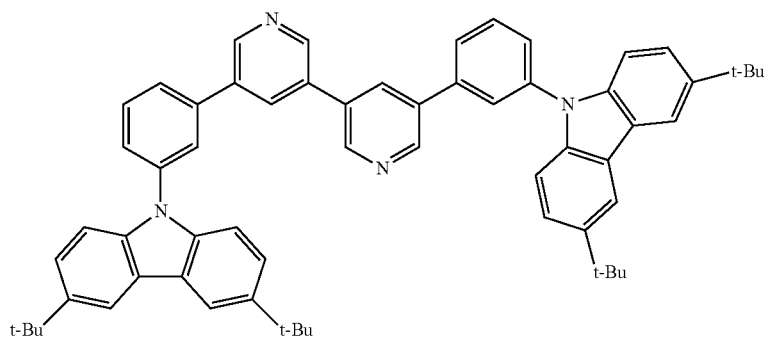 [SMILES: CC(C)(C)c1ccc2c(c1)c1cc(C(C)(C)C)ccc1n2-c1cccc(-c2cncc(-c3cncc(-c4cccc(-n5c6ccc(C(C)(C)C)cc6c6cc(C(C)(C)C)ccc65)c4)c3)c2)c1]
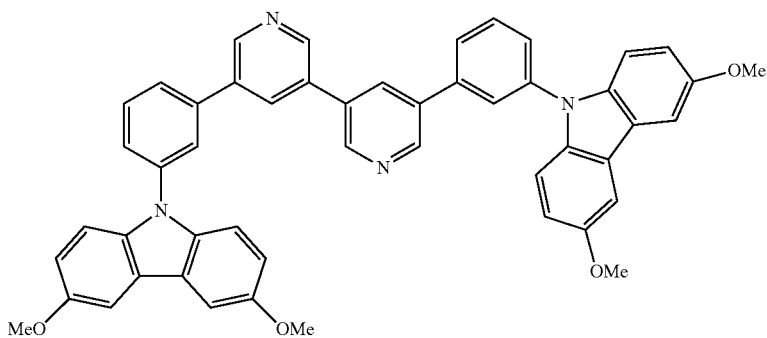 [SMILES: COc1ccc2c(c1)c1cc(OC)ccc1n2-c1cccc(-c2cncc(-c3cncc(-c4cccc(-n5c6ccc(OC)cc6c6cc(OC)ccc65)c4)c3)c2)c1]
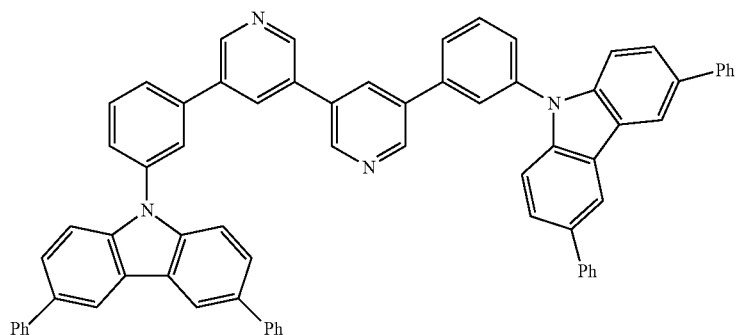 [SMILES: c1ccc(-c2ccc3c(c2)c2cc(-c4ccccc4)ccc2n3-c2cccc(-c3cncc(-c4cncc(-c5cccc(-n6c7ccc(-c8ccccc8)cc7c7cc(-c8ccccc8)ccc76)c5)c4)c3)c2)cc1]

TABLE 2-continued
Examples of organic molecules according to the invention.
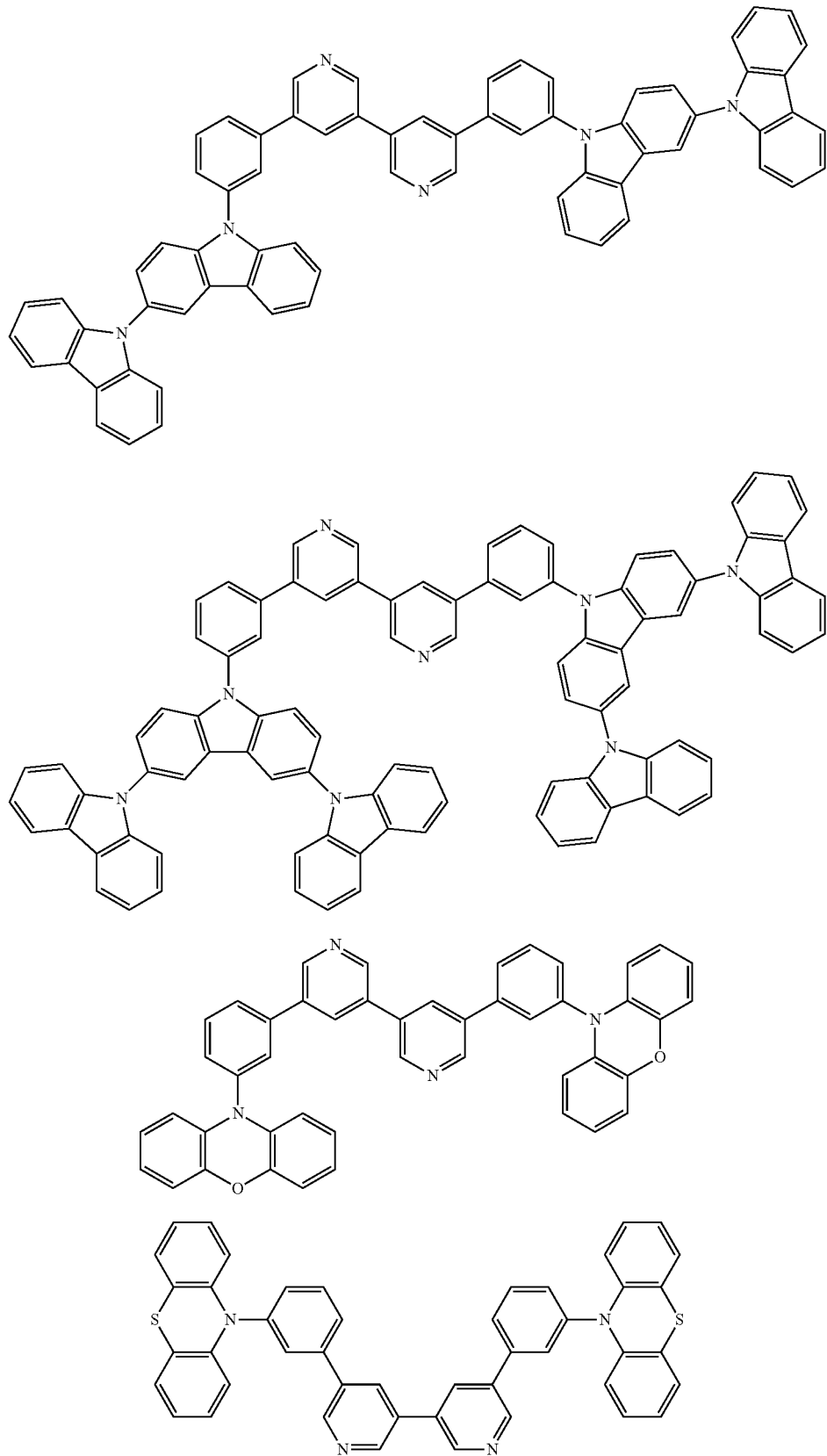

TABLE 2-continued
Examples of organic molecules according to the invention.
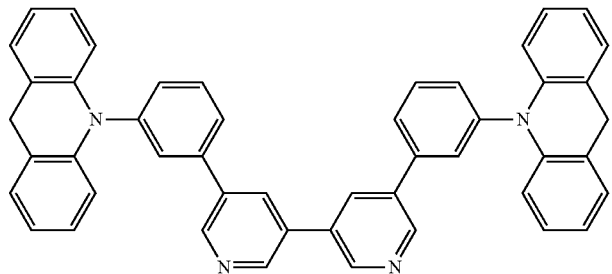 [SMILES: c1cc(-c2cncc(-c3cncc(-c4cccc(N5c6ccccc6Cc6ccccc65)c4)c3)c2)cc(N2c3ccccc3Cc3ccccc32)c1]
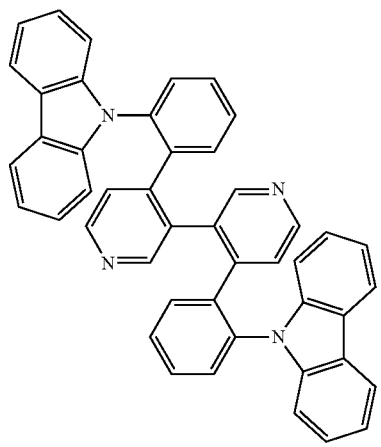 [SMILES: c1ccc(-n2c3ccccc3c3ccccc32)c(-c2ccncc2-c2cnccc2-c2ccccc2-n2c3ccccc3c3ccccc32)c1]
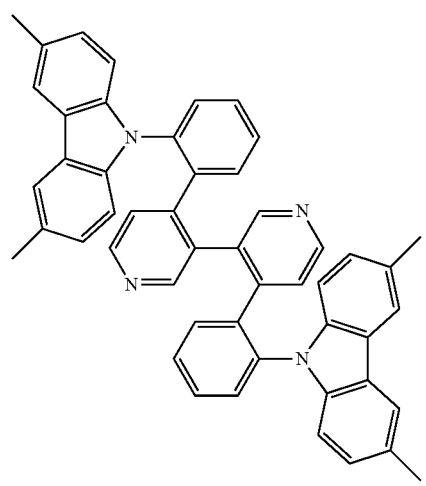

TABLE 2-continued
Examples of organic molecules according to the invention.
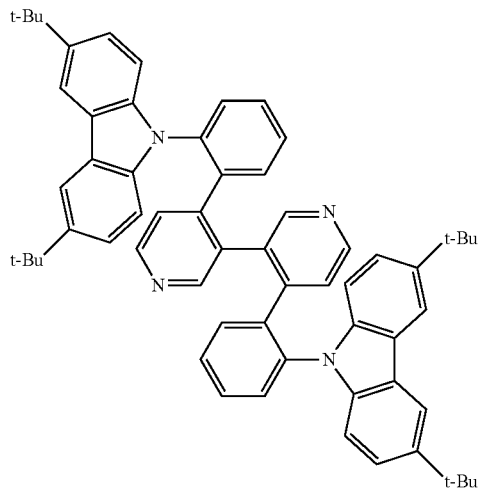 [SMILES: CC(C)(C)c1ccc2c(c1)c1cc(C(C)(C)C)ccc1n2-c1ccccc1-c1ccncc1-c1cnccc1-c1ccccc1-n1c2ccc(C(C)(C)C)cc2c2cc(C(C)(C)C)ccc21]
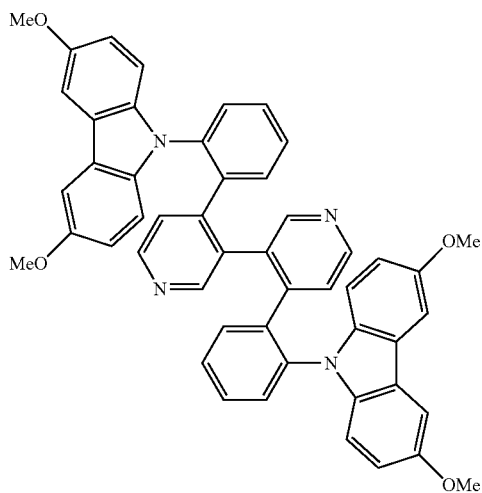 [SMILES: COc1ccc2c(c1)c1cc(OC)ccc1n2-c1ccccc1-c1ccncc1-c1cnccc1-c1ccccc1-n1c2ccc(OC)cc2c2cc(OC)ccc21]
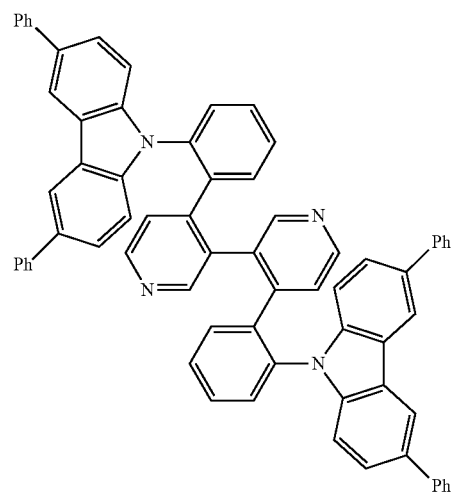 [SMILES: c1ccc(-c2ccc3c(c2)c2cc(-c4ccccc4)ccc2n3-c2ccccc2-c2ccncc2-c2cnccc2-c2ccccc2-n2c3ccc(-c4ccccc4)cc3c3cc(-c4ccccc4)ccc32)cc1]

TABLE 2-continued
Examples of organic molecules according to the invention.
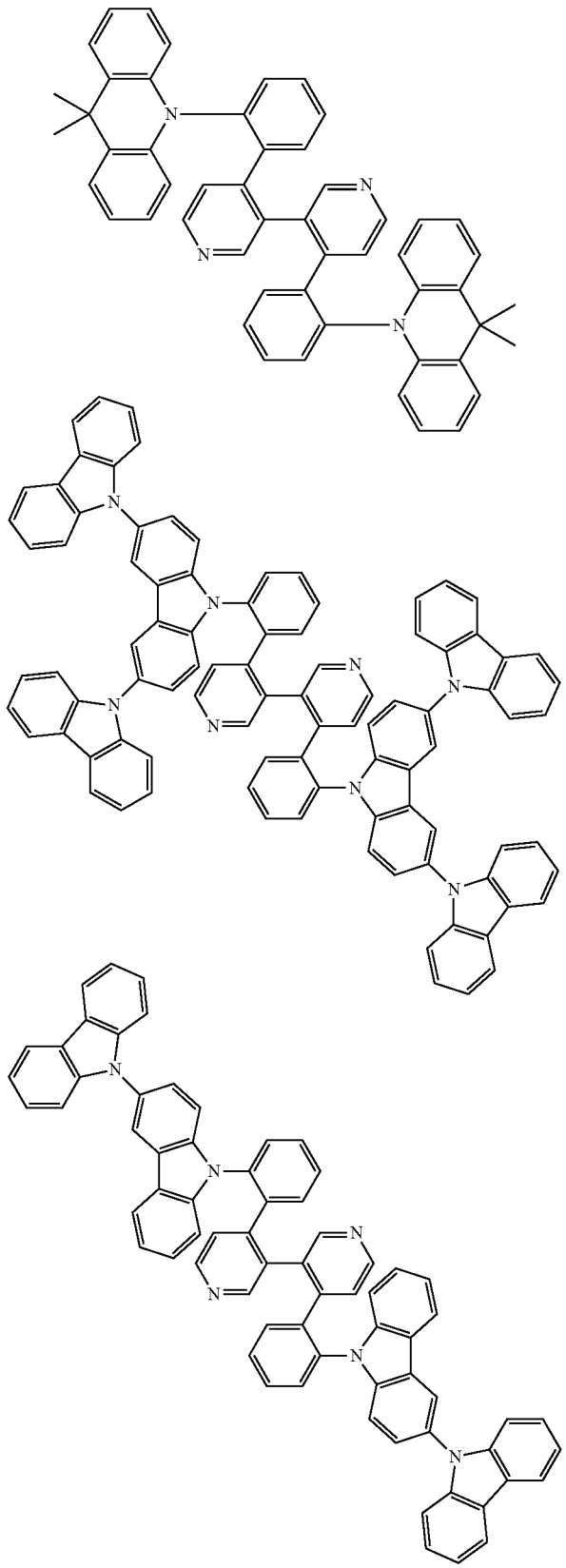

TABLE 2-continued
Examples of organic molecules according to the invention.
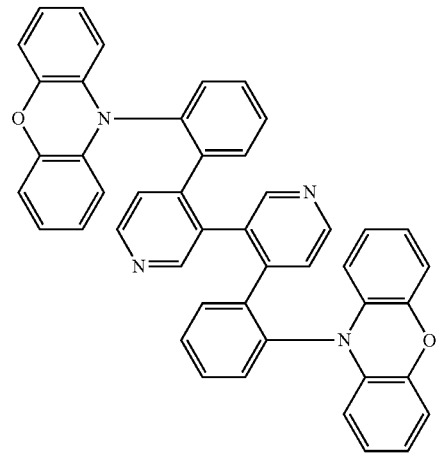 [SMILES: c1ccc2c(c1)Oc1ccccc1N2c1ccccc1-c1ccncc1-c1cnccc1-c1ccccc1N1c2ccccc2Oc2ccccc21]
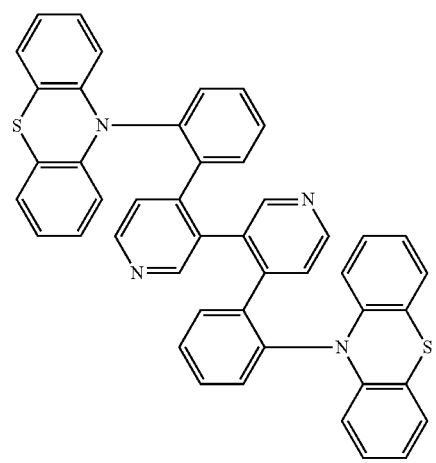 [SMILES: c1ccc2c(c1)Sc1ccccc1N2c1ccccc1-c1ccncc1-c1cnccc1-c1ccccc1N1c2ccccc2Sc2ccccc21]
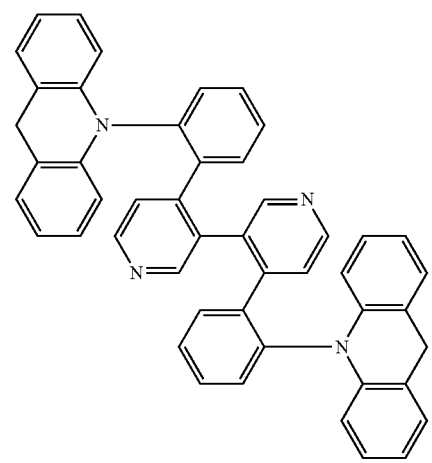 [SMILES: c1ccc2c(c1)Cc1ccccc1N2c1ccccc1-c1ccncc1-c1cnccc1-c1ccccc1N1c2ccccc2Cc2ccccc21]

TABLE 2-continued
Examples of organic molecules according to the invention.
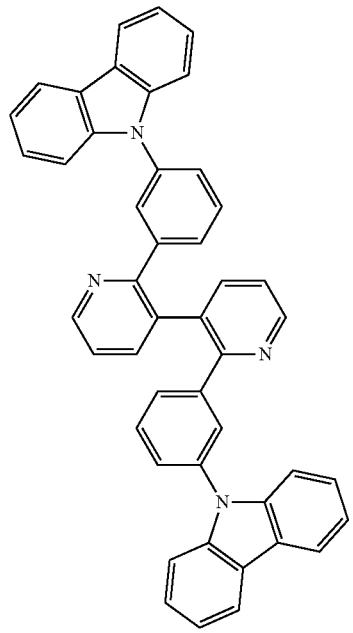 [SMILES: c1cc(-c2ncccc2-c2cccnc2-c2cccc(-n3c4ccccc4c4ccccc43)c2)cc(-n2c3ccccc3c3ccccc32)c1]
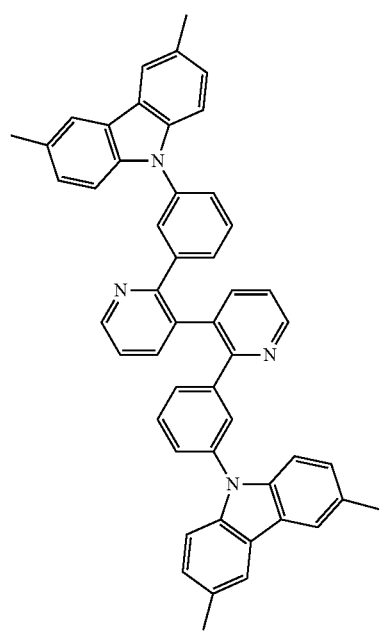

TABLE 2-continued
Examples of organic molecules according to the invention.
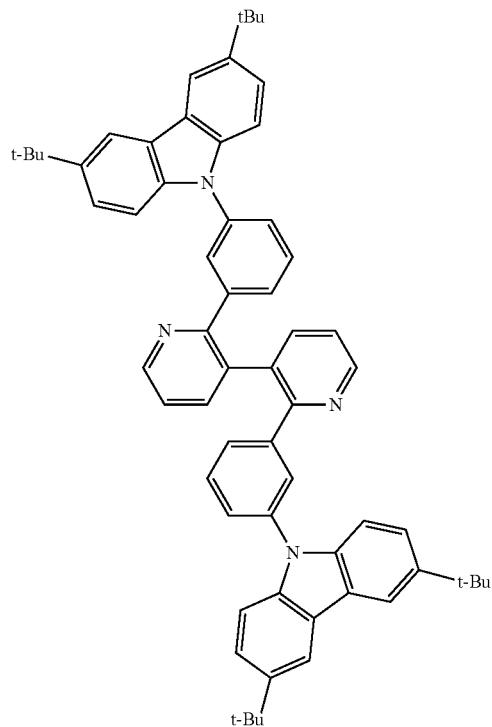 [SMILES: CC(C)(C)c1ccc2c(c1)c1cc(C(C)(C)C)ccc1n2-c1cccc(-c2ncccc2-c2cccnc2-c2cccc(-n3c4ccc(C(C)(C)C)cc4c4cc(C(C)(C)C)ccc43)c2)c1]
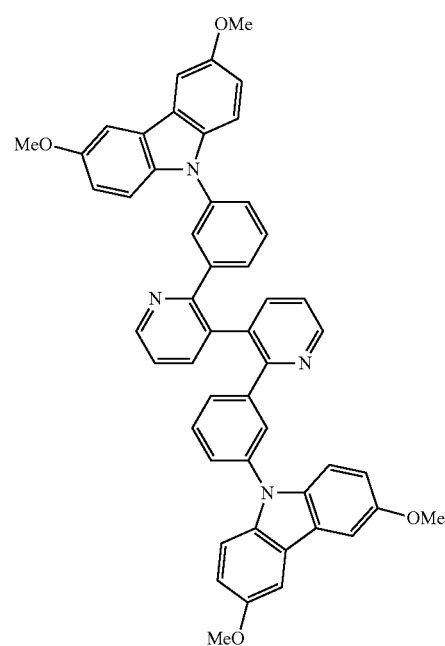 [SMILES: COc1ccc2c(c1)c1cc(OC)ccc1n2-c1cccc(-c2ncccc2-c2cccnc2-c2cccc(-n3c4ccc(OC)cc4c4cc(OC)ccc43)c2)c1]

TABLE 2-continued
Examples of organic molecules according to the invention.
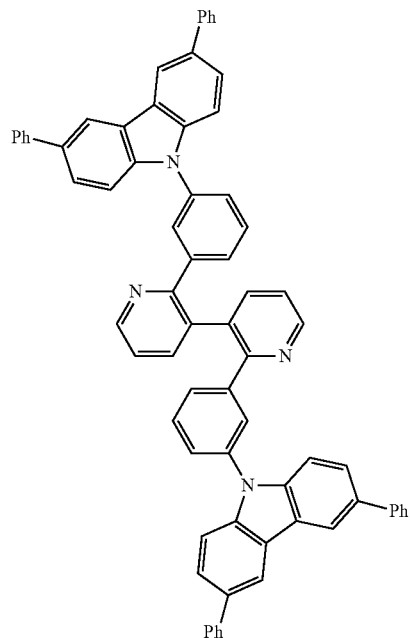 [SMILES: c1ccc(-c2ccc3c(c2)c2cc(-c4ccccc4)ccc2n3-c2cccc(-c3ncccc3-c3cccnc3-c3cccc(-n4c5ccc(-c6ccccc6)cc5c5cc(-c6ccccc6)ccc54)c3)c2)cc1]
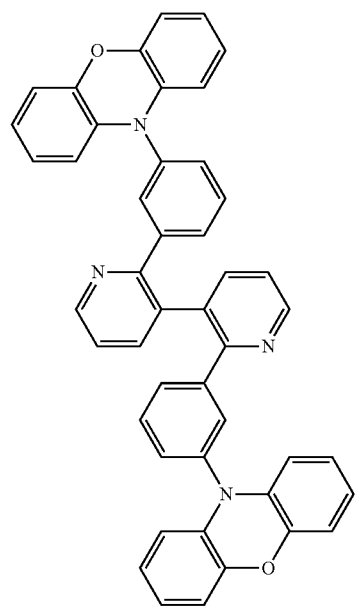 [SMILES: c1cc(-c2ncccc2-c2cccnc2-c2cccc(N3c4ccccc4Sc4ccccc43)c2)cc(N2c3ccccc3Sc3ccccc32)c1]

TABLE 2-continued
Examples of organic molecules according to the invention.
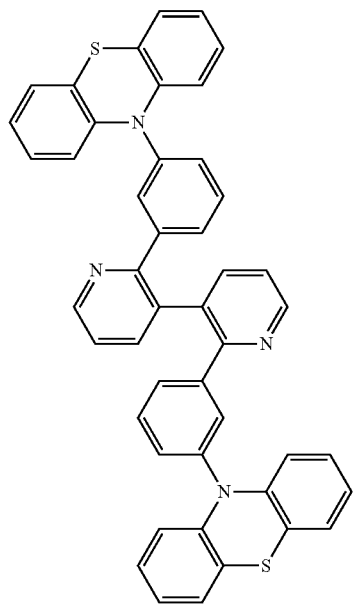 [SMILES: c1cc(-c2ncccc2-c2cccnc2-c2cccc(N3c4ccccc4Cc4ccccc43)c2)cc(N2c3ccccc3Cc3ccccc32)c1]
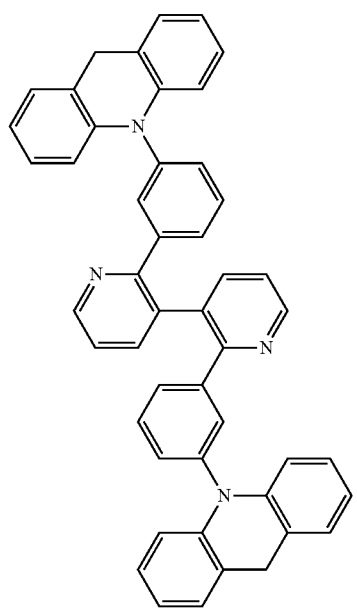

TABLE 2-continued
Examples of organic molecules according to the invention.
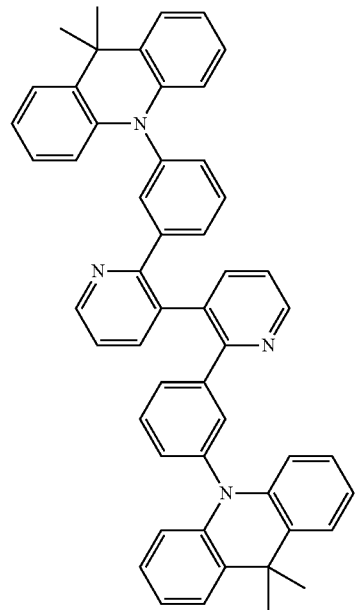 [SMILES: CC1(C)c2ccccc2N(c2cccc(-c3ncccc3-c3cccnc3-c3cccc(N4c5ccccc5C(C)(C)c5ccccc54)c3)c2)c2ccccc21]
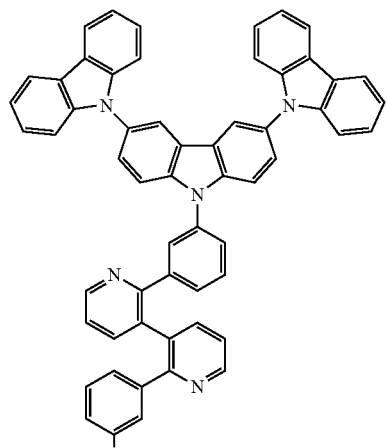
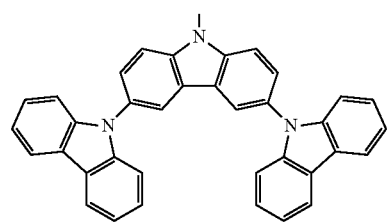

TABLE 2-continued
Examples of organic molecules according to the invention.
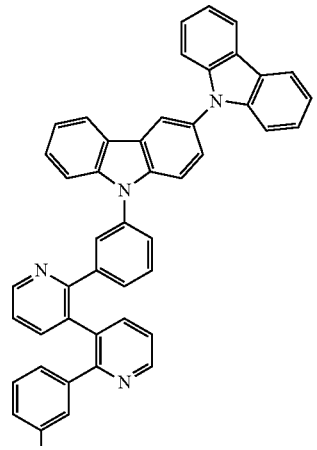
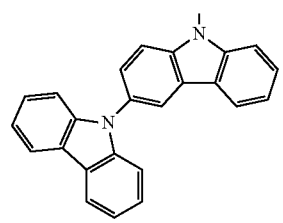
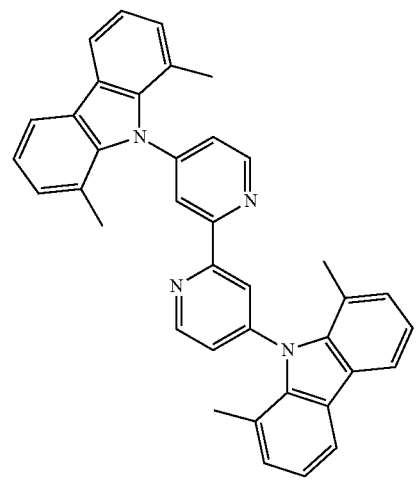 [SMILES: Cc1cccc2c3cccc(C)c3n(-c3ccnc(-c4cc(-n5c6c(C)cccc6c6cccc(C)c65)ccn4)c3)c12]
(0.073 eV)

TABLE 2-continued
Examples of organic molecules according to the invention.
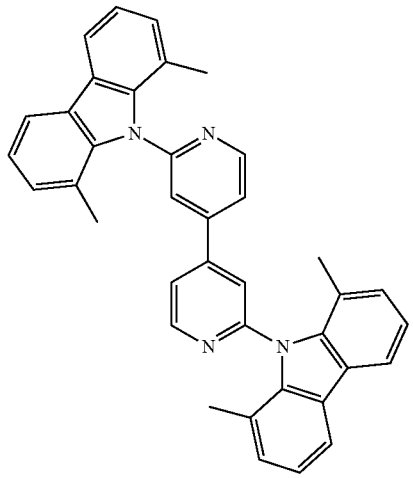 [SMILES: Cc1cccc2c3cccc(C)c3n(-c3cc(-c4ccnc(-n5c6c(C)cccc6c6cccc(C)c65)c4)ccn3)c12]
(0.055 eV)
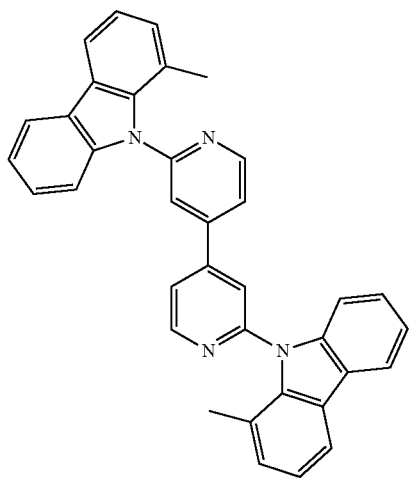 [SMILES: Cc1cccc2c3ccccc3n(-c3cc(-c4ccnc(-n5c6ccccc6c6cccc(C)c65)c4)ccn3)c12]
(0.141 eV)
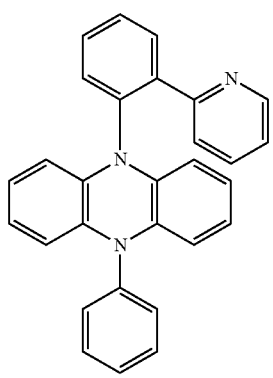 [SMILES: c1ccc(N2c3ccccc3N(c3ccccc3-c3ccccn3)c3ccccc32)cc1]
(0.038 eV)

TABLE 2-continued
Examples of organic molecules according to the invention.
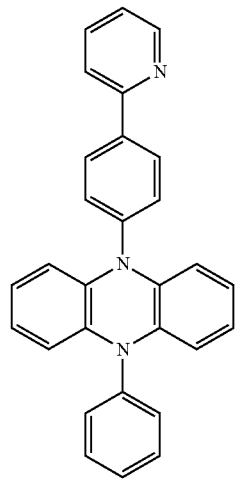 [SMILES: c1ccc(N2c3ccccc3N(c3ccc(-c4ccccn4)cc3)c3ccccc32)cc1]
(0.007 eV)
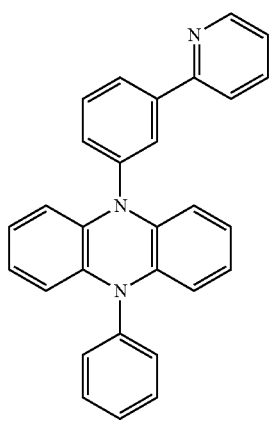 [SMILES: c1ccc(N2c3ccccc3N(c3cccc(-c4ccccn4)c3)c3ccccc32)cc1]
(0.037 eV)
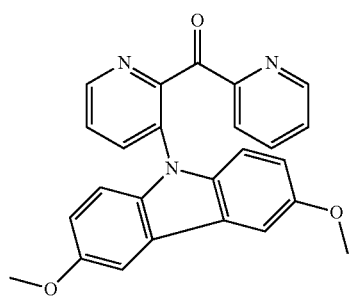
(0.025 eV)
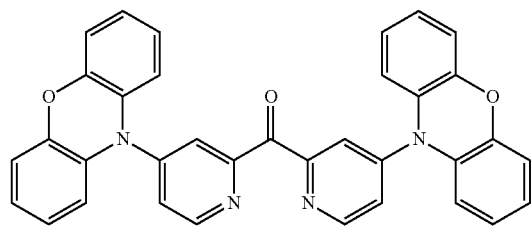 [SMILES: O=C(c1cc(N2c3ccccc3Oc3ccccc32)ccn1)c1cc(N2c3ccccc3Oc3ccccc32)ccn1]
(0.056 eV)

TABLE 2-continued

Examples of organic molecules according to the invention.

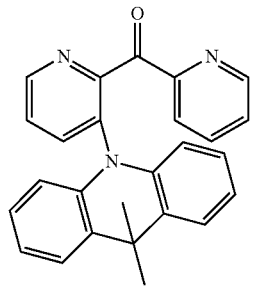

(0.025 eV)

In one embodiment in particular the linker group LG distinguishes the organic molecules functionally from molecules according to the prior art. This results in, on one hand, a breaking of the conjugation between the conjugated system of the electron-donating part of the molecule and that of the electron-accepting part of the molecule, which especially leads to localization of the limiting orbitals HOMO and LUMO on different parts of the molecules and thus to a low $\Delta E(S_1-T_1)$ distance. On the other hand, the linker group LG increases the size of the overlapping integral between HOMO and LUMO, which leads to a high oscillator strength of the corresponding quantum mechanical transition. As a result, high luminescence quanta yields and short decay times of the excited states can be achieved. Known organic emitters as a rule consist of directly linked chemical units. Separation of the conjugated aromatic systems has not yet taken place, especially in connection with the localization of HOMO and LUMO on separate parts of the molecules. Linker groups in the sense of this invention do not significantly the position of the HOMO of LUMO of the AF1 and the AF2. Non-significant within the framework of this invention means a change of no more than +/−0.4 eV. The calculation of such energies is known and functions in the manner described above by DFT calculation.

Based on spectroscopic selection rules (symmetrical molecules) or by measuring the extinction coefficient (UV/VIS spectroscopy) or based on quantum chemical calculation of the oscillator strength it is possible to predict whether a quantum mechanical transition is allowed. The higher the oscillator strength, the more likely a transition is to be allowed, and the faster the associated process is (decay time). Decay times of <300 µs, especially <100 µs, or <50 µs, are desired. In the case of a long decay time of the (organic) emitter, at high current intensities, saturation effects rapidly occur, which has a negative effect on the component lifetime and prevents the attainment of high brightnesses.

One measure of the decay time is the $\Delta E(S_1-T_1)$ distance. This is influenced by the overlapping of HOMO and LUMO. The magnitude of the quantum mechanical overlap integral, which can be calculated according to the above-mentioned DFT method, can be systematically controlled by selection of the linker group. If complete separation of HOMO and LUMO takes place, this has a value of 0. The probability of an efficient emission of the organic molecule decreases drastically. At a value of 1, delayed fluorescence (TADF) is no longer present, but rather spontaneous emission. In a selected form of the invention, the desired overlap is achieved by the suitable selection of a linker group LG.

In one embodiment additional radicals R are attached at the chemically substitutable positions of the organic molecules obtained in this way to increase the solubility of these emitters and/or enable polymerizability without significantly altering the electronic properties of the molecule, so that even when R is used, an emitter will exist in which each R at each occurrence independently of one another is selected from the group consisting of H, deuterium, phenyl, naphthyl, F, Cl, Br, I, $N(R^2)_2$, —SCN, —$CF_3$, —$NO_2$, —OH, C(=O)OH, C(=O)$OR^3$, C(=O)$N(R^3)_2$, C(=O)$SR^3$, C(=S)$SR^3$, $Si(R^4)_3$, $B(OR^5)_2$, $B(N(R^6)_2)_2$, C(=O)$R^3$, P(=O)$(R^7)_2$, As(=O)$(R^7)_2$, P(=S)$(R^7)_2$, As(=S)$(R^7)_2$, S(=O)$R^3$, S=$NR^3$, S(=O)$NR^3$, S(=O)$_2NR^3$, S(=O)$_2R^3$, O—S(=O)$_2R^3$, $SF_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9$C=$CR^9$—, —C=C—, or an adjacent $CH_2$ group by —$Si(R^4)_2$—, —$Ge(R^4)_2$—, —$Sn(R^4)_2$, —C(=O)—, —C(=S)—, —C(=Se)—, —C=N—, —C(=O)O—, —C(=O)$N(R^3)$—, —P(=O)$(R^7)$—, —As(=O)$(R^7)$—, —P(=S)$(R^7)$—, —As(=S)$(R^7)$—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, each of which may be substituted with one or more radicals $R^2$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents R may also form with one another a monocyclic aliphatic ring system with a total of five or six ring members.

$R^2$ at each occurrence independently of one another is selected from the group consisting of H, deuterium, phenyl, naphthyl, $CF_3$, C(=O)$OR^3$, C(=O)$N(R^2)_2$, $Si(R^4)_3$, C(=O)$R^3$, P(=O)$(R^7)_2$, As(=O)$(R^7)_2$ P(=S)$(R^7)_2$, As(=S)$(R^7)_2$, S(=O)$R^3$, S(=O)$_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C$=$CR^9$—, —C≡C—, or an adjacent $CH_2$ group by —Si($R^4$)$_2$—, —Ge($R^4$)$_2$—, —Sn($R^4$)$_2$—, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^2$ also form a mono- or polycyclic, aliphatic, aromatic and/or benzoannelated ring system with one another.

$R^3$ at each occurrence independently of one another is selected from the group consisting of H, deuterium, phenyl, naphthyl, $CF_3$ or an aliphatic, aromatic and/or heteroaromatic hydrocarbon radical with 1 to 20 C atoms, in which also one or more H atoms may be replaced by F or $CF_3$; in this case two or more substituents $R^3$ may also form a mono- or polycyclic, aliphatic ring system with one another.

$R^4$ at each occurrence independently of one another is selected from the group consisting of H, deuterium, phenyl, naphthyl, N($R^2$)$_2$, $CF_3$, OH, C(=O)O$R^3$, C(=O)N($R^3$)$_2$, C(=O)$R^3$, P(=O)($R^7$)$_2$, As(=O)($R^7$)$_2$, P(=S)($R^7$)$_2$, As(=S)($R^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C$=$CR^9$—, —C≡C—, or an adjacent $CH_2$ group by —Si($R^4$)$_2$—, —Ge($R^4$)$_2$—, —Sn($R^4$)$_2$—, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —$NR^2$—, —O—, or —S and wherein one or more H atoms may be replaced by deuterium, F, Cl, Br, I, $CF_3$ or $NO_2$, or an aromatic or heteroaromatic ring system with 5 to 60 aromatic ring atoms, each of which may be substituted with one or more radicals $R^8$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^4$ may also form a mono- or polycyclic, aliphatic, aromatic and/or benzoannelated ring system with one another.

$R^5$ at each occurrence independently of one another is selected from the group consisting of phenyl, naphthyl, $CF_3$, C(=O)$R^3$, P(=O)($R^7$)$_2$, As(=O)($R^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C$=$CR^9$—, —C≡C—, or an adjacent $CH_2$ group —Si($R^4$)$_2$—, —Ge($R^4$)$_2$—, —Sn($R^4$)$_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^5$ may also form a mono- or polycyclic, aliphatic, aromatic and/or benzoannelated ring system with one another.

$R^6$ at each occurrence independently of one another is selected from the group consisting of phenyl, naphthyl, $CF_3$, Si($R^4$)$_3$, C(=O)$R^3$, P(=O)($R^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C$=$CR^9$—, —C≡C—, or an adjacent $CH_2$ group by —Si($R^4$)$_2$—, —Ge($R^4$)$_2$—, —Sn($R^4$)$_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; wherein two or more of these substituents $R^6$ also form a mono- or polycyclic, aliphatic, aromatic and/or benzoannelated ring system with one another.

$R^7$ at each occurrence independently of one another is selected from the group consisting of phenyl, naphthyl, N($R^2$)$_2$, $CF_3$, C(=O)O$R^3$, C(=O)N($R^3$)$_2$, Si($R^4$)$_3$, C(=O)$R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C$=$CR^9$—, —C≡C—, or an adjacent $CH_2$ group by —Si($R^4$)$_2$—, —Ge($R^4$)$_2$—, —Sn($R^4$)$_2$, —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$ —, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^3$, or a combination of these systems; wherein two or more of these substituents $R^7$ also form a mono- or polycyclic, aliphatic, aromatic and/or benzoannelated ring system with one another.

$R^8$ at each occurrence independently of one another is selected from the group consisting of H, deuterium, phenyl, naphthyl, F, $CF_3$ or an aliphatic, aromatic and/or heteroaromatic hydrocarbon radical with 1 to 20 C atoms, in which also one or more H atoms may be replaced by F or $CF_3$; here, two or more substituents $R^8$ may also form a mono- or polycyclic, aliphatic ring system with one another.

$R^9$ at each occurrence independently of one another is selected from the group consisting of H, deuterium, phenyl, naphthyl, $N(R^2)_2$, $CF_3$, $NO_2$, OH, COOH, $C(=O)OR^3$, $C(=O)N(R^3)_2$, $Si(R^4)_3$, $B(OR^5)_2$, $C(=O)R^3$, $P(=O)(R^7)_2$, $P(=S)(R^7)_2$, $As(=O)(R^7)_2$, $P(=S)(R^7)_2$, $S(=O)R^3$, $S(=O)_2R^3$, $OSO_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^8$, wherein one or more non-adjacent $CH_2$ groups may be replaced by $-R^3C=CR^3-$, $-C\equiv C-$, or an adjacent $CH_2$ group by $-Si(R^4)_2-$, $-Ge(R^4)_2-$, $-Sn(R^4)_2-$, $-C(=O)-$, $-C(=S)-$, $-C(=Se)-$, $-C=N-$, $-C(=O)O-$, $-C(=O)N(R^3)-$, $-P(=O)(R^7)-$, $-As(=O)(R^7)-$, $-P(=S)(R^7)-$, $-As(=S)(R^7)-$, $-S(=O)-$, $-S(=O)_2-$, $-NR^2-$, $-O-$, or $-S-$ and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^3$, or a diarylamino group, diheteroarylamino group or arylheteroarylamino group with 10 to 40 aromatic ring atoms, which may be substituted with one or more radicals $R^8$, or a combination of these systems; wherein two or more of these substituents $R^9$ also form a mono- or polycyclic, aliphatic, aromatic and/or benzoannelated ring system with one another.

Polymerizable radicals are radicals bearing polymerizable functional units, which may be homopolymerized with themselves or copolymerized with other monomers. Thus the molecules according to the invention may be obtained as polymers with the following repeat units of formula 5 and 6, which may be used as polymers in the light-emitting layer of the optoelectronic component.

Formula 5

Formula 6

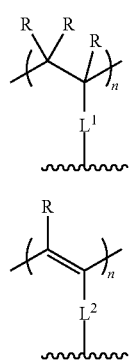

In formulas 5 and 6, L1 and L2 represent the same or different linker groups, which comprise 0 to 20, particularly 1 to 15 or 2 to 10 carbon atoms, and wherein the wavy line indicates the position over which the linker group is bound to the organic molecule of Formula 1. In one embodiment the linker group L1 and/or L2 has a form $-X-L3-$, wherein X represents O or S and L3 represents a linker group selected from the group consisting of a substituted and unsubstituted alkylene group (linear, branched or cyclic) and a substituted and unsubstituted arylene group, particularly a substituted or unsubstituted alkylene group with 1 to 10 carbon atoms or a substituted or unsubstituted phenylene group, wherein combinations are also possible. In an additional embodiment the linker group L1 and/or L2 comprises a form $-C(=O)O-$. R at each occurrence independently of one another is selected from the group consisting of H, deuterium, phenyl, naphthyl, F, $CF_3$ or an aliphatic, aromatic and/or heteroaromatic hydrocarbon radical with 1 to 20 C atoms, in which one or more H atoms may also be replaced by F or $CF_3$; here, two or more substituents R may also form a mono- or polycyclic, aliphatic ring system with one another, and in addition, R may be: a linear alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms.

Advantageous embodiments of the repeat units are structures of formulas 7 to 12:

Formula 7

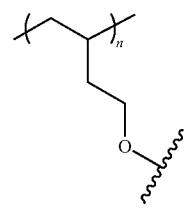

Formula 8

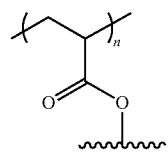

Formula 9

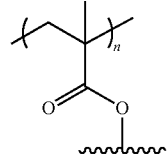

Formula 10

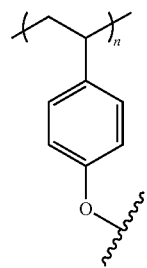

Formula 11

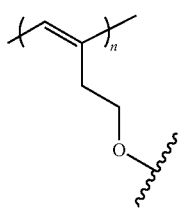

Formula 12

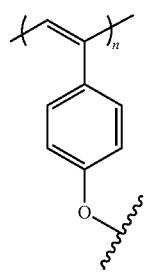

For producing the polymers that comprise the repeat units according to formulas 7 to 12, the polymerizable functional units are bound over a linker group of formulas 13 to 18, which comprises a hydroxyl unit, to an organic molecule of formula 1 and the compounds resulting from this are homopolymerized with themselves or copolymerized with other suitable monomers.

Formula 13

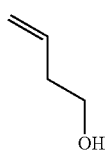

Formula 14

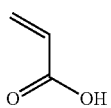

Formula 15

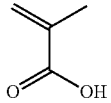

Formula 16

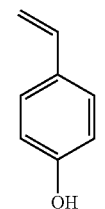

Formula 17

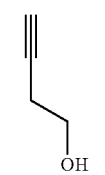

Formula 18

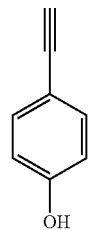

Polymers that comprise a unit according to formula 5 or formula 6 can comprise exclusively repeat units with a structure of general formula 5 or 6 or repeat units with another structure. Examples of repeat units with other structures comprise units that result from corresponding monomers that are typically used or employed in copolymerizations. Examples of such repeat units, for example produced from monomers, are repeat units that comprise unsaturated units such as ethylene or styrene.

One embodiment of the invention relates to organic molecules that have a $\Delta E(S_1-T_1)$ value between the lowest activated singlet ($S_1$) state and the triplet ($T_1$) state located below it of less than 0.2 eV, particularly less than 0.1 eV and/or have an emission lifetime of a maximum of 50 μs.

In one aspect the invention relates to the use of an organic molecule according to the invention as a luminescent emitter and/or as a host material and/or as an electron transport material and/or as a hole injection material and/or as a hole blocking material in an optoelectronic component that is particularly produced by a vacuum evaporation method or from solution, wherein the optoelectronic component is particularly selected from the group consisting of:

organic light-emitting diodes (OLEDs),
light-emitting electrochemical cells,
OLED sensors, particularly in gas and vapor sensors not hermetically sealed against the outside,
organic diodes
organic solar cells,
organic transistors,
organic field effect transistors,
organic lasers and
down-conversion elements.

In one embodiment, the fraction of the organic molecule according to the invention in the luminescent emitter and/or host material and/or electron transport material and/or hole injection material and/or hole blocking material amounts to 1% to 99% (wt.-%); in particular, the fraction of emitter in the optical light emitting components, particularly in OLEDs, id between 5% and 80%.

In an additional aspect, the invention relates to optoelectronic components, comprising an organic molecule according to the invention, wherein the optoelectronic component is particularly formed as a component selected from the group consisting of organic light-emitting diodes (OLED), light-emitting electrochemical cell, OLED sensor, particularly in gas and vapor sensors not hermetically sealed toward the outside, organic diode, organic solar cell, organic transistor, organic field effect transistor, organic laser and down-conversion element.

One embodiment relaters to the optoelectronic component according to the invention comprising a substrate, an anode and a cathode, wherein the anode and the cathode are applied to the substrate, and at least one light-emitting layer, which is disposed between the anode and cathode and which contains an organic molecule according to the invention.

In an additional embodiment of the component the organic molecule is used as an emission material in an emissions layer, in which it can be used in combination with at least one host material or particularly as a pure layer. In one embodiment the fraction of the organic molecule as an emission material in an emission layer in optical light-emitting components, particularly in OLEDs, amounts to between 5% and 80% (wt.-%).

In an additional embodiment of the component according to the invention, the light-emitting layer comprising an organic molecule according to the invention is applied on a substrate.

In one embodiment, the invention relates to an optoelectronic component in which the light-emitting layer comprises exclusively an organic molecule according to the invention in 100% concentration, wherein the anode and the cathode are applied to the substrate, and the light-emitting layer is applied between the anode and cathode.

In an additional embodiment the optoelectronic component, in addition to the organic molecule according to the invention, comprises at least one host material, wherein particularly the activated singlet state ($S_1$) and/or the activated triplet state ($T_1$) of the at least one host material is higher than the activated singlet state ($S_1$) and/or the activated triplet state ($T_1$) of the organic molecule, and wherein the anode and the cathode are applied on the substrate, and die light-emitting layer is applied between anode and cathode.

In an additional embodiment the optoelectronic component comprises an substrate, an anode, a cathode and at least one each of a hole-injecting and an electron-injecting layer and at least one light-emitting layer, wherein the at least one light-emitting layer comprises an organic molecule according to the invention and a host material, the triplet ($T_1$) and singlet ($S_1$) energy levels of which are energetically higher than the triplet ($T_1$) and singlet ($S_1$) energy levels of the organic molecule, and wherein the anode and the cathode are applied to the substrate, and the hole- and electron-injecting layer is applied between the anode and cathode and the light-emitting layer is applied between the hole and electron-injecting layers.

In an additional embodiment the optoelectronic component comprises a substrate, an anode, a cathode and at least one hole-injecting and one electron-injecting layer, and at least one hole-transporting and one electron-transporting layer, and at least one light-emitting layer, wherein the at least one light-emitting layer comprises an organic molecule according to the invention and a host material, the triplet ($T_1$) and singlet ($S_1$) energy levels of which are energetically higher than the triplet ($T_1$) and singlet ($S_1$) energy levels of the organic molecule, and wherein the anode and the cathode are applied to the substrate, and the hole- and electron-injecting layer is applied between the anode and cathode, and the hole- and electron-transporting layer is applied between the hole- and electron-injecting layer, and the light-emitting layer is applied between the hole- and electron-transporting layer.

In an additional embodiment the optoelectronic component comprises at least one host material made of a material according to formula 1.

In an additional embodiment of the optoelectronic component the light-emitting layer includes fluorescent or phosphorescent materials comprising a structure of formula 1.

In an additional embodiment of the optoelectronic component, an organic molecule according to formula 1 and a functional material, for example in the form of an additional emitter material, a host material or another organic molecule which is capable of forming an exciplex with the molecule according to formula 1, form an exciplex. Functional materials are for example host materials such as MCP, electron transport materials such as TPBI and hole transport materials such as NPD or MTDATA. Exciplexes are adducts between electronically activated molecules and those in the electronic ground state which are capable of light emission.

In an additional embodiment of the optoelectronic component the emission is characterized by thermally activated delayed fluorescence (TADF).

In an additional embodiment of the optoelectronic component, organic molecules according to formula 1 are used as a charge transport layer.

In one aspect the invention relates to a light-emitting material, comprising an organic molecule according to the invention and a host material, wherein the triplet ($T_1$) and singlet ($S_1$) energy levels of the host material are energetically higher than the triplet ($T_1$) and singlet ($S_1$) energy levels of the organic molecule, and wherein the organic molecule emits fluorescence or thermally activated delayed fluorescence (TADF), and has a $\Delta E(S_1-T_1)$ value between the lowest activated singlet ($S_1$) state and the triplet ($T_1$) state located below it of less than 0.2 eV, particularly less than 0.1 eV.

One aspect of the invention relates to a method for producing an optoelectronic component comprising an organic molecule according to the invention. In one embodiment the method includes the step of processing the organic molecule using a vacuum evaporation method or from a solution.

In one embodiment the method comprises the method of applying the organic molecule to a support, wherein the application particularly takes place by wet chemistry methods, using a colloidal suspension or by sublimation.

In an additional embodiment of the method at least one layer is
 coated using a sublimation method
 coated using an OVPD (Organic Vapor Phase Deposition) method
 coated using a carrier gas sublimation method or
 produced from solution or using an arbitrary printing method.

An additional aspect of the invention relates to a method for modifying the emission and/or absorption properties of an electronic component, wherein an organic molecule according to the invention is introduced into a matrix material for conducting electrons or holes in an optoelectronic component.

Furthermore, in another aspect the invention relates to the use of a molecule according to the invention for converting UV radiation or blue light into visible light, particularly into green, yellow or red light (down-conversion), particularly in an optoelectronic component of the type described here.

In a further aspect the invention relates to an application in which at least one material with a structure according to formula 1 is activated by external energy excitation to emit light. The external excitation may be electronic or optical or radioactive.

Examples

Calculations According to the Density Functional Theory Variant 1 (BP86)

The DFT (density functional theory) calculations were performed using the BP86 functional (Becke, A. D. Phys.

Rev. A1988, 38, 3098-3100; Perdew, J. P. Phys. Rev. B1986, 33, 8822-8827) and def2-SV(P) basis set (Weigend, F.; Ahlrichs, R. Phys. Chem. Chem. Phys. 2005, 7, 3297-3305; Rappoport, D.; Furche, F. J. Chem. Phys. 2010, 133, 134105/1-134105/11). For numerical integration the m4 grid and the resolution-of-identity (RI) approximation (Häser, M.; Ahlrichs, R. J. Comput. Chem. 1989, 10, 104-111; Weigend, F.; Häser, M. Theor. Chem. Acc. 1997, 97, 331-340; Sierka, M.; Hogekamp, A.; Ahlrichs, R. J. Chem. Phys. 2003, 118, 9136-9148) were used in all calculations. The DFT calculations were performed with the Turbomole program package (Version 6.5) (TURBOMOLE V6.4 2012, University of Karlsruhe/Forschungszentrum Karlsruhe GmbH, 1989-2007, TURBOMOLE GmbH, since 2007; http://www.turbomole.com).

Variant 2 (TD-B3LYP)

For optimizing the molecular structures, the BP86 functional (Becke, A. D. Phys. Rev. A1988, 38, 3098-3100; Perdew, J. P. Phys. Rev. B1986, 33, 8822-8827) was used, wherein the resolution-of-identity (RI) approximation (Sierka, M.; Hogekamp, A.; Ahlrichs, R. J. Chem. Phys. 2003, 118, 9136-9148; Becke, A. D., J. Chem. Phys. 98 (1993) 5648-5652; Lee, C; Yang, W; Parr, R. G. Phys. Rev. B 37 (1988) 785-789) was employed. Activation energies were calculated for the BP86-optimized structure with the time-dependent DFT method (TD-DFT) using the B3LYP functional (Becke, A. D., J. Chem. Phys. 98 (1993) 5648-5652; Lee, C; Yang, W; Parr, R. G. Phys. Rev. B 37 (1988) 785-789; Vosko, S. H.; Wilk, L.; Nusair, M. Can. J. Phys. 58 (1980) 1200-1211; Stephens, P. J.; Devlin, F. J.; Chabalowski, C. F.; Frisch, M. J. J. Phys. Chem. 98 (1994) 11623-11627). The def2-SV(P) basis sets (Weigend, F.; Ahlrichs, R. Phys. Chem. Chem. Phys. 2005, 7, 3297-3305; Rappoport, D.; Furche, F. J. Chem. Phys. 2010, 133, 134105/1-134105/11) and a m4 grid for numerical integration were used in all calculations. All DFT calculations were performed with the Turbomole program package (Version 6.5) (TURBOMOLE V6.4 2012, University of Karlsruhe und Forschungszentrum Karlsruhe GmbH, 1989-2007, TURBOMOLE GmbH, since 2007; http://www.turbomole. com).

Synthesis

Synthesis of Fluorinated Bipyridines as Precursors

The synthesis is performed in analogy to the preparation of precursor A.

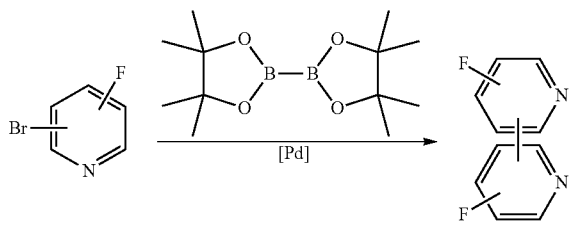

Nucleophilic Aromatic Substitution with Arylamines and Derivatives

The synthesis is performed in analogy to the preparation of compounds A to D.

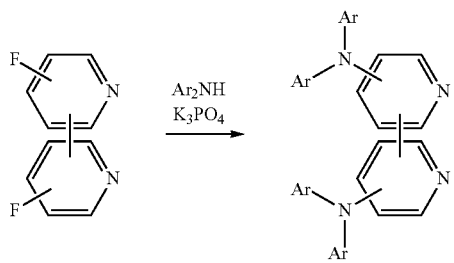

Molecular Examples (for Molecular Structures See Table 3)

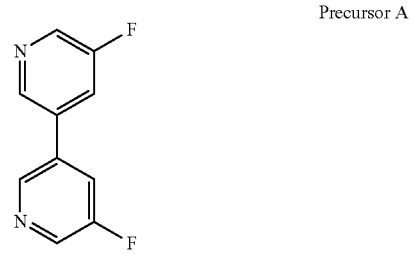 [SMILES: Fc1cncc(-c2cncc(F)c2)c1]

Precursor A

In a two-necked flask (500 mL) with reflux attachment and septum, 3-bromo-5-fluoropyridine (56.8 mmol, 1 equiv.), bis(pinacolato)diboron (28.4 mmol, 0.5 equiv.), Pd$_2$(dba)$_3$ (0.28 mmol, 0.005 equiv.), 2-dicyclohexylphosphino-2',6'-dimethoxy-1,1'-biphenyl (1.14 mmol, 0.02 equiv.) and K$_3$PO$_4$ (170 mmol, 3 equiv.) were placed under a nitrogen atmosphere. Absolute dioxane (150 mL) and deionized water (15 mL) were added and the resulting suspension was degassed under a stream of nitrogen. The mixture was heated for 17 h at 100° C. After cooling to RT the mixture was filtered; the residue was washed with dioxane and discarded. The filtrate was freed from solvent under reduced pressure. The residue was recrystallized from toluene and the mother liquor filtered while hot. In this way precursor was obtained in a yield of 77% (21.8 mmol).

Compound A

In a two-necked flask (100 mL) with reflux attachment and septum, precursor A (1.30 mmol, 1 equiv.), 3,6-bis(diphenylamino)-9H-carbazole (2.59 mmol, 2 equiv.) and K$_3$PO$_4$ (5.20 mmol, 4 equiv.) were placed under a nitrogen atmosphere. After addition of abs. DMSO (20 mL) the mixture was heated for 15 h at 110° C. After cooling to RT the reaction mixture was shaken in 400 mL sodium chloride solution. Dichloromethane (150 mL) was added, the phases were separated and the aqueous phase again extracted with dichloromethane (150 mL). The combined organic phases were washed with sodium chloride solution (200 mL) and then dried over MgSO$_4$. The solvent was removed under reduced pressure and the residue purified by MPLC. The yield of compound A was 25% (0.32 mmol).

Compound B

In a two-necked flask (100 mL) with reflux attachment and septum, precursor A (3.12 mmol, 1 equiv.), 3-diphenylamino-9H-carbazole (6.24 mmol, 2 equiv.) and K$_3$PO$_4$ (12.5 mmol, 4 equiv.) was placed under a nitrogen atmosphere. After addition of abs. DMSO (20 mL) the mixture was heated for 14 h at 140° C. After cooling to RT the reaction mixture was shaken in 400 mL sodium chloride solution. Dichloromethane (150 mL) was added, the phases separated and the aqueous phase extracted again with dichloromethane (150 mL). The combined organic phases were washed with sodium chloride solution (200 mL) and then dried over MgSO$_4$. The solvent was removed under reduced pressure and the residue purified with MPLC. The yield of compound B was 29% (0.92 mmol).

Compound C

In a two-necked flask (100 mL) with reflux attachment and septum, precursor A (3.64 mmol, 1 equiv.), 3,6-diphenyl-9H-carbazole (7.28 mmol, 2 equiv.) and K$_3$PO$_4$ (14.6 mmol, 4 equiv.) was placed under a nitrogen atmosphere. After addition of abs. DMSO (20 mL) the mixture was heated for 15 h at 140° C. After cooling to RT the reaction mixture was shaken in 400 mL sodium chloride solution. Dichloromethane (150 mL) was added, the phases separated and the aqueous phase extracted again with dichloromethane (150 mL). The combined organic phases were washed with sodium chloride solution (200 mL) and then dried over MgSO$_4$. The solvent was removed under reduced pressure and the residue purified by MPLC. The yield of compound C was 35% (1.28 mmol).

Compound D

In a two-necked flask (100 mL) with reflux attachment and septum, precursor A (4.68 mmol, 1 equiv.), 3,6-dimethyl-9H-carbazole (9.36 mmol, 2 equiv.) and K$_3$PO$_4$ (18.7 mmol, 4 equiv.) was placed under a nitrogen atmosphere. After addition of abs. DMSO (20 mL) the mixture was heated for 15 h at 140° C. After cooling to RT the reaction mixture was shaken in 400 mL sodium chloride solution. Dichloromethane (150 mL) was added, the phases separated and the aqueous phase extracted again with dichloromethane (150 mL). The combined organic phases were washed with sodium chloride solution (200 mL) and then dried over MgSO$_4$. The solvent was removed under reduced pressure and the residue purified by MPLC. The yield of compound D was 16% (0.74 mmol).

Photophysical Measurements

Pretreatment of Optical Glasses

All glasses (cuvettes and substrates made of quartz glass, diameter: 1 cm) were cleaned after each use: washed three times each with dichloromethane, acetone, ethanol, and demineralized water, placed in 5% Hellmanex solution for 24 h, and rinsed thoroughly with demineralized water. For drying the optical glasses were blown dry with nitrogen.

Sample Preparation, Film: Spin-Coating (Apparatus: Spin150, SPS Euro.)

The sample concentration was 10 mg/ml, made up in toluene or chlorobenzene.

The concentration of the optically neutral host polymer PMMA (polymethyl methacrylate) was 10 mg/mL, made up in toluene or chlorobenzene.

The film was prepared from a mixture of the PMMA solution and the sample solution in a volumetric ratio of 90:10.

Program: 1) 3 s at 400 rpm; 2) 20 s at 1000 rpm at 1000 Upm/s.; 3) 10 s at 4000 rpm at 1000 Upm/s. After coating, the films were dried in air for 1 min at 70° C. on a precision hot plate from LHG.

Absorption Spectroscopy

Solutions:

UV-VIS spectra were recorded on a device from Thermo Scientific, model Evolution 201. (See Sample preparation: Solutions)

Film:

UV-VIS spectra were recorded on a device from Thermo Scientific, model Evolution 201. (See Sample preparation: Film: Spin-Coating)

Photoluminescence Spectroscopy and TCSPC

Steady-state emissions spectroscopy was performed with a fluorescence spectrometer from Horiba Scientific, model FluoroMax-4, equipped with a 150 W xenon arc lamp, activation and emission monochromators and a Hamamatsu R928 photomultiplier tube, as well as a TCSPC option. The emission and activation spectra were corrected using standard correction curves.

The emission decay times were likewise measured on this system using the TCSPC method with the FM-2013 accessory and a TCSPC hub from Horiba Yvon Jobin. Excitation sources: NanoLED 370 (wavelength: 371 nm, pulse duration: 1.1 ns), NanoLED 290 (wavelength: 294 nm, pulse duration: <1 ns), SpectraLED 310 (wavelength: 314 nm), SpectraLED 355 (wavelength: 355 nm).

The evaluation (exponential fitting) was done with the DataStation software package and the DAS 6 evaluation software. The fit was given by the chi-square method $$c^2 = \sum_{k=1}^{i} \frac{(e_i - o_i)^2}{e_i}$$

with $e_i$: quantity predicted by the fit and $o_i$: measured quantity.

Quantum Efficiency Determination

The measurement of the photoluminescence quantum yield (PLQY) was done using an Absolute PL Quantum Yield Measurement C9920-03G system from Hamamatsu Photonics. This consists of a 150 W xenon gas discharge lamp, automatically adjustable Czerny-Turner monochromators (250-950 nm) and an integrating sphere with a highly reflective Spectralon coating (a derivative of Teflon), connected over a glass fiber cable with a PMA-12 multichannel detector with BT (back-thinned-) CCD Chip with 1024×122 pixels (size 24×24 µm). The evaluation of the quantum efficiency and the CIE coordinates was done using the software U6039-05 Version 3.6.0.

For G9920-OXG (PMA-12). The emission maximum is given in nm, the quantum yield Q in % and the CIE color coordinates as x,y values.

PLQY was determined for polymer films, solutions and powder samples according to the following protocol:
1) Performance of quality assurance: The reference material used is anthracene in ethanol at a known concentration.
2) Determination of the activation wavelength: First the absorption maximum of the organic molecule was determined, and activation was performed with this.
3) Performance of sample measurement: The absolute quantum yield was determined from degassed solutions and films under nitrogen atmosphere. The calculation was done system-internally according to the following equation:

$$\Phi_{PL} = \frac{n_{photon, \text{emitted}}}{n_{photon, \text{absorbed}}} = \frac{\int \frac{\lambda}{hc}[Int_{emitted}^{Sample}(\lambda) - Int_{absorbed}^{Sample}(\lambda)]d\lambda}{\int \frac{\lambda}{hc}[Int_{emitted}^{Reference}(\lambda) - Int_{absorbed}^{Reference}(\lambda)]d\lambda}$$

with the photon number $n_{photon}$ and the intensity Int.

Photophysical Parameters

All of the measurements conducted here were performed according to the procedures described above. In Table 4 $\lambda_{EX}$ represents the excitation wavelength, $\lambda_{EM}$ the emission wavelength, and PLQY the photoluminescence quantum yield.

TABLE 3

Photophysical parameters of selected compounds

| Compound | Structure | $\lambda_{EX}$ [nm] | $\lambda_{EM}$ [nm] |
|---|---|---|---|
| A | | 297 | 495 |
| B | | 300 | 474 |

TABLE 3-continued

Photophysical parameters of selected compounds

| Compound | Structure | $\lambda_{EX}$ [nm] | $\lambda_{EM}$ [nm] |
| --- | --- | --- | --- |
| C | | 297 | 400 |
| D | | 297 | 408 |

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:
1. An optoelectronic device comprising:
a substrate,
an anode and
a cathode, wherein the anode or the cathode is applied to the substrate, and at least one light-emitting layer is disposed between the anode and the cathode, wherein the light-emitting layer comprises at least one host material, wherein an activated singlet state ($S_1$) and/or an activated triplet state ($T_1$) of the at least one host material is higher than an activated singlet state ($S_1$) and/or activated triplet state ($T_1$) of the organic molecule, and wherein the light-emitting layer further comprises an organic molecule comprising a structure of formula 3b:

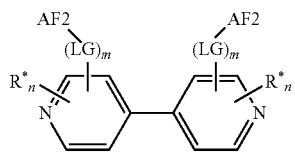

Formula 3b wherein:
m is 0 or 1;
n is 1, 2 or 3;
LG is a divalent linker group, selected from

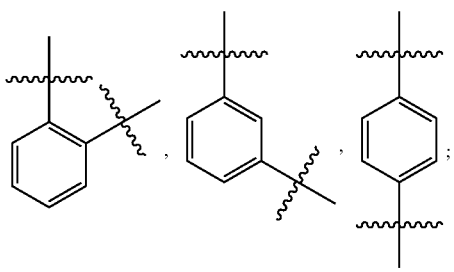 [SMILES: *c1ccccc1* ; *c1cccc(*)c1 ; *c1ccc(*)cc1]

or LG is an element-element single bond;
wherein AF2 comprises a structure of formula 2:

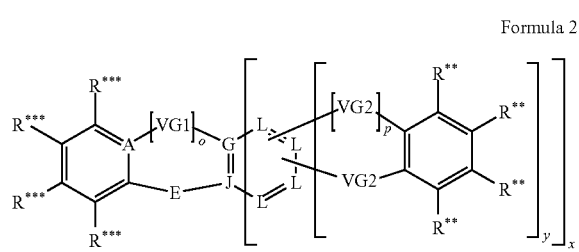

Formula 2 wherein:
x is 1;
y is 0;
o is 0 or 1;
p is 0 or 1;
A is CR*** when o=0, otherwise C;
VG1 is a bridging group and is selected from the group consisting of
NR, CR$_2$, O, S, a C—C single bond, BR, AsR, SiR$_2$, GeR$_2$,

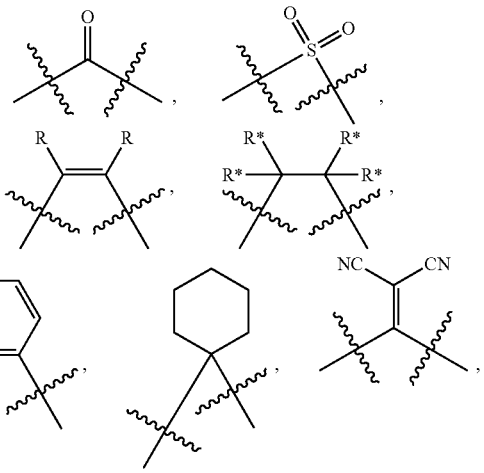

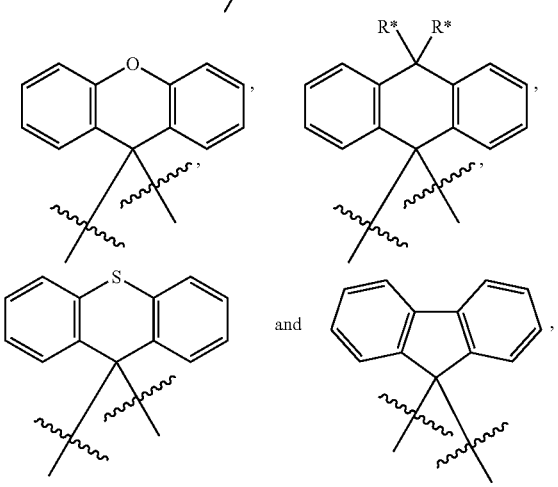

when x=1 and at the same time y=0;
VG2=bridging group at each occurrence independently of one another is selected from the group consisting of CR$_2$, NR, O, S and a C—C single bond, wherein two units VG2 are not equal to a C—C single bond at the same time;
E is NR**,

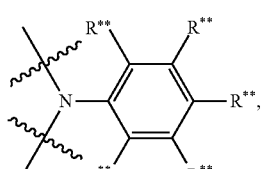

O or S;
G is C when o=1 and at the same time x=1; G is CR** when o=0 and at the same time x=1;
J is C when x=1;

205

L is CR*** when y=0;

R* is R or is selected from the following units, wherein a maximum of two of the radicals R*** are simultaneously one of the following units:

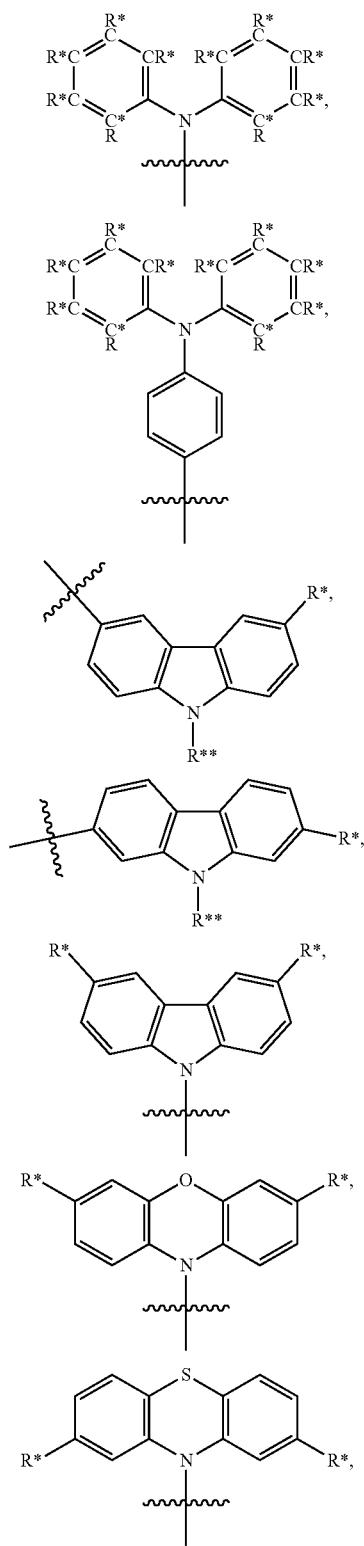

206

-continued

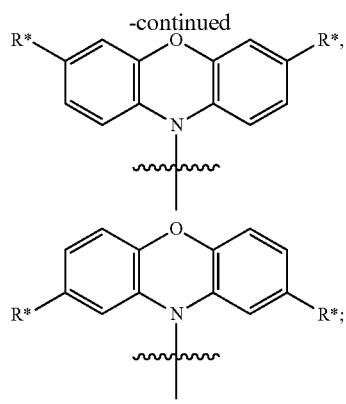

R** at each occurrence independently of one another is a radical R* and/or marks the linking site to the linker group LG or in case m=0, to the pyridine unit of formula 3b;

R* at each occurrence independently of one another is selected from the group consisting of H, deuterium, phenyl, naphthyl, $N(R^2)_2$—, —SCN, —$NO_2$, a linear alkyl, alkoxy or thioalkoxy group with 1 to 40 C atoms, each of which may be substituted with one or more radicals $R^9$, wherein an adjacent $CH_2$ group may be replaced by —Si$(R^4)_2$—, —Ge$(R^4)_2$—, —Sn$(R^4)_2$, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^2$, or an aryloxy or heteroaryloxy group with 5 to 60 aromatic ring atoms, which with one or more radicals $R^9$, or a diarylamino group, diheteroarylamino group or arylheteroarylamino group with 10 to 40 aromatic ring atoms, which with one or more radicals $R^9$, or a combination of these systems;

$R^2$ at each occurrence independently of one another is selected from the group consisting of H, deuterium, phenyl, naphthyl, $CF_3$, a linear alkyl, alkoxy or thioalkoxy group with 1 to 40 C atoms, each of which may be substituted with one or more radicals $R^9$, wherein an adjacent $CH_2$ group is replaced by a —Si$(R^4)_2$—, —Ge$(R^4)_2$—, —Sn$(R^4)_2$—$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which with one or more radicals $R^9$, or a combination of these systems;

$R^4$ at each occurrence independently of one another is selected from the group consisting of H, deuterium, phenyl, naphthyl, $N(R^2)_2$, $CF_3$, OH, a linear alkyl, alkoxy or thioalkoxy group with 1 to 40 C atoms each of which may be substituted with one or more radicals $R^9$, wherein or an adjacent $CH_2$ group may be replaced by —Si$(R^4)_2$—, —Ge$(R^4)_2$—, —Sn$(R^4)$, —$NR^2$—, —O—, or —S— and wherein one or more H atoms may be replaced by deuterium, F, Cl, Br, I, CF3 or NO2, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals R⁹, or a combination of these systems;

R⁸ at each occurrence independently of one another is selected from the group consisting of H, deuterium, phenyl, naphthyl, F, CF₃ or an aliphatic, aromatic and/or heteroaromatic hydrocarbon radical with 1 to 20 C atoms, in which also one or more H atoms may be replaced by F or CF₃;

R⁹ at each occurrence independently of one another is selected from the group consisting of H, deuterium, phenyl, naphthyl, N(R²)₂—, CF₃, NO₂, a linear alkyl, alkoxy or thioalkoxy group with 1 to 40 C atoms, each of which may be substituted with one or more radicals R⁸, wherein an adjacent CH₂ group may be replaced by —Si(R⁴)₂—, —Ge (R⁴)₂—, —Sn(R⁴)₂—NR²—, —O—, or —S— and wherein one or more H atoms may be replaced by deuterium, F, Cl, Br, I, CF₃ or NO₂, or an aromatic or heteroaromatic ring system with 5 to 60 aromatic ring atoms, which in each case may be substituted with one or more radicals R⁸, or an aryloxy or heteroaryloxy group with 5 to 60 aromatic ring atoms, which may be substituted with one or more radicals R³, or a diarylamino group, diheteroarylamino group or arylheteroarylamino group with 10 to 40 aromatic ring atoms, which may be substituted with one or more radicals R⁸, or a combination of these systems.

2. The optoelectronic device according to claim 1, comprising at least one host material comprising the organic molecule.

3. The optoelectronic device according to claim 1, wherein the light-emitting layer comprises one or more of a fluorescent material or a phosphorescent material and wherein the fluorescent material or the phosphorescent material are an organic molecule.

4. The optoelectronic device according to claim 3, in which the organic molecule together with a functional material forms an exciplex.

5. An optoelectronic device comprising:

a substrate, an anode and a cathode, wherein the anode or the cathode is applied to the substrate, and at least one light-emitting layer is disposed between the anode and the cathode, wherein the light-emitting layer comprises one or more of a fluorescent material or a phosphorescent material and wherein the fluorescent material or the phosphorescent material are an organic molecule, and wherein the light-emitting layer further comprises an organic molecule comprising a structure of formula 3b:

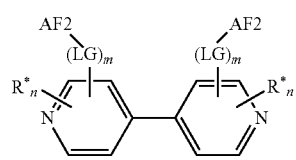

Formula 3b wherein:
m is 0 or 1;
n is 1, 2 or 3;
LG is a divalent linker group, selected from

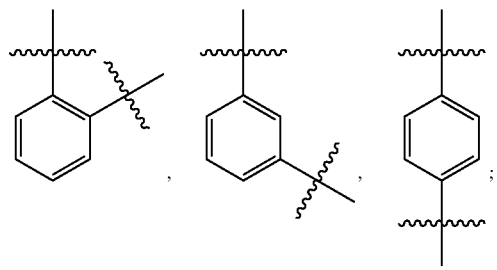 [SMILES: *c1ccccc1* ; *c1cccc(*)c1 ; *c1ccc(*)cc1]

or LG is an element-element single bond;
wherein AF2 comprises a structure of formula 2:

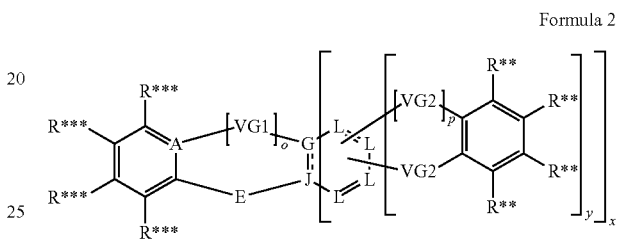

Formula 2 wherein:
x is 1;
y is 0;
o is 0 or 1;
p is 0 or 1;
A is CR*** when o=0, otherwise C;
VG1 is a bridging group and is selected from the group consisting of
NR, CR₂, O, S, a C—C single bond, BR, AsR, SiR₂, GeR₂,

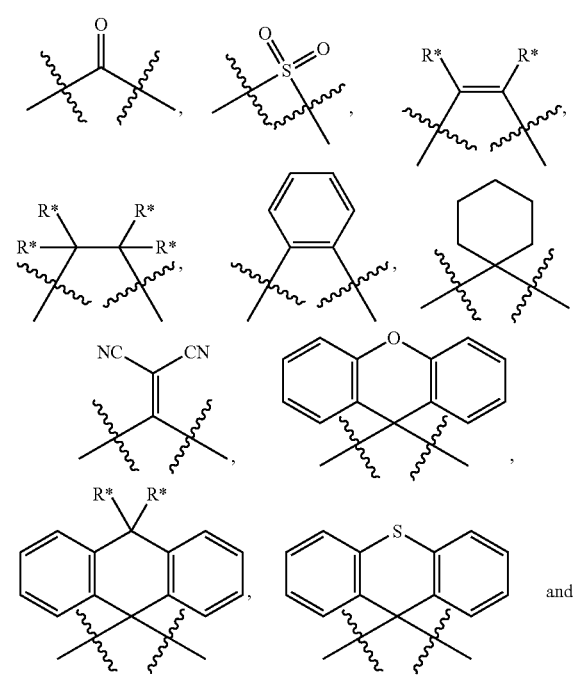

and

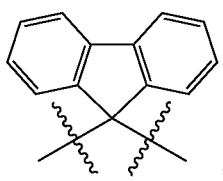

when x=1 and at the same time y=0;
VG2=bridging group at each occurrence independently of one another is selected from the group consisting of CR, NR, O, S and a C—C single bond, wherein two units VG2 are not equal to a C—C single bond at the same time;
E is NR**,

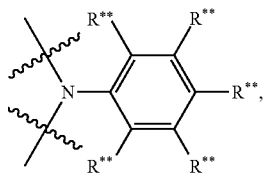

O or S:
G is C when o=1 and at the same time x=1; G is CR** when o=0 and at the same time x=1;
J is C when x=1;
L is CR*** when y=0;
R* is R or is selected from the following units, wherein a maximum of two of the radicals
R*** are simultaneously one of the following units:

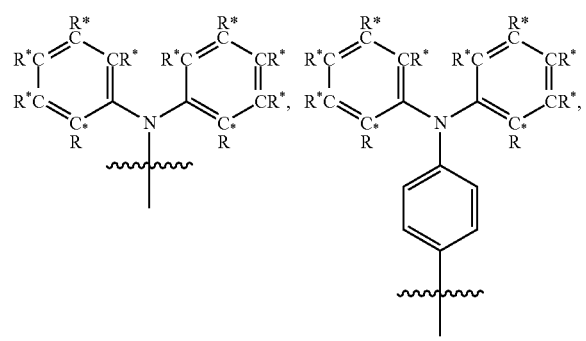

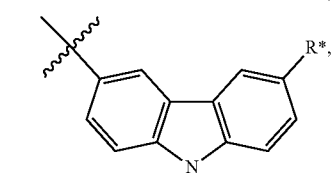

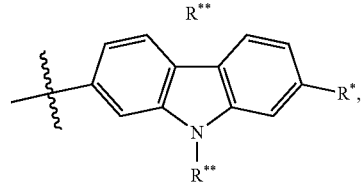

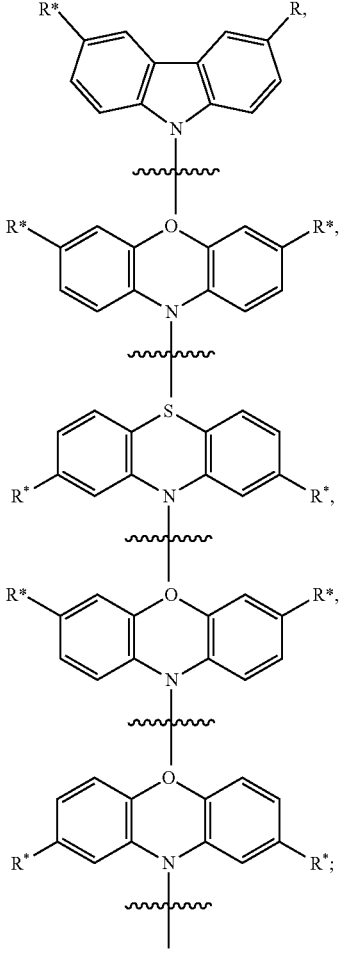

R** at each occurrence independently of one another is a radical R* and/or marks the linking site to the linker group LG or in case m=0, to the pyridine unit of formula 3b;

R* at each occurrence independently of one another is selected from the group consisting of H, deuterium, phenyl, naphthyl, $N(R^2)_2$, —SCN, —$CF_3$, —$NO_2$, a linear alkyl, alkoxy or thioalkoxy group with 1 to 40 C atoms, each of which may be substituted with one or more radicals $R^9$, wherein an adjacent $CH_2$ group may be replaced by —Si$(R^4)_2$—, —Ge$(R^4)_2$—, —Sn$(R^4)$, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^2$, or an aryloxy or heteroaryloxy group with 5 to 60 aromatic ring atoms, which with one or more radicals $R^9$, or a diarylamino group, diheteroarylamino group or arylheteroarylamino group with 10 to 40 aromatic ring atoms, which with one or more radicals $R^9$, or a combination of these systems;

$R^2$ at each occurrence independently of one another is selected from the group consisting of H, deuterium, phenyl, naphthyl, $CF_3$, a linear alkyl, alkoxy or thioalkoxy group with 1 to 40 C atoms, each of which may be substituted with one or more radicals $R^9$, wherein an adjacent $CH_2$ group is replaced by a —Si$(R^4)_2$—, —Ge$(R^4)_2$—, —Sn$(R^4)_2$—$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which with one or more radicals $R^9$, or a combination of these systems;

$R^4$ at each occurrence independently of one another is selected from the group consisting of H, deuterium, phenyl, naphthyl, $N(R^2)_2$, $CF_3$, OH, a linear alkyl, alkoxy or thioalkoxy group with 1 to 40 C atoms each of which may be substituted with one or more radicals $R^9$, wherein or an adjacent $CH_2$ group may be replaced by —$Si(R^4)_2$—, —Ge$(R^4)_2$—, —$Sn(R^4)$, —$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems;

$R^8$ at each occurrence independently of one another is selected from the group consisting of H, deuterium, phenyl, naphthyl, F, $CF_3$ or an aliphatic, aromatic and/or heteroaromatic hydrocarbon radical with 1 to 20 C atoms, in which also one or more H atoms may be replaced by F or $CF_3$;

$R^9$ at each occurrence independently of one another is selected from the group consisting of H, deuterium, phenyl, naphthyl, $N(R^2)_2$, $CF_3$, $NO_2$, a linear alkyl, alkoxy or thioalkoxy group with 1 to 40 C atoms, each of which may be substituted with one or more radicals $R^8$, wherein an adjacent $CH_2$ group may be replaced by —$Si(R^4)_2$—, —Ge$(R^4)_2$—, —$Sn(R^4)_2$—$NR^2$—, —O—, or —S— and wherein one or more H atoms may be replaced by deuterium, F, Cl, Br, I, $CF_3$ or $NO_2$, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^3$, or a diarylamino group, diheteroarylamino group or arylheteroarylamino group with 10 to 40 aromatic ring atoms, which may be substituted with one or more radicals $R^8$, or a combination of these systems, wherein the organic molecule is a charge transport layer.

6. The optoelectronic component device according to claim 1, wherein in the organic molecule m is 0.

7. The optoelectronic component device according to claim 1, wherein the organic molecule comprises one of the structures 3.1, 3.2, 3.5, 3.6, 3.11 or 3.12, wherein optionally all $C_{sp2}$—H groups may also be $C_{sp2}$—R* groups and otherwise the definitions given in claim 1 apply:

3.1

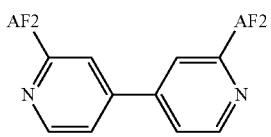

3.2

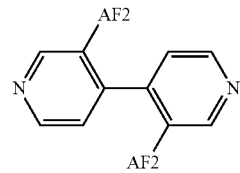

3.5

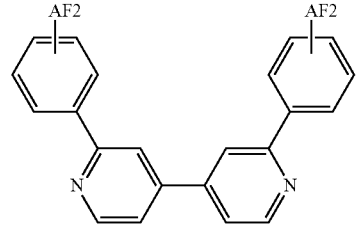

3.6

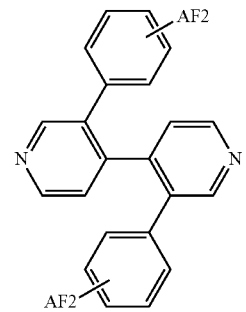

3.11

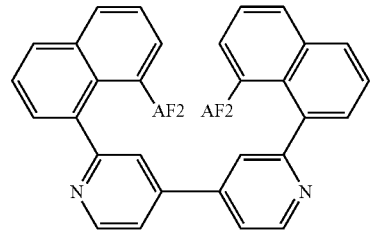

3.12

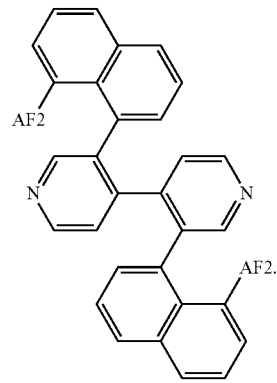

8. The optoelectronic component device according to claim 1, wherein in the organic molecule at least one chemically substitutable position comprises at least one radical R, wherein:
R at each occurrence independently of one another is selected from the group consisting of H, deuterium, phenyl, naphthyl, F, Cl, Br, I, $N(R^2)_2$, —SCN, —$CF_3$, —$NO_2$, —OH, a linear alkyl, alkoxy or thioalkoxy group with 1 to 40 C atoms, each of which may be substituted with one or more radicals $R^9$, wherein an adjacent $CH_2$ group may be replaced by —$Si(R^4)_2$—, —Ge(R$^4$)$_2$—, —Sn(R$^4$)$_2$—NR$^2$—, —O—, or —S—
and wherein one or more H atoms may be replaced by deuterium, F, Cl, Br, I, CF$_3$ or NO$_2$, or an aromatic or heteroaromatic ring system with 5 to 60 aromatic ring atoms, which in each case may be substituted with one or more radicals R$^2$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; wherein R$^2$ to R$^9$ have the aforestated meanings.

9. The optoelectronic device according to claim 1, wherein the organic molecule is one or more of a luminescent emitter, a host material, an electron transport material, a hole injection material and a hole blocking material in the optoelectronic component.

10. The optoelectronic device according to claim 1, wherein the optoelectronic device is an organic light-emitting diode, a light-emitting electrochemical cell, an organic light-emitting sensor, an organic diode, an organic solar cell, an organic transistor, an organic field-effect transistor, and an organic laser or a down-conversion element.

11. The optoelectronic device according to claim 1, wherein the proportion of the organic molecule in the emitter is in the range of 1% to 99%.

12. The optoelectronic device according to claim 1, wherein the proportion of the organic molecule in the emitter is in the range of 5% to 80%.

13. The optoelectronic component device according to claim 5, wherein in the organic molecule m is 0.

14. The optoelectronic component device according to claim 5, wherein the organic molecule comprises one of the structures 3.1, 3.2, 3.5, 3.6, 3.11 or 3.12, wherein optionally all C$_{sp2}$—H groups may also be C$_{sp2}$—R* groups and otherwise the definitions given in claim 5 apply:

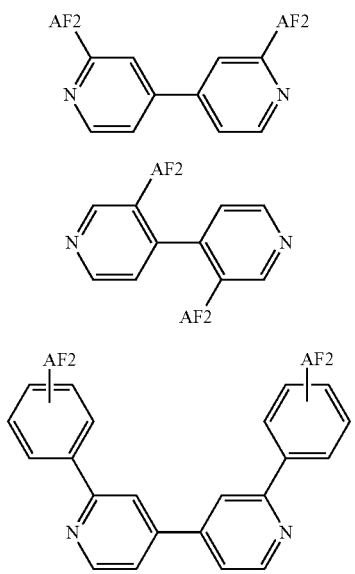

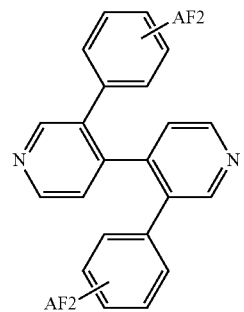

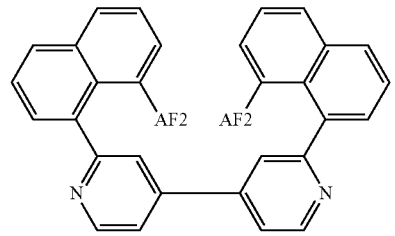

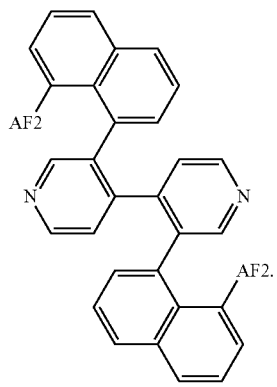

15. The optoelectronic component device according to claim 5, wherein in the organic molecule at least one chemically substitutable position comprises at least one radical R, wherein:

R at each occurrence independently of one another is selected from the group consisting of H, deuterium, phenyl, naphthyl, F, Cl, Br, I, N(R$^2$)$_2$, —SCN, —CF$_3$, —NO$_2$, —OH, a linear alkyl, alkoxy or thioalkoxy group with 1 to 40 C atoms, each of which may be substituted with one or more radicals R$^9$, wherein an adjacent CH$_2$ group may be replaced by —Si(R$^4$)$_2$—, —Ge(R$^4$)$_2$—, —Sn(R$^4$)$_2$—NR$^2$—, —O—, or —S— and wherein one or more H atoms may be replaced by deuterium, F, Cl, Br, I, CF$_3$ or NO$_2$, or an aromatic or heteroaromatic ring system with 5 to 60 aromatic ring atoms, which in each case may be substituted with one or more radicals R$^2$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; wherein R$^2$ to R$^9$ have the aforestated meanings.

* * * * *